US012198753B2

(12) United States Patent
Kim et al.

(10) Patent No.: US 12,198,753 B2
(45) Date of Patent: Jan. 14, 2025

(54) MEMORY DEVICE HAVING ROW DECODER ARRAY ARCHITECTURE

(71) Applicant: Samsung Electronics Co., Ltd., Suwon-si (KR)

(72) Inventors: Seungyeon Kim, Suwon-si (KR); Jooyong Park, Suwon-si (KR); Hongsoo Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 203 days.

(21) Appl. No.: 17/953,715

(22) Filed: Sep. 27, 2022

(65) Prior Publication Data

US 2023/0147765 A1     May 11, 2023

(30) Foreign Application Priority Data

Nov. 10, 2021    (KR) ................. 10-2021-0154275
Mar. 18, 2022    (KR) ................. 10-2022-0034174

(51) Int. Cl.
    *G11C 7/02*        (2006.01)
    *G11C 11/408*     (2006.01)
    *G11C 11/4097*    (2006.01)
    *G11C 11/4099*    (2006.01)

(52) U.S. Cl.
    CPC ...... *G11C 11/4099* (2013.01); *G11C 11/4085* (2013.01); *G11C 11/4087* (2013.01); *G11C 11/4097* (2013.01)

(58) Field of Classification Search
    CPC .................................................. G11C 11/4099
    USPC ........................................................ 365/210.1
    See application file for complete search history.

(56) References Cited

U.S. PATENT DOCUMENTS

| 7,715,261 | B2 | 5/2010 | Kim et al. |
| 8,189,390 | B2 | 5/2012 | Kim |
| 9,123,401 | B2 | 9/2015 | Tran et al. |
| 9,633,750 | B2 | 4/2017 | Park et al. |
| 2022/0085056 | A1* | 3/2022 | Zhang .............. H10B 43/10 |

FOREIGN PATENT DOCUMENTS

KR         101759807 B1     7/2017

\* cited by examiner

*Primary Examiner* — Hoai V Ho
(74) *Attorney, Agent, or Firm* — Muir Patent Law, PLLC

(57) ABSTRACT

A memory device includes a peripheral circuit structure and a cell array structure vertically overlapping the peripheral circuit structure. The cell array structure includes a plurality of memory blocks divided into a normal cell region and a dummy cell region, and the dummy cell region includes a bit line through-electrode region. The peripheral circuit structure includes a row decoder region in which a unit row decoder circuit connected to each of n (n is a positive integer) memory blocks is arranged, and the bit line through-electrode region is disposed to correspond to the block height of the unit row decoder circuit.

8 Claims, 52 Drawing Sheets

MEMORY DEVICE HAVING ROW DECODER ARRAY ARCHITECTURE

CROSS-REFERENCE TO RELATED APPLICATIONS

This application is based on and claims priority under 35 U.S.C. § 119 to Korean Patent Application Nos. 10-2021-0154275, filed on Nov. 10, 2021, and 10-2022-0034174, filed on Mar. 18, 2022 in the Korean Intellectual Property Office, the disclosures of which are incorporated by references herein in their entireties.

BACKGROUND

The inventive concept relates to semiconductor memory devices, and more particularly, to a memory device having a row decoder array architecture.

Recently, as information and communication devices have become multifunctional, a large-capacity and high-integration of memory devices is desirable. As the size of memory cells for high integration is reduced, operation circuits and/or wiring structures included in the memory device for operation and electrical connection of the memory device are also becoming more complex. Accordingly, there is a demand for a memory device having excellent electrical characteristics while increasing the degree of integration of the memory device. In order to improve the storage capacity and density of the memory device, a nonvolatile memory device in which memory cells are stacked in a three-dimensional structure, for example, a 3D NAND flash memory, has been studied.

In the 3D NAND flash memory, the number of word lines stacked in a vertical direction with respect to the substrate may increase according to the trend of increasing the capacity of a memory block. In this case, row decoders respectively connected to the word lines may be disposed to correspond to a memory block height determined by a plurality of word line cut areas WLC in FIG. 5. Accordingly, the height of a row decoder may be the same as the height of a memory block. In this case, a memory block may be added to fit the height of the row decoder, which may increase the chip size.

SUMMARY

The inventive concept provides a memory device having a row decoder array architecture, capable of reducing a chip size by suppressing the addition of memory blocks.

According to an aspect of the inventive concept, a memory device includes a peripheral circuit structure, and a cell array structure vertically overlapping the peripheral circuit structure. The cell array structure includes a memory cell area including a plurality of word lines extending in a first horizontal direction, and a plurality of bit lines extending in a second horizontal direction crossing the first horizontal direction. The memory cell area includes a plurality of memory blocks separated from each other by a plurality of word line cut areas extending long in the first horizontal direction. The memory cell area is divided into a normal cell area in which a plurality of normal memory blocks among the plurality of memory blocks are disposed, and a dummy cell area in which a plurality of dummy memory blocks among the plurality of memory blocks are disposed. The plurality of dummy memory blocks include a bit line through-electrode area including a plurality of through electrodes respectively connected to the plurality of bit lines. The plurality of through electrodes vertically extend into the peripheral circuit structure through the plurality of word lines. The peripheral circuit structure includes a row decoder area in which a row decoder circuit for controlling a plurality of word lines of each memory block of the plurality of memory blocks of the normal cell area is disposed. The row decoder area is adjacent to the plurality of memory blocks. The row decoder circuit includes a first unit row decoder circuit being connected to n normal memory blocks among the plurality of normal memory blocks, n being a positive integer, and a second unit row decoder circuit being connected to (n−1) normal memory blocks among the plurality of normal memory blocks.

According to another aspect of the inventive concept, a memory device includes a peripheral circuit structure, and a cell array structure vertically overlapping the peripheral circuit structure. The cell array structure includes a memory cell area including a plurality of word lines extending in a first horizontal direction, a plurality of bit lines extending in a second horizontal direction crossing the first horizontal direction, and a pair of dummy step areas disposed on opposite sides of the memory cell area, respectively. The memory cell area includes a plurality of memory blocks separated from each other by a plurality of word line cut areas extending long in the first horizontal direction. The memory cell area is divided into a normal cell area in which a plurality of normal memory blocks among the plurality of memory blocks are disposed, and a dummy cell area in which a plurality of dummy memory blocks among the plurality of memory blocks are disposed. In each dummy step area of the pair of dummy step areas, the plurality of word lines extend parallel to each other in the first horizontal direction and the second horizontal direction and vertically overlap each other in a stepwise manner. The peripheral circuit structure includes a row decoder area in which a row decoder circuit for controlling a plurality of word lines of each memory block of the plurality of memory blocks of the normal cell area is disposed. The row decoder area is adjacent to the plurality of memory blocks. The row decoder circuit includes a first unit row decoder circuit being connected to n normal memory blocks of the plurality of normal memory blocks, n being a positive integer, and a second unit row decoder circuit being connected to (n−1) first normal memory blocks of the plurality of normal memory blocks. The second unit row decoder circuit is adjacent to an area in which a first dummy step area among the pair of dummy step areas and the (n−1) first normal memory blocks are disposed. A height, in the second horizontal direction, of the second unit row decoder circuit corresponds to a sum of block heights of the (n−1) first normal memory blocks and a height, in the second horizontal direction, of the first dummy step area.

According to another aspect of the inventive concept, a memory device includes a first chip including a memory cell area, a pair of dummy step areas disposed on opposite sides of the memory cell area, a first metal pad, the memory cell area including a plurality of word lines extending in a first horizontal direction, and a plurality of bit lines extending in a second horizontal direction crossing the first horizontal direction, the plurality of word lines extending parallel to each other in the first horizontal direction and the second horizontal direction and vertically overlapping each other, the memory cell area including a plurality of memory blocks separated from each other by a plurality of word line cut areas extending long in the first horizontal direction, and the memory cell area being divided into a normal cell area in which a plurality of normal memory blocks are disposed and a dummy cell area in which a plurality of dummy memory blocks are disposed, and a second chip including a second metal pad, and a peripheral circuit area connected in a vertical direction to the memory cell area by the first and second metal pads connected with each other. The peripheral circuit area includes a row decoder area in which a row decoder circuit for controlling a plurality of word lines of each memory block of the plurality of memory blocks of the normal cell area is disposed. When viewed in a plan view, the row decoder area is adjacent to the plurality of memory blocks. The row decoder circuit includes a first unit row decoder circuit connected to n normal memory blocks of the plurality of normal memory blocks, n being a positive integer, and a second unit row decoder circuit being connected to (n−1) first normal memory blocks of the plurality of normal memory blocks. The second unit row decoder circuit is adjacent to an area where a first dummy step area among the pair of dummy step areas and the (n−1) first normal memory blocks are disposed. A height, in the second horizontal direction, of the second unit row decoder circuit corresponds to a sum of block heights of the (n−1) first normal memory blocks and a height, in the second horizontal direction, of the first dummy step area. The height, in the second horizontal direction, of the first dummy step area is a distance between an edge of a lowermost word line among the plurality of word lines and an edge of an uppermost word line among the plurality of word lines.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
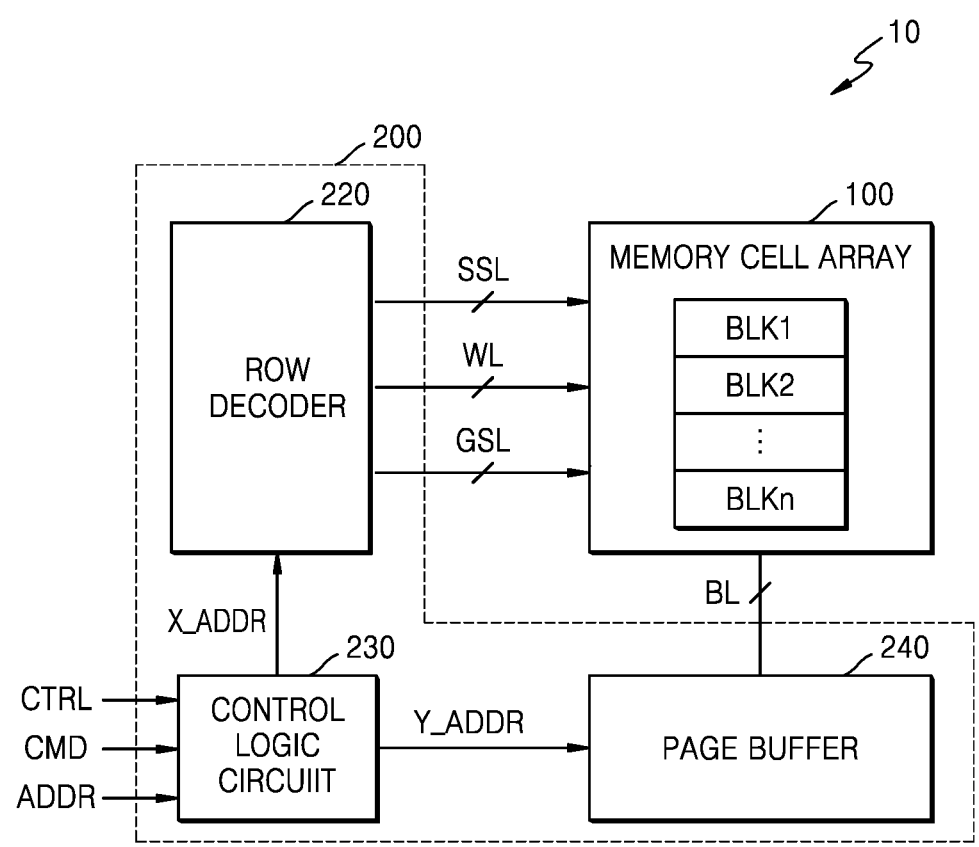
FIG. 1 is a diagram illustrating a memory device according to example embodiments of the inventive concept.

FIG. 1 is a diagram illustrating a memory device 10 according to example embodiments of the inventive concept.

Referring to FIG. 1, the memory device 10 may include a memory cell array 100 and a peripheral circuit 200, and the peripheral circuit 200 may include a row decoder 220, a control logic circuit 230, and a page buffer 240. Although not shown, the peripheral circuit 200 may further include a voltage generator, a data input/output circuit, an input/output interface, a temperature sensor, a command decoder, and the like. In embodiments of the inventive concept, the memory device 10 may be a nonvolatile memory device, and hereinafter, "memory device" refers to a nonvolatile memory device.

The memory cell array 100 may be connected to the row decoder 220 through word lines WL, string select lines SSL, and ground select lines GSL, and may be connected to the page buffer 240 through bit lines BL. In the memory cell array 100, a plurality of memory cells included in the plurality of memory blocks BLK1, BLK2, . . . and, BLKn may be flash memory cells. Hereinafter, embodiments of the inventive concept will be described with reference to a case in which the plurality of memory cells are NAND flash memory cells as an example. However, the inventive concept is not limited thereto, and in some embodiments, the plurality of memory cells may be resistive memory cells, such as resistive RAM (ReRAM), phase change RAM (PRAM), and magnetic RAM (MRAM).

In one embodiment, the memory cell array 100 may include a 3D memory cell array, the 3D memory cell array may include a plurality of NAND strings, and each NAND string may include memory cells respectively connected to word lines stacked vertically on a substrate. These are described in detail with reference to FIGS. 2 to 4. U.S. Pat. Nos. 7,679,133, 8,553,466, 8,654,587, 8,559,235, and U.S. Patent Application Publication No. 2011/0233648, the disclosures of which are incorporated by reference herein in their entirety, disclose in detail suitable configurations of a 3D memory array in which the 3D memory array consists of multiple levels and word lines and/or bit lines are shared between the levels. However, the inventive concept is not limited thereto, and in some embodiments, the memory cell array 100 may include a 2D memory cell array, and the 2D memory cell array may include a plurality of NAND strings arranged in row and column directions.

The control logic circuit 230 may generate various control signals for programming data into, reading data from, or erasing data stored in the memory cell array 100, based on the command CMD, the address ADDR, and the control signal CTRL. For example, the control logic circuit 230 may output a row address X-ADDR and a column address Y-ADDR. Accordingly, the control logic circuit 230 may generally control various operations in the memory device 10.

The row decoder 220 may select at least one of the plurality of memory blocks BLK1, BLK2, . . . , and BLKn in response to the row address X-ADDR, and may select the word line WL, the string select line SSL, and the ground select line GSL of the selected memory block. The row decoder 220 may transmit a voltage for performing a memory operation to the word line WL of the selected memory block.

The page buffer 240 may select some of the bit lines BL in response to the column address Y-ADDR. In detail, the page buffer 240 operates as a write driver or a sense amplifier depending on an operation mode of the memory device 10.

The row decoder 220 (i.e., a row decoder circuit) may be arranged to correspond to the plurality of memory blocks BLK1, BLK2, . . . , and BLKn, and may be configured in an arrangement of a unit row decoder circuit shared by each of n (n is a positive integer) memory blocks. For example, the row decoder 220 may be adjacent to the plurality of memory blocks BLK1, BLK2, and BLKn, and may include a plurality of unit row decoder circuits. The plurality of unit row decoder circuits may include a first unit row decoder shared by or connected to k memory blocks among the plurality of memory blocks BLK1, BLK2, . . . , and BLKn, and a second unit row decoder shared by or connected to (k−1) memory blocks among the plurality of memory blocks BLK1, BLK2, . . . , and BLKn. The number k is a positive integer smaller than n. At least one bit line through-electrode area, an edge memory block, or a dummy step area between the plurality of memory blocks BLK1, BLK2, . . . , and BLKn may be disposed to correspond to the block height of the unit row decoder circuit. Corresponding to the block height of the arranged unit row decoder circuits, the bit line through-electrode area having a block height of m (m is a positive integer), m memory blocks adjacent to the edge memory block, or m memory blocks adjacent to the dummy step area may be disposed. For example, unlike the first unit row decoder circuit shared by the k memory blocks, the second unit row decoder may be connected to the (k−1) memory blocks and one of the bit line through-electrode area (e.g., 120D1 of FIG. 5), the edge memory block (e.g., 120D2 of FIG. 5), and the dummy step area (e.g., 122D of FIG. 5) may be connected to the second unit row decoder. The number k and (k−1) represents a number of memory blocks connected to the first and second unit row decoder circuits, respectively, and the number (k−1) is smaller than the number k by 1. The present invention is not limited thereto. The difference of memory blocks connected to the first and second unit row decoder circuits may be two (2) or more, and in this case, at least two of the bit line through-electrode area, the edge memory block, and the dummy step area may be adjacent to the second unit row decoder circuit (see, FIGS. 10C, 10F, 14A, 14G, 15A, 15F, 16A, 16E, 17A, 17D, 20A, 20G, 21A, 21F, 22A, 22E, 23A, 23D, and 23E). In an embodiment, the first unit row decoder circuit may be adjacent to an area where k memory blocks are disposed, and the second unit row decoder may be adjacent to an area where the (k−1) memory blocks and one of the one of the bit line through-electrode area, the edge memory block, and the dummy step area. In an embodiment, the row decoder 220 may include a second unit row decoder circuit connected to the bit line through-electrode area, a third unit row decoder circuit connected to the edge memory block, and fourth unit row decoder circuit connected to the dummy step area. The second unit row decoder circuit may be adjacent to an area where the bit line through-electrode area and (k−1) first memory blocks among the plurality of memory blocks BLK1, BLK2, . . . , and BLKn are disposed. The third unit row decoder circuit may be adjacent to an area where the edge memory block and (k−1) second memory blocks among the plurality of memory blocks BLK1, BLK2, . . . , and BLKn are disposed. The fourth unit row decoder circuit may be adjacent to an area where the dummy step area and (k−1) second memory blocks among the plurality of memory blocks BLK1, BLK2, . . . , and BLKn are disposed. The (k−1) second, third, and fourth memory blocks may be the same kind of memory blocks among the plurality of memory blocks BLK1, BLK2, . . . , and BLKn, and may be referred to as normal memory blocks. The bit line through-electrode area and the edge memory block may be in a memory cell area 120 of FIG. 5, and may be referred to as dummy memory blocks. The dummy step area 122D of FIG. 5 may be disposed at opposite sides of the memory cell area 120 of FIG. 5. In an embodiment, a height of each of the bit line through-electrode area and the edge memory block may be the same as a block height of each memory block or greater than the block height of each memory block. In an embodiment, a height of the dummy step area may be different from a block height of each memory block.

Figure 2:
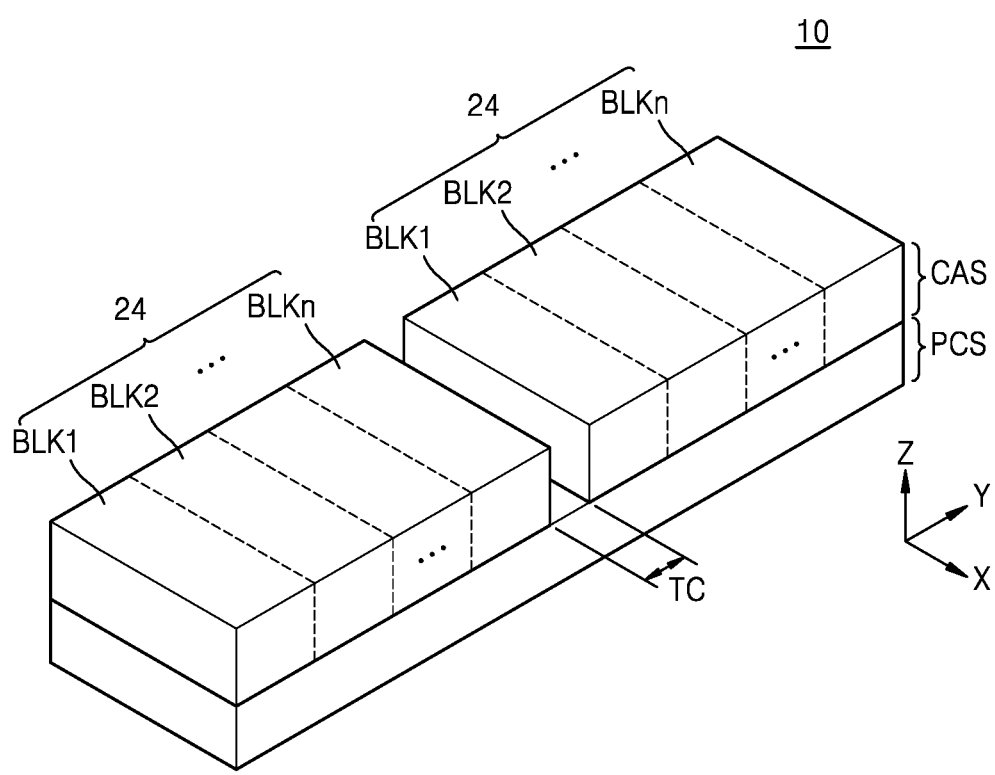
FIG. 2 schematically illustrates a structure of a memory device according to an embodiment of the inventive concept.

FIG. 2 schematically illustrates a structure of a memory device 10 according to an embodiment of the inventive concept.

Referring to FIG. 2, the memory device 10 includes a cell array structure CAS and a peripheral circuit structure PCS overlapping each other in a vertical direction (Z direction). The cell array structure CAS may include the memory cell array 100 described with reference to FIG. 1. The peripheral circuit structure PCS may include the peripheral circuit 200 described with reference to FIG. 1.

The cell array structure CAS may include a plurality of tiles 24 (i.e., a plurality of planes). In an embodiment, each tile of the plurality of tiles 24 may include the plurality of memory blocks BLK1, BLK2, . . . , and BLKn, and may be controlled independently from other tiles. In an embodiment, each memory block may be a unit of an erase operation. The plurality of tiles 24 may be divided by a tile cut area TC. Each of the plurality of tiles 24 may include a plurality of memory cell blocks BLK1, BLK2, . . . , and BLKn. Each of the plurality of memory cell blocks BLK1, BLK2, . . . , and BLKn may include three-dimensionally arranged memory cells.

Figure 3:
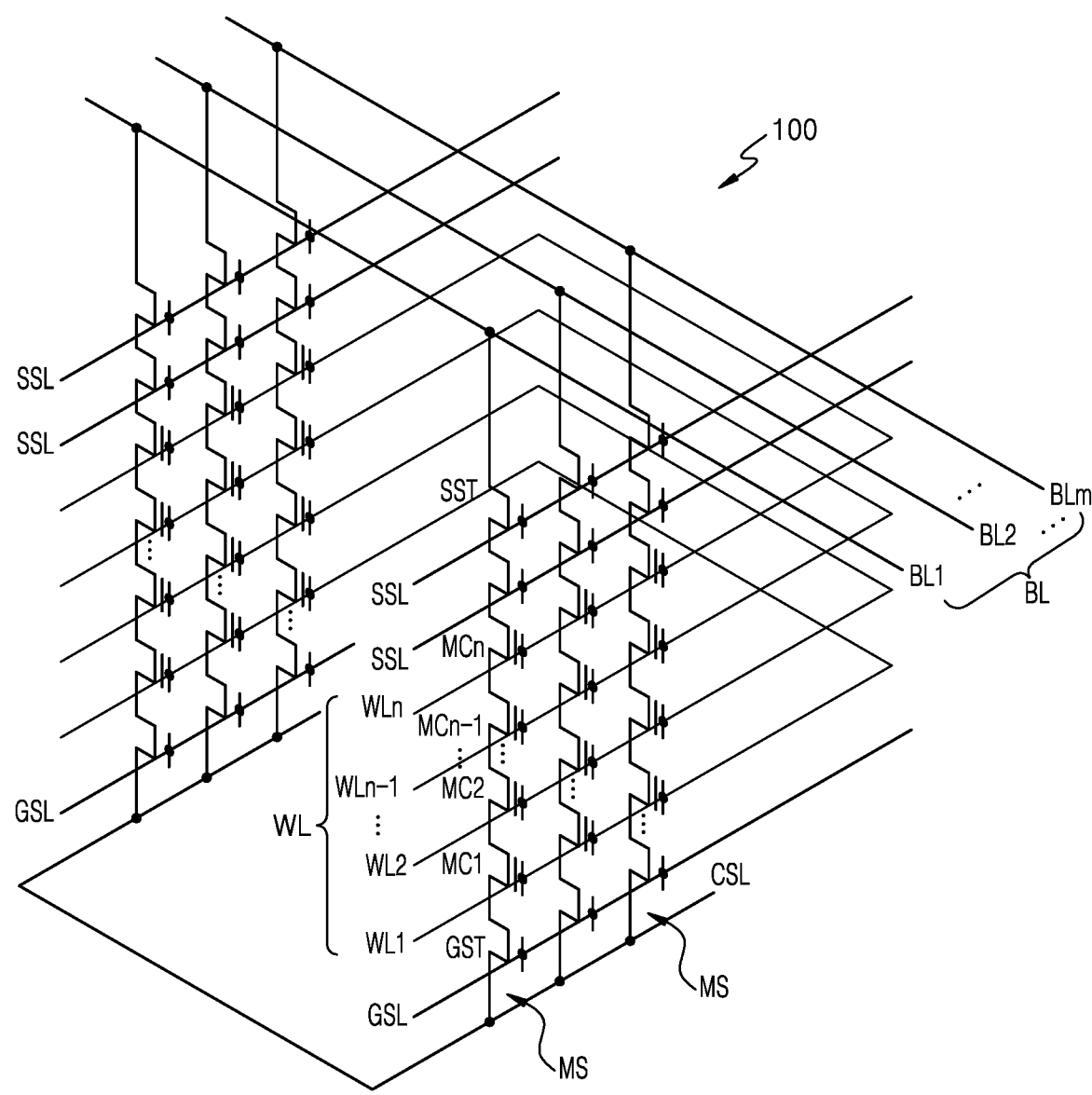
FIG. 3 is an equivalent circuit diagram of a memory cell array according to embodiments of the inventive concept.

FIG. 3 is an equivalent circuit diagram of a memory cell array 100 according to embodiments of the inventive concept. FIG. 3 illustrates an equivalent circuit diagram of a vertical NAND flash memory device having a vertical channel structure. Each of the plurality of memory blocks BLK1, BLK2, . . . , and BLKn illustrated in FIG. 2 may include the memory cell array 100 illustrated in FIG. 3.

Referring to FIG. 3, the memory cell array 100 may include a plurality of memory stacks MS. The memory cell array 100 may include a plurality of bit lines (BL: BL1, BL2, . . . , and BLm, m is a positive integer), a plurality of word lines (WL: WL1, WL2, WLn−1, and WLn, n is a positive integer), at least one string select line SSL, at least one ground select line GSL, and a common source line CSL. A plurality of memory stacks MS may be formed between the plurality of bit lines BL1, BL2, . . . , and BLm and the common source line CSL.

Each of the plurality of memory stacks MS may include a string select transistor SST, a ground select transistor GST, and a plurality of memory cell transistors MC1, MC2, . . . , MCn−1, and MCn. A drain area of the string select transistor SST may be connected to the bit lines BL: BL1, BL2, . . . , and BLm, and a source area of the ground select transistor GST may be connected to the common source line CSL. The common source line CSL may be an area in which the source areas of the plurality of ground selection transistors GST are commonly connected with each other.

The string select transistor SST may be connected to the string select line SSL, and the ground select transistor GST may be connected to the ground select line GSL. The plurality of memory cell transistors MC1, MC2, . . . , MCn−1, and MCn may be respectively connected to a plurality of word lines WL: WL1, WL2, WLn−1, and WLn.

Figure 4:
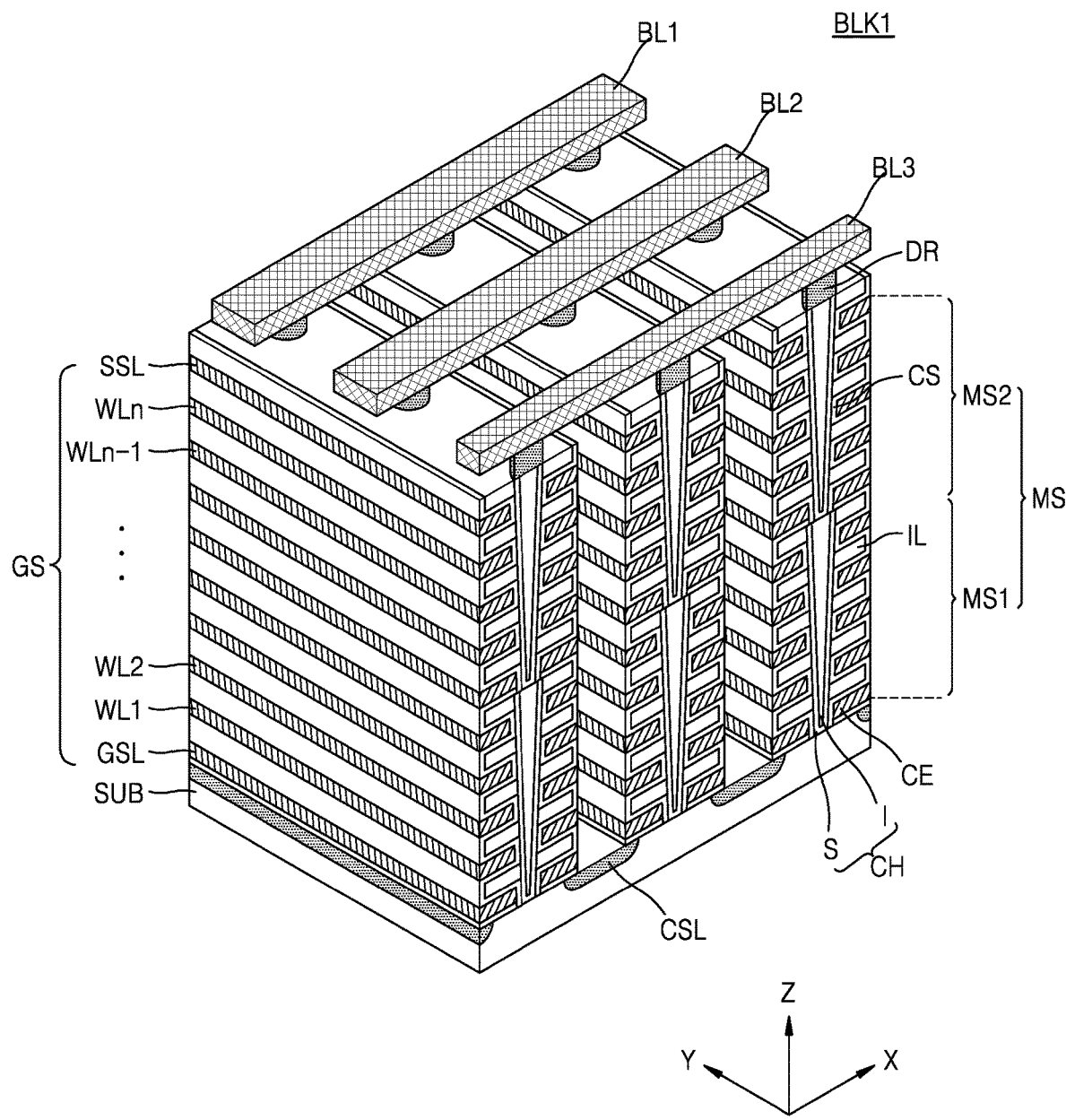
FIG. 4 is a perspective view illustrating a memory block according to an embodiment of the inventive concept.

FIG. 4 is a perspective view illustrating a memory block BLK1 according to an embodiment of the inventive concept. FIG. 4 shows a representative memory block BLK1 among the plurality of memory blocks BLK1 to BLKn of FIG. 2. The memory block BLK1 includes memory stacks MS formed in a 3D structure or a vertical structure. The memory block BLK1 includes structures extending in a plurality of directions X, Y, and Z.

Referring to FIG. 4, the memory block BLK1 is formed in a vertical direction (Z direction) with respect to a substrate SUB. The substrate SUB may have a first conductivity type (e.g., p-type), and a common source line CSL doped with impurities of a second conductivity type (e.g., n-type) may be formed in the substrate SUB.

A plurality of insulating materials IL extending in the second horizontal direction (Y direction) are sequentially provided in the vertical direction (Z direction) in the area of the substrate SUB between the common source lines CSL. For example, the plurality of insulating materials IL may be formed to be spaced apart by a specific distance in the first horizontal direction (X direction). For example, the insulating material IL may include or may be formed of an insulating material, such as silicon oxide.

A channel structure CH that is sequentially disposed in the second horizontal direction (Y direction) and passes through the insulating material IL in the vertical direction (Z direction) is formed on the substrate SUB between the common source lines CSL. For example, the channel structure CH may pass through the insulating material IL and be connected to the substrate SUB. For example, each channel structure CH may be formed of a plurality of materials. A surface layer S of the channel structure CH may include or may be formed of a semiconductor material (e.g., silicon) having a first conductivity type and may function as a channel area. In some embodiments, the channel structure CH may be referred to as a channel structure 160 (of FIG. 5) or a pillar. An inner layer I of each channel structure CH may include or may be formed of an insulating material, such as silicon oxide and an air gap.

A charge storage layer CS is provided along exposed surfaces of the insulating layer IL, the channel structure CH, and the substrate SUB. The charge storage layer CS may include a gate insulating layer (also referred to as a 'tunneling insulating layer'), a charge trapping layer, and a blocking insulating layer. For example, the charge storage layer CS may have an oxide-nitride-oxide (ONO) structure. In addition, a gate stack GS including a ground select line GSL, a string select line SSL, and word lines WL, is provided on the exposed surface of the charge storage layer CS.

Drain contacts or drains DR are provided on the plurality of channel structures CH, respectively. For example, the drains DR may include or may be formed of a semiconductor material (e.g., silicon) doped with impurities having a second conductivity type. Bit lines BL1 to BL3 extending in the first horizontal direction (X direction) and spaced apart by a specific distance in the second horizontal direction (Y direction) are provided on the drains DR.

The memory block BLK1 may include memory stacks MS: MS1 and MS2 stacked in a vertical direction (Z direction). In some embodiments, the memory block BLK1 may have a multi-stack memory block structure including three or more memory stacks MS. In the multi-stack memory block structure, memory stacks MS1 and MS2, in which gate lines respectively corresponding to the word lines WL are formed, may be stacked on each other.

Figure 5:
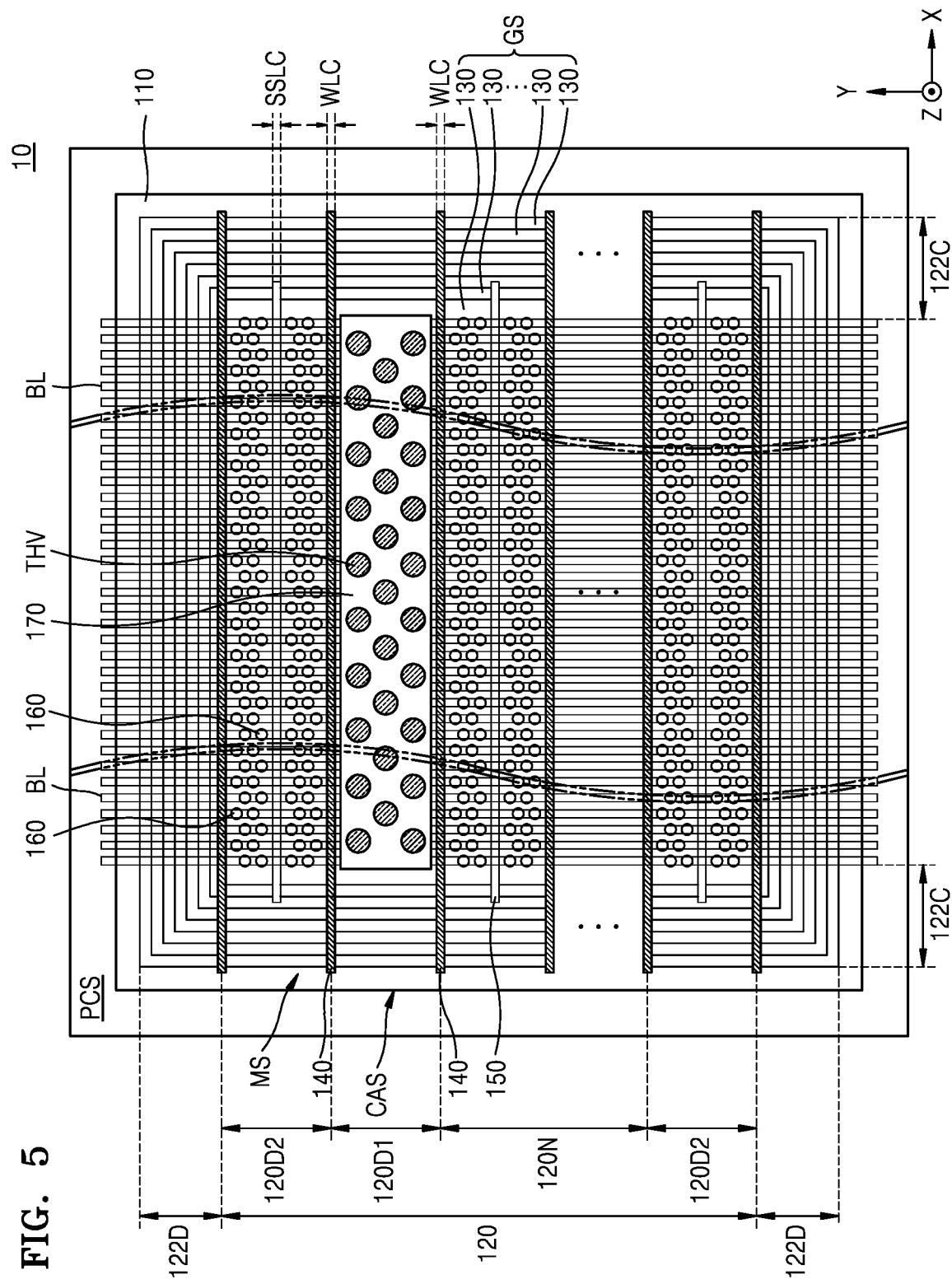
FIG. 5 is a schematic plan view of a memory device according to embodiments of the inventive concept.

[Start Here] FIG. 5 is a schematic plan view of a memory device 10 according to embodiments of the inventive concept.

Referring to FIG. 5, the memory device 10 may be a part of the memory device 10 described with reference to FIGS. 1 to 4. The memory device 10 includes a peripheral circuit structure PCS and a cell array structure CAS disposed on the peripheral circuit structure PCS and overlapping the peripheral circuit structure PCS in a vertical direction (Z direction). The cell array structure CAS may include an upper substrate 110 formed on the peripheral circuit structure PCS and a memory stack MS disposed on the upper substrate 110. In example embodiments, the upper substrate 110 may include or may be formed of a semiconductor layer. For example, the upper substrate 110 may include or may be formed of a polysilicon layer.

The memory stack MS may be included in the memory cell area 120. The memory cell area 120 may include the plurality of memory blocks BLK1, BLK2, . . . , and BLKn described with reference to FIG. 2. The memory stack MS may include a plurality of gate stacks GS. Each of the plurality of gate stacks GS may include a plurality of gate lines 130 extending parallel to each other in the first and second horizontal directions (X-direction and Y-direction) and overlapping each other in the vertical direction (Z-direction) in the memory cell area. Each of the plurality of gate lines 130 may include or may be formed of metal, metal silicide, a semiconductor material doped with an impurity, or a combination thereof. For example, each of the plurality of gate lines 130 may include metal, such as tungsten, nickel, cobalt, and tantalum, metal silicide, such as tungsten silicide, nickel silicide, cobalt silicide, and tantalum silicide, polysilicon doped with impurities, or a combination thereof.

A plurality of word line cut areas WLC (i.e., a plurality of word line cuts) may extend long in the first horizontal direction (X direction) across the memory stack MS on the upper substrate 110. Widths of the plurality of gate stacks GS in the second horizontal direction (Y direction) may be limited by the plurality of word line cut areas WLC. For example, a width, in the Y direction, of each gate stack GS may be a distance, in the Y direction, between two adjacent word line cut areas among the plurality of word line cut areas WLC. For example, each word line cut may be disposed between two adjacent gate stacks among the plurality of gate stacks GS and may separate the two adjacent gate stacks from each other. The plurality of gate lines 130 may be repeatedly disposed and be spaced apart from each other at regular intervals by the plurality of word line cut areas WLC.

Each of the plurality of word line cut areas WLC may be filled with a common source line structure. The common source line structure may include a common source line CSL and an insulating spacer covering sidewalls of the common source line CSL in the word line cut area WLC. Each of the plurality of common source lines CSL may be formed of metal, such as tungsten, copper, aluminum, or a combination thereof.

In the memory cell area 120, a plurality of memory blocks BLK1 to BLKn may be divided by a plurality of word line cut areas WLC. Heights of the plurality of memory blocks BLK1 to BLKn may be determined by the plurality of word line cut areas WLC. A plurality of gate lines 130 constituting one gate stack GS may be stacked to overlap each other in the vertical direction (Z direction) between two adjacent word line cut areas WLC on the upper substrate 110. The plurality of gate lines 130 constituting one gate stack GS may constitute the ground selection line GSL, the plurality of word lines WL, and the string selection line SSL described with reference to FIG. 3.

Among the plurality of gate lines 130 constituting one gate stack GS, the upper two gate lines 130 may be separated in the second horizontal direction (Y direction) with the string selection line cut area SSLC therebetween. In the gate stack GS, the two gate lines 130 separated from each other with the string select line cut area SSLC therebetween may constitute the string select line SSL described with reference to FIG. 2. FIGS. 4 and 5 illustrate a case in which one string select line cut area SSLC is formed on one gate stack GS, but the technical spirit of the inventive concept is not limited to those illustrated in FIGS. 4 and 5. For example, at least two string select line cut areas SSLC may be formed on one gate stack GS. The string selection line cut area SSLC may be filled with an insulating layer 150. The insulating layer 150 may include or may be an oxide film, a nitride film, or a combination thereof. In example embodiments, at least a portion of the string selection line cut area SSLC may be filled with an air gap.

A plurality of channel structures 160 on the upper substrate 110 in the memory cell area 120 may pass through the plurality of gate lines 130 to extend in the vertical direction (Z direction). The plurality of channel structures 160 may be arranged to be spaced apart from each other with a predetermined interval therebetween in the first horizontal direction (X direction) and the second horizontal direction (Y direction). The plurality of channel structures 160 may be the channel structure CH including the charge storage layer CS, the channel structure CH, the buried insulating layer IL, and the drain area DR described with reference to FIG. 4.

In the cell array structure CAS, the memory cell area 120 may include a plurality of normal cell areas 120N and a plurality of dummy cell areas 120D1 and 120D2. FIG. 5 exemplifies a configuration in which the memory cell area 120 includes three dummy cell areas 120D1 and 120D2 and the remaining normal cell areas 120N. The dummy cell areas 120D1 and 120D2 may be separated by a plurality of word line cut areas WLC of the memory cell area 120 and may be spaced apart from each other in the second horizontal direction (Y direction). The normal cell area 120N may be adjacent to the dummy cell areas 120D1 and 120D2. For example, the dummy cell areas 120D1 and 120D2 may be at opposite sides, in the Y direction, of the normal cell area 120N. However, the number and arrangement of each of the normal cell area 120N and the dummy cell areas 120D1 and 120D2 are not limited to those illustrated in FIG. 5, and various modifications and changes may be made within the scope of the technical spirit of the inventive concept. For example, memory blocks adjacent to the tile cut TC shown in FIG. 2, for example, memory blocks BLK1 and BLKn may be configured as a dummy cell area. The memory blocks BLK1 and BLKn may be a portion of the memory cell area 120 corresponding to a portion where channel structures are not formed or the density of channel structures is lower than the other, normal memory blocks.

In the memory cell area 120, a plurality of bit lines BL may be respectively disposed on the plurality of channel structures 160. The plurality of bit lines BL may be disposed parallel to each other and may extend long in the second horizontal direction (Y direction). In the normal cell area 120N, each of the plurality of channel structures 160 may be connected to a corresponding bit line BL among the plurality of bit lines BL. The width of the plurality of gate stacks GS in the second horizontal direction (Y direction) is limited by the plurality of word line cut areas WLC. The plurality of gate stacks GS separated from each other by the plurality of word line cut areas WLC may correspond to or may be the plurality of memory blocks BLK1 to BLKn, respectively.

In the dummy cell area 120D1, the upper substrate 110 may include a plurality of through electrodes THV formed at positions facing the bit lines BL of the memory cell area 120. For example, each of the plurality of through electrodes THV may be disposed under a corresponding bit line of the plurality of bit lines BL and may be connected thereto (see, FIG. 4). In the dummy cell area 120D1, an insulating structure 170 may be disposed on the upper substrate 110. In the dummy cell area 120D1, the plurality of through electrodes THV may pass through the gate stack GS of the cell array structure CAS and the upper substrate 110 to extend long in the vertical direction (Z direction) to the inside of the peripheral circuit structure PCS. For example, the plurality of through electrode THV may extend into the peripheral circuit, thereby connecting the plurality of bit lines BL to the peripheral circuit structure PCS. Each of the plurality of through electrodes THV may be surrounded by the insulating structure 170 in the cell array structure CAS. The dummy cell area 120D1 may be referred to as a bit line through electrode area 120D1 formed in the memory cell area 120.

The memory device 10 may include a pair of connection step areas 122C disposed at opposite sides of the memory cell area 120 in the first horizontal direction (X direction) respectively, and a pair of dummy step areas 122D disposed at opposite sides of the memory cell area 120 in the second horizontal direction (Y direction) respectively. In the pair of connection step areas 122C and the pair of dummy step areas 122D, the width of the plurality of gate lines 130 in the first horizontal direction (X direction) and the width of the plurality of gate lines 130 in the second horizontal direction (Y direction) may gradually decrease as the distance from the upper substrate 110 increases. Each of the plurality of gate stacks GS may include a plurality of gate lines 130 extending parallel to each other in the horizontal direction and overlapping each other in the vertical direction (Z direction) over the memory cell area 120 and the connection step area 122C.

The dummy cell area 120D2 may be divided by the word line cut area WLC of the memory cell area 120 adjacent to the dummy step area 122D and may be at opposite sides (i.e., opposite edges), in the Y direction, of the memory cell area 120. The cell array structure CAS of the dummy cell area 120D2 may have weaker structural stability than the cell array structure CAS of the normal cell area 120N in the manufacturing process of the memory device 10. The dummy cell area 120D2 may not be included in the memory capacity of the memory device 10 and may be used for a special purpose of checking the characteristics of the cell array structure CAS. In some embodiments, the cell array structure CAS of the dummy cell area 120D2 may not be connected to the bit line BL of the memory cell area 120.

The normal cell area 120N, the dummy cell area 120D2, and the bit line through-electrode area 120D1 formed in the memory cell area 120, and the dummy step area 122D may be disposed to correspond to the row decoder 220 (of FIG. 1) formed in the peripheral circuit structure PCS. Such a row decoder array architecture may be arranged as described below with reference to FIGS. 5 to 23G. In an embodiment, the row decoder 220 (of FIG. 1) may be disposed in a row decoder area of the peripheral circuit structure PCS and may be adjacent to one of the dummy cell area 120D2, the bit line through-electrode area 120D1 formed in the memory cell area 120, and the dummy step area 122D. In an embodiment, each memory block of the plurality of memory blocks may be disposed between two adjacent word line cut areas WLC, and may have a block height corresponding to a distance between the two adjacent word line cut areas WLC in the second horizontal direction (Y direction). A height, in the second horizontal direction, of 122D may be different from the block height. A height of each unit row decoder circuit (e.g., a first row decoder XDEC1 or a second row decoder XDEC2 in FIGS. 7A to 7C, 8A to 8F, 9, and 10A to 10F) may be measured in the second horizontal direction (Y-direction).

Figure 6:
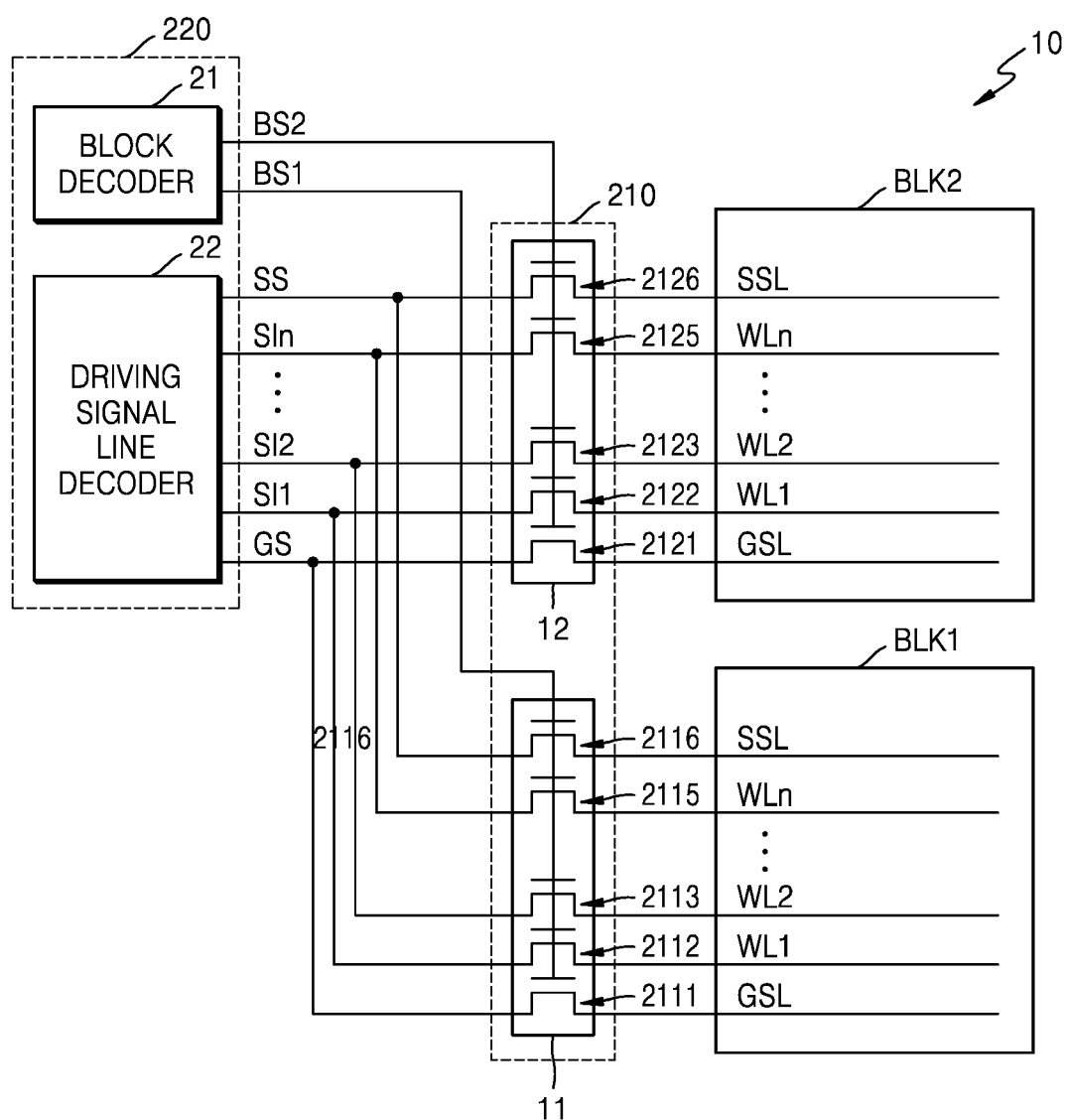
FIG. 6 is a diagram illustrating a row decoder of a two-memory block sharing scheme according to an embodiment of the inventive concept.

FIG. 6 is a diagram illustrating a row decoder 220 of a two-memory block sharing scheme according to an embodiment of the inventive concept. FIG. 6 shows that the row decoder 220 is shared by the first and second memory blocks BLK1 and BLK2. The row decoder 220 of FIG. 6 is described as a unit row decoder circuit shared by two memory blocks.

Figure 9:
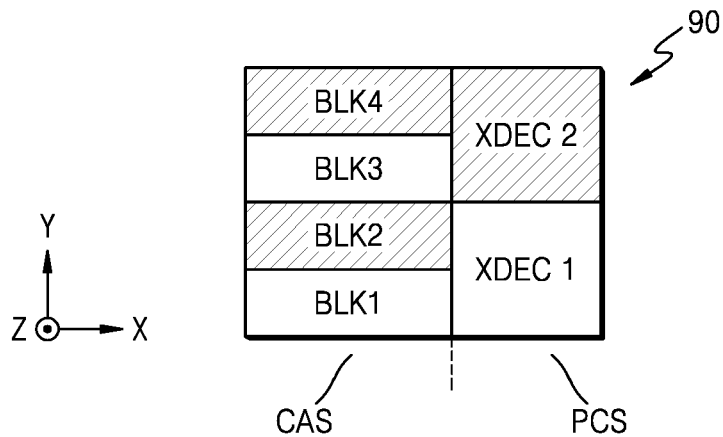
FIG. 9 and FIGS. 10A to 10F show a row decoder array architecture of a two-memory block sharing scheme according to an embodiment of the inventive concept.

Referring to FIG. 6, the memory device 10 may include a pass transistor circuit 210 between the row decoder 220 and the first and second memory blocks BLK1 and BLK2, and the pass transistor circuit 210 may include a plurality of pass transistor circuits respectively corresponding to the first and second memory blocks BLK1 and BLK2. The first and second memory blocks BLK1 and BLK2 may be disposed adjacent to each other, and each of the first and second memory blocks BLK1 and BLK2 may include a ground selection line GSL, a plurality of word lines WL1 to WLn, and a string selection line SSL, where n is a positive integer. According to an embodiment, the row decoder 220 may be disposed to correspond to the first and third memory blocks BLK1 and BLK3 spaced apart from each other (FIG. 9).

The row decoder 220 may include a block decoder 21 and a driving signal line decoder 22. The pass transistor circuit 210 may include a pass transistor circuit 11 corresponding to the first memory block BLK1 and a pass transistor circuit 12 corresponding to the second memory block BLK2. The pass transistor circuit 11 may include a plurality of pass transistors 2111 to 2116, and the pass transistor circuit 12 may include a plurality of pass transistors 2121 to 2126.

The block decoder 21 may be connected to the pass transistor circuit 11 through a first block select signal BS1 line and may be connected to the pass transistor circuit 12 through a second block select signal BS2 line. The first block selection signal BS1 line may be connected to gates of the plurality of pass transistors 2111 to 2116. For example, when the first block selection signal BS1 is activated, the plurality of pass transistors 2111 to 2116 are turned on, and accordingly, the first memory block BLK1 may be selected. In addition, the second block selection signal BS2 line may be connected to gates of the plurality of pass transistors 2121 to 2126. For example, when the second block selection signal BS2 is activated, the plurality of pass transistors 2121 to 2126 are turned on, and accordingly, the second memory block BLK2 may be selected.

The driving signal line decoder 22 may be connected to the pass transistor circuits 11 and 12 through the string selection line driving signal SS line, word line driving signal SI1 to Sin lines, and the ground selection line driving signal GS line. In detail, the string selection line driving signal SS line, the word line driving signal SI0 to Sin lines, and the ground selection line driving signal GS line may be connected to the sources of the plurality of pass transistors 2111 to 2116, and 2121 to 2126, respectively.

The pass transistor circuit 11 may be connected to the first memory block BLK1 through a ground selection line GSL, a plurality of word lines WL1 to WLn, and a string selection line SSL. The pass transistor 2111 may be connected between the ground selection line driving signal line GS and the ground selection line GSL. The pass transistors 2112 to 2115 may be respectively connected between the word line driving signal lines SI1 to Sin and the plurality of word lines WL1 to WLn. The pass transistor 2116 may be connected between the string select line driving signal line SS and the string select line SSL. For example, when the first block selection signal BS1 is activated, the pass transistors 2111 to 2116 may provide driving signals provided through the ground selection line driving signal GS line, the word line driving signal SI1 to SIn lines, and the string selection line driving signal line SS to the ground selection line GSL, the plurality of word lines WL1 to WLn, and the string selection line SSL, respectively. The description of the pass transistor circuit 11 may also be applied to the pass transistor circuit 12, and thus the already given description will be omitted.

Figure 7A:
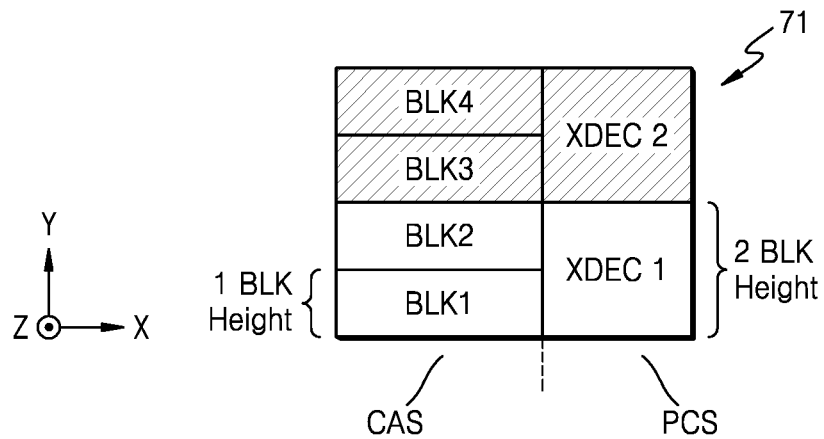
FIGS. 7A to 7C show examples of a row decoder array architecture according to embodiments of the inventive concept.
Figure 7B:
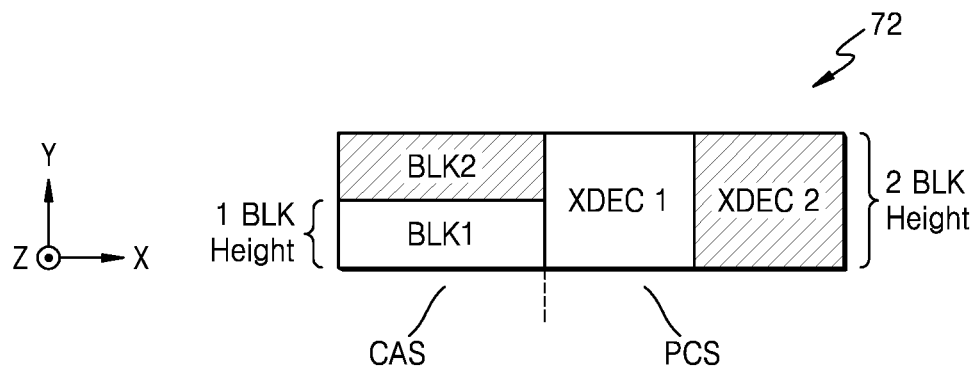
Figure 7C:
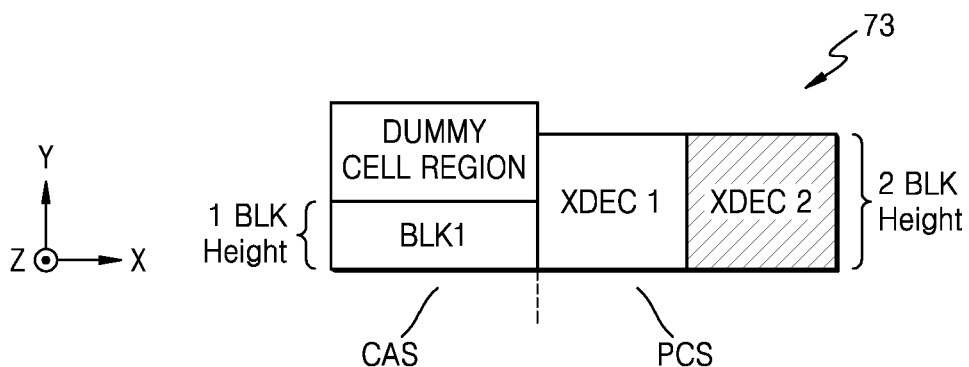

FIGS. 7A to 7C show examples of a row decoder array architecture according to embodiments of the inventive concept.

Referring to FIG. 7A, a row decoder array architecture 71 shows that a first row decoder XDEC1 (i.e., a first unit row decoder) is shared by the first and second memory blocks BLK1 and BLK2 and is arranged to fit a height of two blocks, and a second row decoder XDEC2 (i.e., a second unit row decoder) is shared by the third and fourth memory blocks BLK3 and BLK4 and is arranged to fit a height of two blocks. Each of the first and second row decoders XEC1 and XDEC2 may be referred to as a unit row decoder circuit arranged in a two-memory block sharing scheme. The row decoder array architecture 71 may be configured such that the memory blocks BLK1 to BLK4 are a multiple of two when the first and second row decoders XDEC1 and XDEC2 are disposed. In this case, memory blocks BLK1 to BLK4 may be added so as to be a multiple of two to match the heights of the first and second row decoders XDEC1 and XDEC2, which may increase the chip size. In order to prevent the chip size increase, without additionally arranging memory blocks to match the height of the row decoders XDEC1 and XDEC2, embodiments in which the row decoder array architecture may be adjacent to the dummy cell area 120D2, the bit line through-electrode area 120D1, and the dummy step area 122D of the memory cell area 120 as described with reference to FIG. 5, will be specifically described with reference to FIGS. 8A to 8D.

Each of the first and second row decoders XDEC1 and XDEC2 may be arranged to correspond to the row decoder array architectures 72 and 73 that do not apply a memory block sharing scheme, as shown in FIGS. 7B and 7C. In the row decoder array architecture 72 of FIG. 7B, the first and second memory blocks BLK1 and BLK2 are arranged to fit the heights of the first and second row decoders XDEC1 and XDEC2, respectively, the first row decoder XDEC1 is connected to the first memory block BLK1, and the second row decoder XDEC2 may be connected to the second memory block BLK2. In the row decoder array architecture 73 of FIG. 7C, compared to the row decoder array architecture 72 of FIG. 7B, the dummy cell areas 120D1, 120D2, and 122D as described with reference to FIG. 5 may be disposed in a dummy cell region, instead of the second memory block BLK2, in the area corresponding to the height of each of the first and second row decoders XDEC1 and XDEC2. Since the dummy cell region is assigned to one of the first and second row decoders XDEC1 and XDEC2, additional second memory block BLK2 is not assigned thereto.

FIGS. 8A to 8F show row decoder array architectures in accordance with embodiments of the inventive concept. Each of the row decoder array architectures shown in FIGS. 8A to 8D corresponds to a variant of the row decoder array architecture 71 of FIG. 7. The descriptions described above with reference to FIG. 7 may also be applied to the present embodiments, and the given description will be omitted. Each of the row decoder array architectures shown in FIGS. 8A to 8D may be applied instead of the row decoder array architecture 71 of FIG. 7.

Figure 8A:
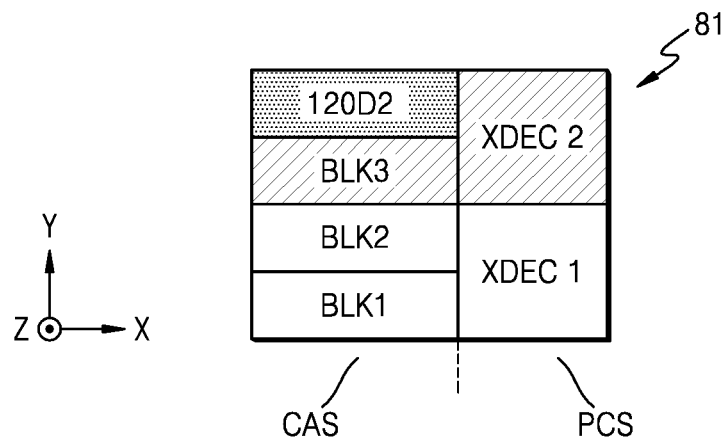
FIGS. 8A to 8F show row decoder array architectures in accordance with embodiments of the inventive concept.

Referring to FIG. 8A, in a row decoder array architecture 81, the third memory block BLK3 and the dummy cell area 120D2 at the edge of the memory cell area 120 may be disposed in an area corresponding to the height of the second row decoder XDEC2.

Figure 8B:
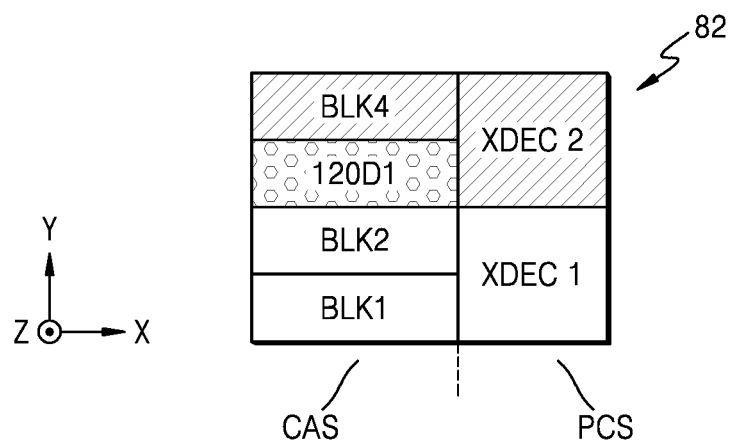

Referring to FIG. 8B, in a row decoder array architecture 82, the fourth memory block BLK4 and the bit line through electrode area 120D1 of the memory cell area 120 may be disposed in an area corresponding to the height of the second row decoder XDEC2.

Figure 8C:
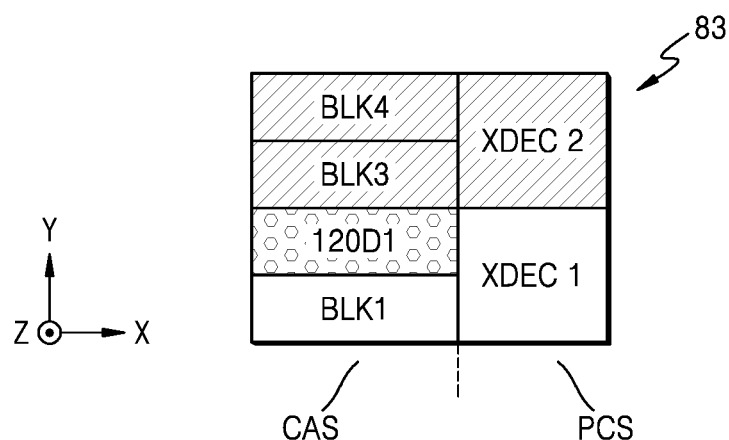

Referring to FIG. 8C, in a row decoder array architecture 83, the first memory block BLK1 and the bit line through electrode area 120D1 of the memory cell area 120 may be disposed in an area corresponding to the height of the first row decoder XDEC1.

Figure 8D:
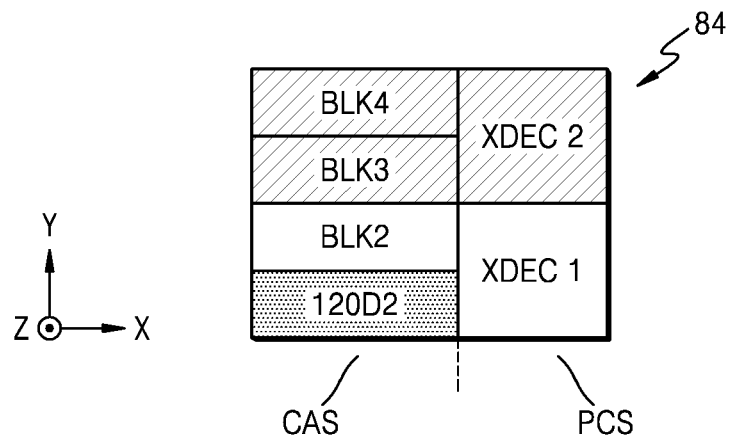

Referring to FIG. 8D, in a row decoder array architecture 84, the second memory block BLK2 and the dummy cell area 120D2 at the edge of the memory cell area 120 may be disposed in an area corresponding to the height of the first row decoder XDEC1.

Figure 8E:
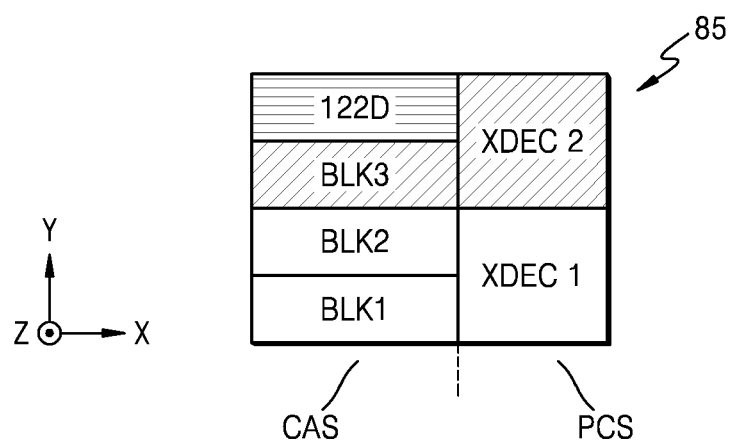

Referring to FIG. 8E, in a row decoder array architecture 85, the third memory block BLK3 and the dummy step area 122D may be disposed in an area corresponding to the height of the second row decoder XDEC2.

Figure 8F:
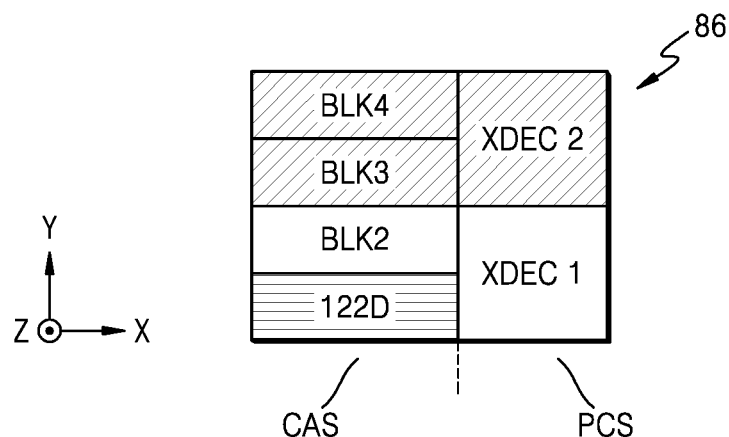

Referring to FIG. 8F, in a row decoder array architecture 86, the second memory block BLK2 and the dummy step area 122D may be disposed in an area corresponding to the height of the first row decoder XDEC1.

FIG. 9 and FIGS. 10A to 10F show other examples of the row decoder array architecture of the two-memory block sharing scheme of FIG. 6.

Referring to FIG. 9, in a row decoder array architecture 90, it is shown that the first row decoder XDEC1 is shared by first and third memory blocks BLK1 and BLK3 spaced apart from each other and the second row decoder XDEC2 is also shared by the second and fourth memory blocks BLK2 and BLK4 spaced apart from each other and disposed to match the height of two blocks. Each of the row decoder array architectures shown in FIGS. 10A to 10F may be applied instead of the row decoder array architecture 90 of FIG. 9.

Figure 10A:
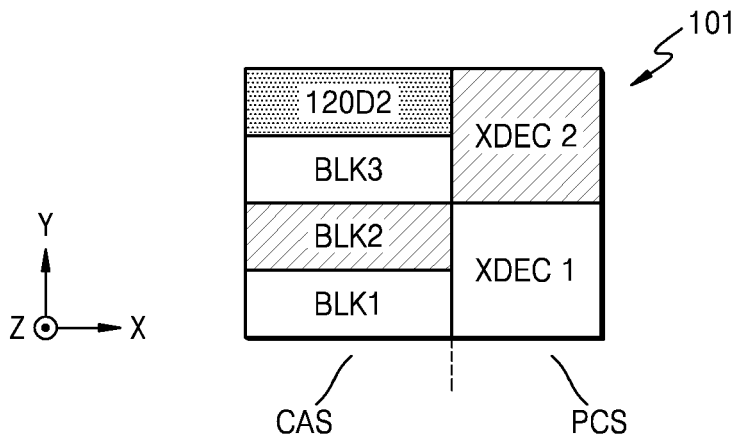

Referring to FIG. 10A, in a row decoder array architecture 101, the third memory block BLK3 and the dummy cell area 120D2 at the edge of the memory cell area 120 may be disposed in an area corresponding to the height of the second row decoder XDEC2.

Figure 10B:
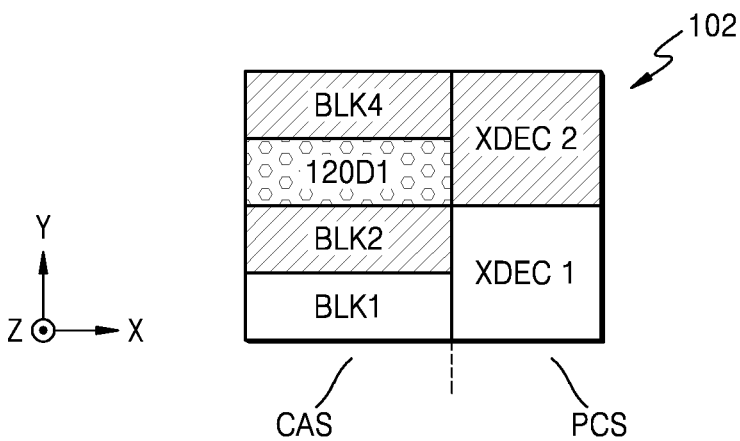

Referring to FIG. 10B, in a row decoder array architecture 102, the fourth memory block BLK4 and the bit line through electrode area 120D1 of the memory cell area 120 may be disposed in an area corresponding to the height of the second row decoder XDEC2.

Figure 10C:
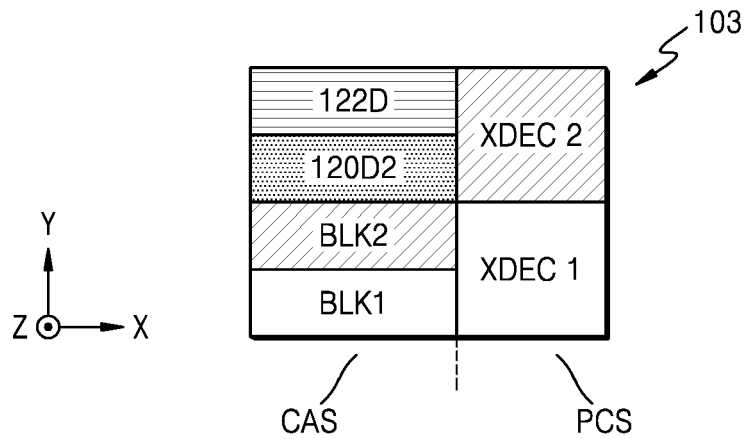

Referring to FIG. 10C, in a row decoder array architecture 103, a dummy step area 122D and a dummy cell area 120D2 at an edge of the memory cell area 120 (i.e., an edge dummy block) may be disposed in an area corresponding to the height of the second row decoder XDEC2. For example, a height of the second row decoder XDEC2 may correspond to a sum of a height of the dummy step area 122D and a block height of the dummy cell area 120D2. For the simplicity of drawings, no memory blocks are connected to the second row decoder XDEC2, but a number of memory blocks, smaller than a number of memory blocks connected to the first row decoder XDEC1, may be connected to the second row decoder XDEC2.

Figure 10D:
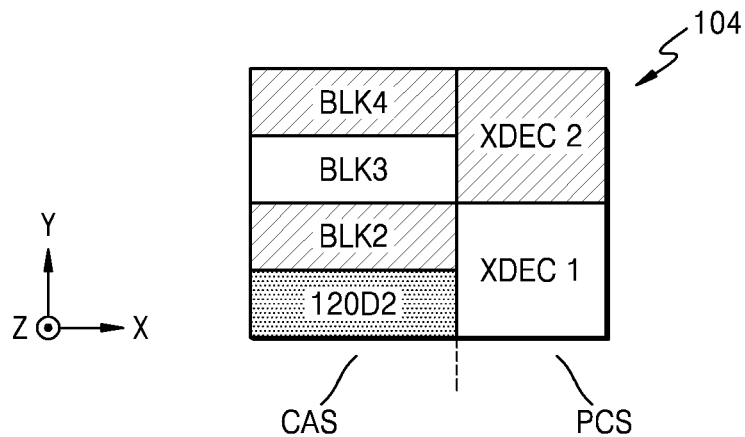

Referring to FIG. 10D, in a row decoder array architecture 104, the second memory block BLK2 and the dummy cell area 120D2 at the edge of the memory cell area 120 may be disposed in an area corresponding to the height of the first row decoder XDEC1.

Figure 10E:
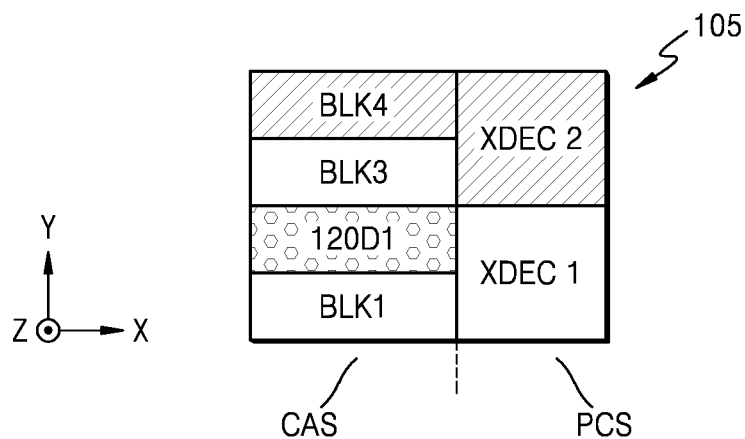

Referring to FIG. 10E, in a row decoder array architecture 105, the first memory block BLK1 and the bit line through-electrode area 120D1 of the memory cell area 120 may be disposed in an area corresponding to the height of the first row decoder XDEC1.

Figure 10F:
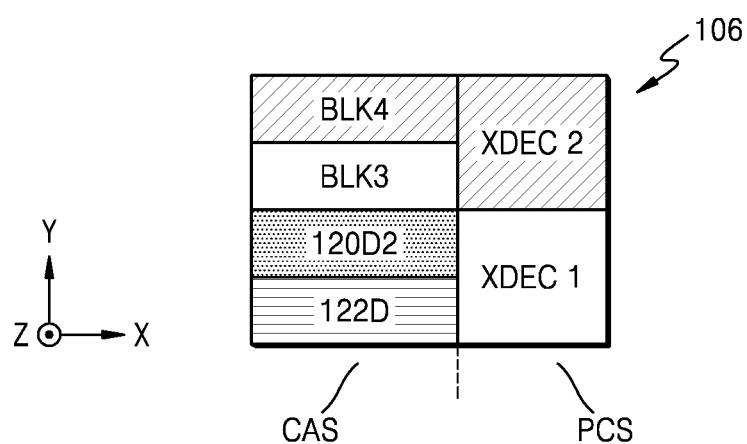

Referring to FIG. 10F, in a row decoder array architecture 106, a dummy cell area 120D2 and a dummy step area 122D at the edge of the memory cell area 120 may be disposed in an area corresponding to the height of the first row decoder XDEC1.

Figure 11:
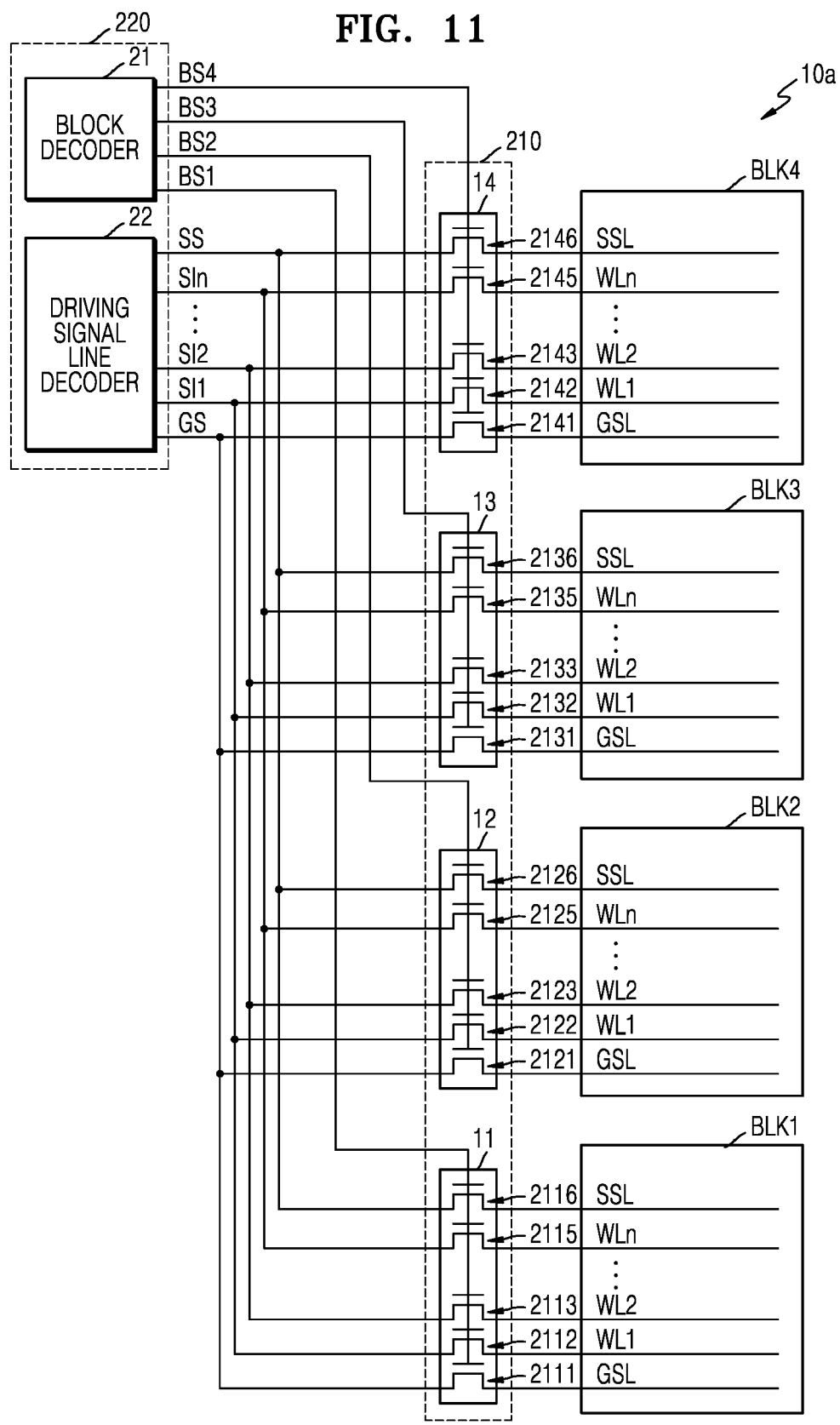
FIG. 11 is a diagram illustrating a row decoder of a four-memory block sharing scheme according to an embodiment of the inventive concept.

FIG. 11 is a diagram illustrating a row decoder 220 of a four-memory block sharing scheme according to an embodiment of the inventive concept. FIG. 11 shows that the row decoder 220 is shared by first to fourth memory blocks BLK1 to BLK4. A memory device 10a of FIG. 11 may correspond to the modified example of the memory device 10 of FIG. 6, and the descriptions given above with reference to FIG. 6 may also be applied to the present embodiment, and descriptions already given will be omitted. The row decoder 220 of FIG. 11 will be described as a unit row decoder shared by 4 memory blocks.

Referring to FIG. 11, the memory device 10a may include a pass transistor circuit 210 between the row decoder 220 and the first to fourth memory blocks BLK1 to BLK4, and the pass transistor circuit 210 may include a plurality of pass transistor circuits respectively corresponding to the first to fourth memory blocks BLK1 to BLK4. The row decoder 220 may include a block decoder 21 and a driving signal line decoder 22, and the pass transistor circuit 210 may include a pass transistor circuit 11 corresponding to the first memory block BLK1, a pass transistor circuit 12 corresponding to the second memory block BLK2, a pass transistor circuit 13 corresponding to the third memory block BLK3, and a pass transistor circuit 14 corresponding to the fourth memory block BLK4. The pass transistor circuit 13 may include a plurality of pass transistors 2131 to 2136, and the pass transistor circuit 14 may include a plurality of pass transistors 2141 to 2146.

The block decoder 21 may be connected to the pass transistor circuit 13 through a third block selection signal BS3 line, and may be connected to the pass transistor circuit 14 through the fourth block selection signal BS4 line. The third block selection signal BS3 line may be connected to gates of the plurality of pass transistors 2131 to 2136. For example, when the third block selection signal BS3 is activated, the plurality of pass transistors 2131 to 2136 are turned on, and accordingly, the third memory block BLK3 may be selected. In addition, the fourth block selection signal BS4 line may be connected to gates of the plurality of pass transistors 2141 to 2146. For example, when the fourth block selection signal BS4 is activated, the plurality of pass transistors 2141 to 2146 are turned on, and accordingly, the fourth memory block BLK4 may be selected.

The pass transistor circuit 13 may be connected to the third memory block BLK3 through the ground selection line GSL, the plurality of word lines WL1 to WLn, and the string selection line SSL. The pass transistor circuit 14 may be connected to the fourth memory block BLK4 through the ground selection line GSL, the plurality of word lines WL1 to WLn, and the string selection line SSL.

FIGS. 12A to 12C, 13A to 13J, 14A to 14G, 15A to 15F, 16A to 16E, and 17A to 17E show examples of a row decoder array architecture according to embodiments of the inventive concept. FIGS. 13A to 13J, 14A to 14G, 15A to 15F, 16A to 16E, and 17A to 17E show examples of a row decoder array architecture of the 4 memory block sharing scheme of FIG. 11.

Figure 12A:
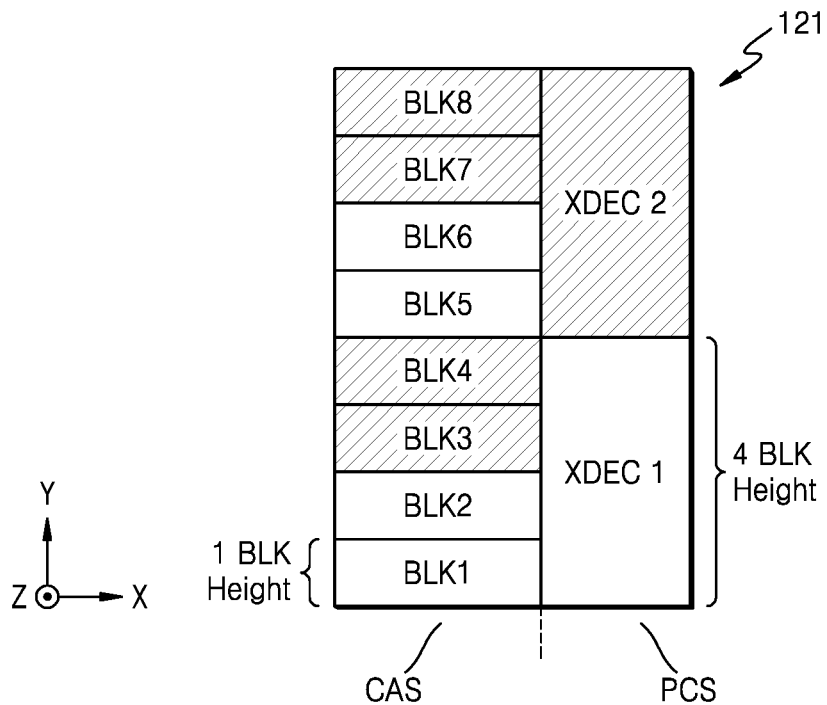
FIGS. 12A to 12C, 13A to 13J, 14A to 14G, 15A to 15F, 16A to 16E, and 17A to 17E show examples of a row decoder array architecture according to embodiments of the inventive concept.

Referring to FIG. 12A, in a row decoder array architecture 121, the row decoder array architecture 121 shows that the first row decoder XDEC1 is shared by the first and second memory blocks BLK1 and BLK2 and the fifth and sixth memory blocks BLK5 and BLK6, and the second row decoder XDEC2 is shared by the third and fourth memory blocks BLK3 and BLK4 and the seventh and eighth memory blocks BLK7 and BLK8 and is arranged to fit a height of 4 blocks. Each of the first and second row decoders XDEC1 and XDEC2 may be referred to as a unit row decoder of a 2n (n is a positive integer) memory block sharing scheme.

Figure 12B:
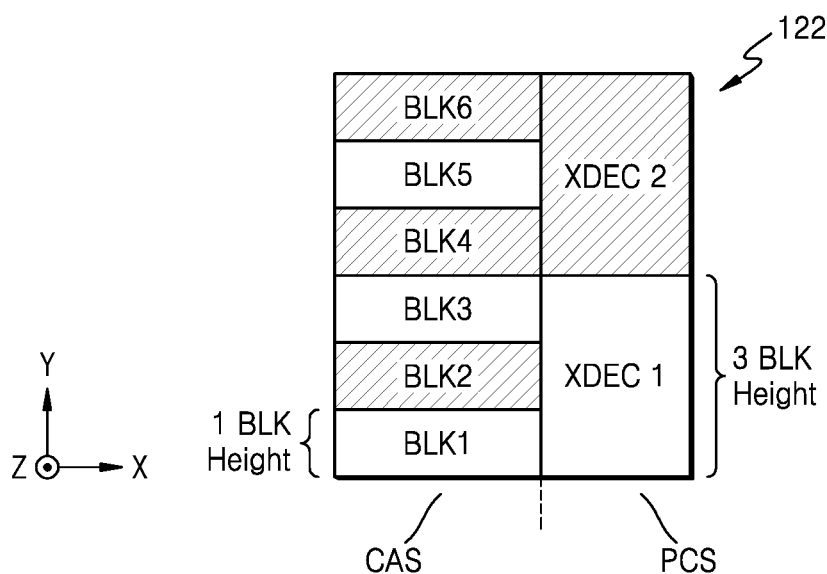
Figure 12C:
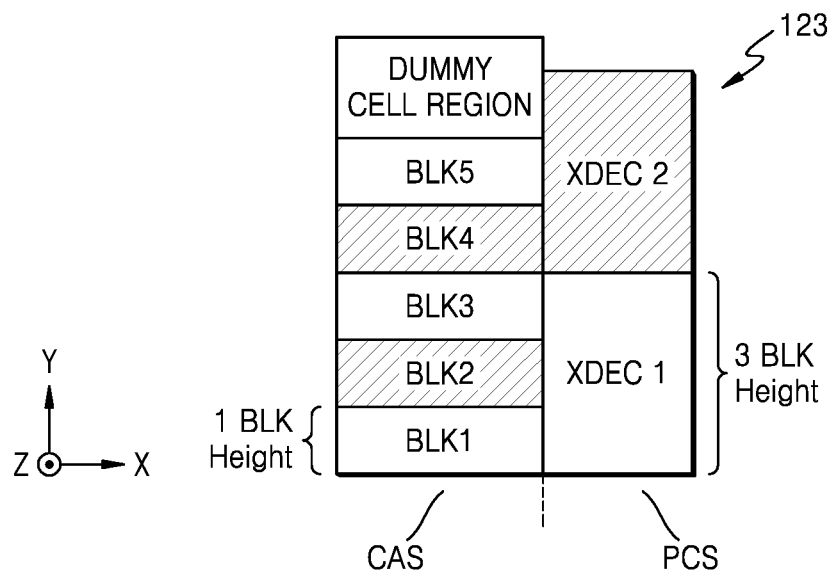

Each of the first and second row decoders XDEC1 and XDEC2 may be arranged to correspond to the row decoder array architecture 122 and 123 to which a 2n+1 memory block sharing scheme is applied, as shown in FIGS. 12B and 12C. In the row decoder array architecture 122 of FIG. 12B, the first row decoder XDEC1 is shared by the first, third, and fifth memory blocks BLK1, BLK3, and BLK5, and the second row decoder XDEC2 is shared by the second, fourth, and sixth memory blocks BLK2, BLK4, and BLK6 and is arranged to fit a height of 3 blocks. In the row decoder array architecture 123 of FIG. 12C, compared to the row decoder array architecture 122 of FIG. 12B, the dummy cell areas 120D1, 120D2, and 122D described with reference to FIG. 5 may be disposed, instead of the sixth memory block BLK6, in the area corresponding to the height of the second row decoder XDEC2.

Each of the row decoder array architectures shown in FIGS. 13A to 13J, 14A to 14G, 15A to 15F, 16A to 16E, and 17A to 17E may be applied instead of the row decoder array architecture 121 of FIG. 12A.

Figure 13A:
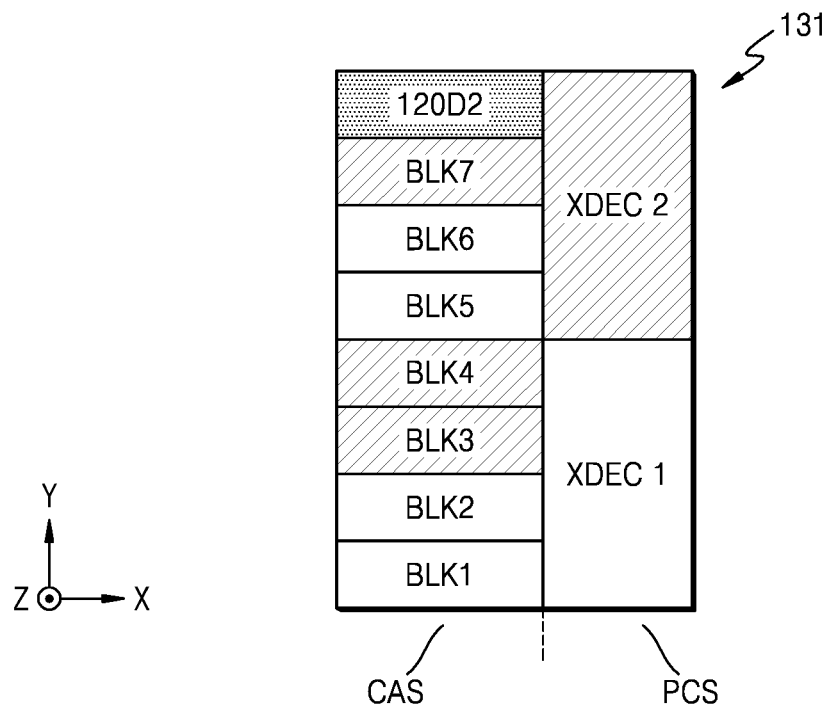

Referring to FIG. 13A, in a row decoder array architecture 131, fifth, sixth, and seventh memory blocks BLK5, BLK6, and BLK7 and a dummy cell area 120D2 at the edge of the memory cell area 120 may be disposed in an area corresponding to the height of the second row decoder XDEC2.

Figure 13B:
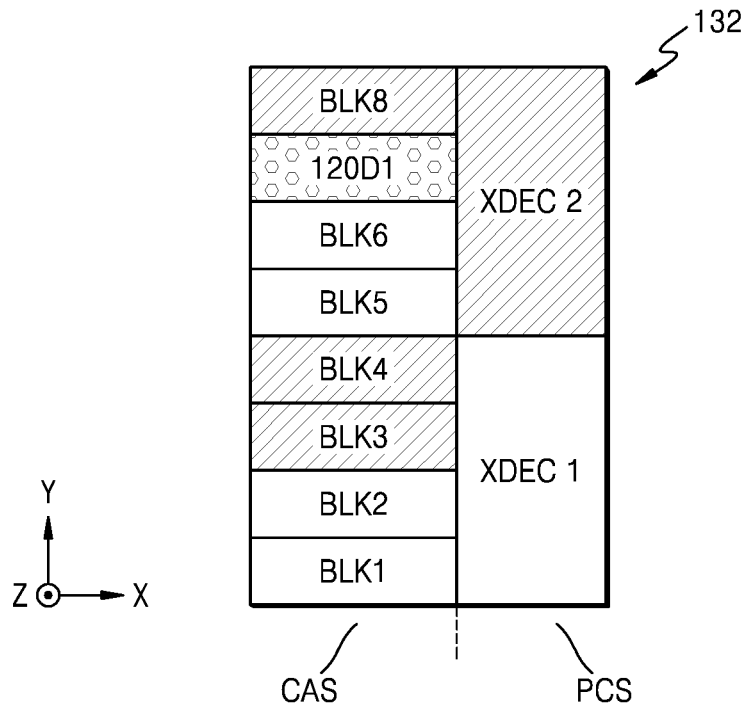

Referring to FIG. 13B, in a row decoder array architecture 132, fifth, sixth, and eighth memory blocks BLK5, BLK6, and BLK8 and a bit line through-electrode area 120D1 of memory cell area 120 may be disposed in an area corresponding to the height of the second row decoder XDEC2.

Figure 13C:
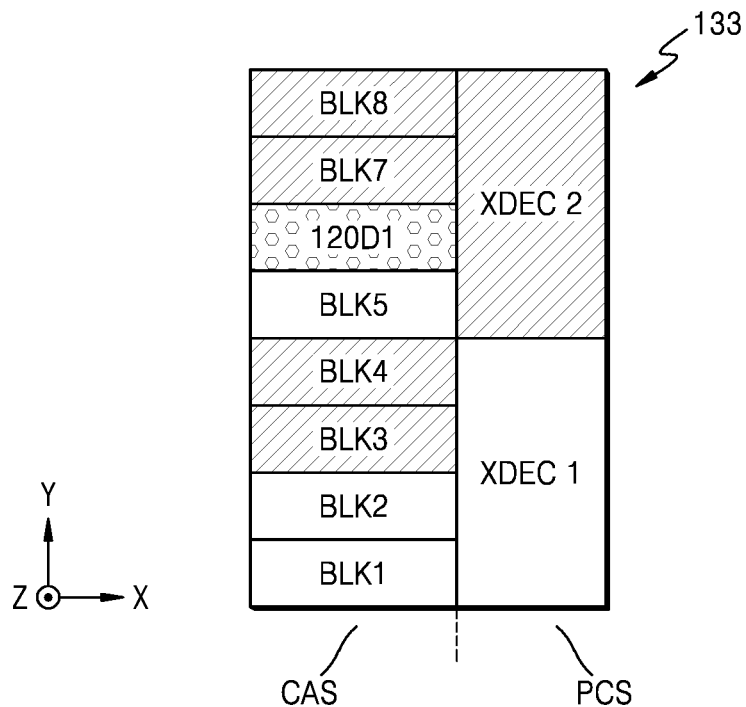

Referring to FIG. 13C, in a row decoder array architecture 133, fifth, seventh, and eighth memory blocks BLK5, BLK7, and BLK8 and a bit line through-electrode area 120D1 of memory cell area 120 may be disposed in an area corresponding to the height of the second row decoder XDEC2.

Figure 13D:
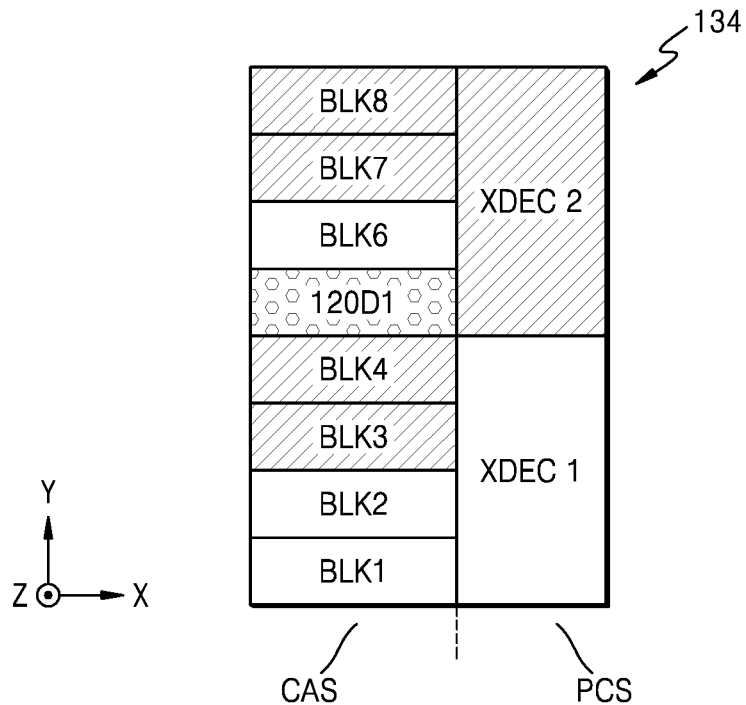

Referring to FIG. 13D, in a row decoder array architecture 134, sixth, seventh, and eighth memory blocks BLK6, BLK7, and BLK8 and a bit line through-electrode area 120D1 of memory cell area 120 may be disposed in an area corresponding to the height of the second row decoder XDEC2.

Figure 13E:
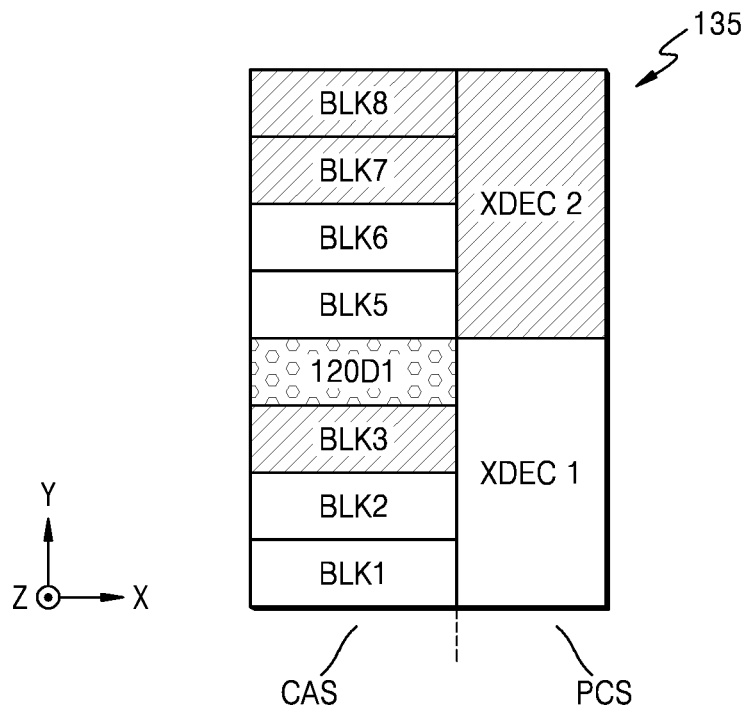

Referring to FIG. 13E, in a row decoder array architecture 135, first, second, and third memory blocks BLK1, BLK2, and BLK3 and a bit line through-electrode area 120D1 of memory cell area 120 may be disposed in an area corresponding to the height of the first row decoder XDEC1.

Figure 13F:
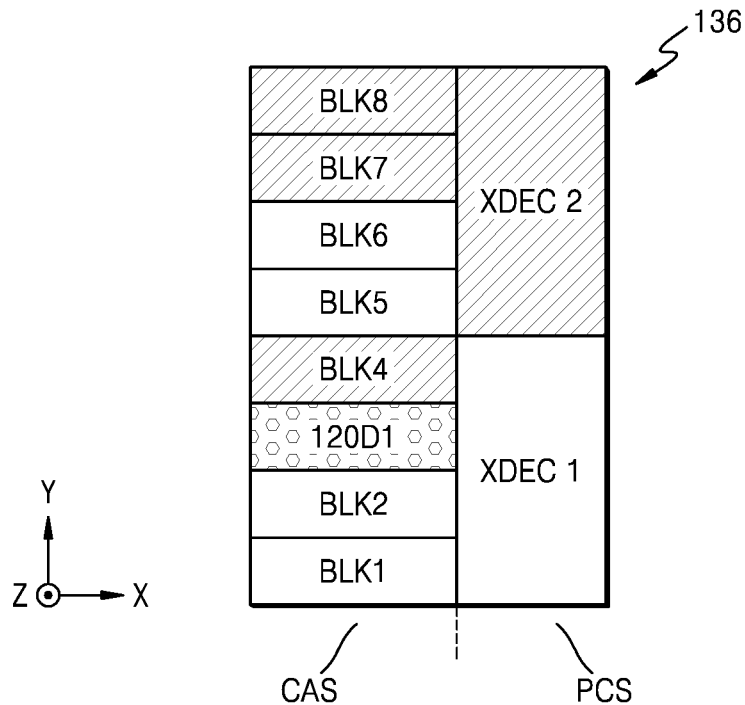

Referring to FIG. 13F, in a row decoder array architecture 136, first, second, and fourth memory blocks BLK1, BLK2, and BLK4 and a bit line through-electrode area 120D1 of memory cell area 120 may be disposed in an area corresponding to the height of the first row decoder XDEC1.

Figure 13G:
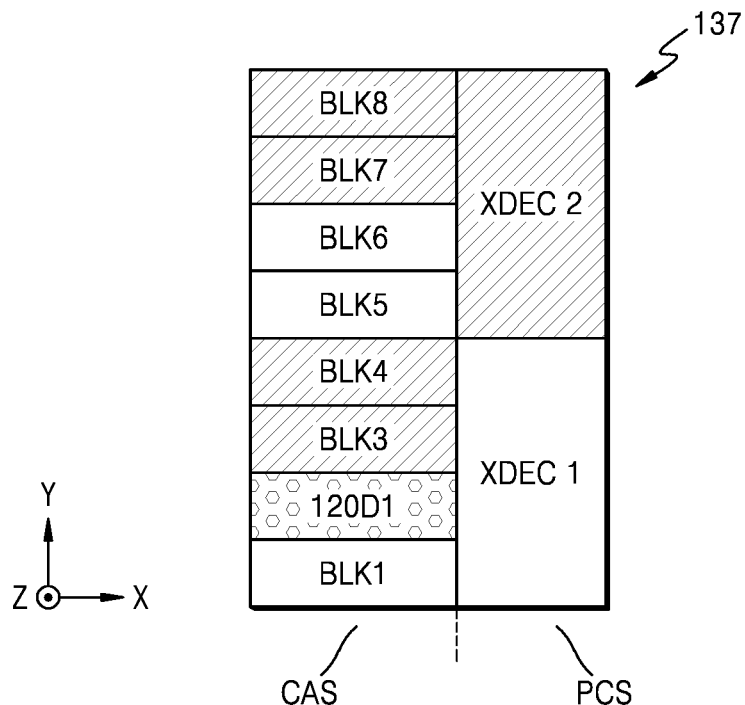

Referring to FIG. 13G, in a row decoder array architecture 137, first, third, and fourth memory blocks BLK1, BLK3, and BLK4 and a bit line through-electrode area 120D1 of memory cell area 120 may be disposed in an area corresponding to the height of the first row decoder XDEC1.

Figure 13H:
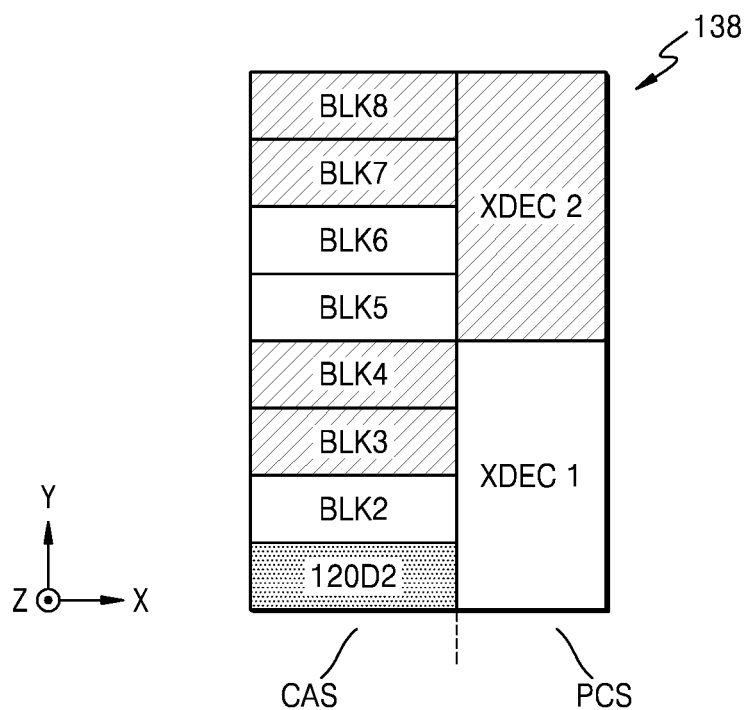

Referring to FIG. 13H, in a row decoder array architecture 138, second, third, and fourth memory blocks BLK2, BLK3, and BLK4 and a dummy cell area 120D2 at the edge of the memory cell area 120 may be disposed in an area corresponding to the height of the first row decoder XDEC1.

Figure 13I:
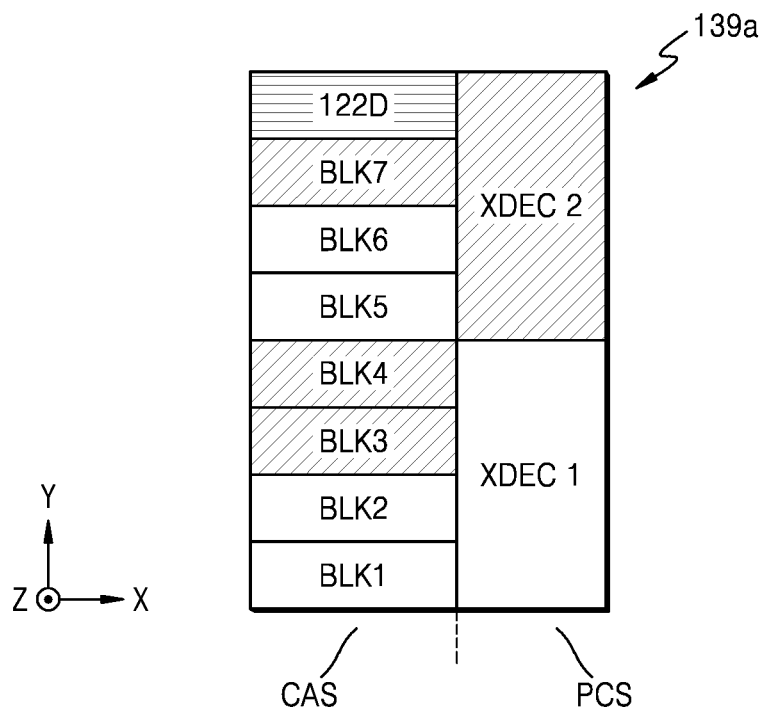

Referring to FIG. 13I, in a row decoder array architecture 139a, fifth, sixth, and seventh memory blocks BLK5, BLK6, and BLK7 and a dummy step area 122D may be disposed in an area corresponding to the height of the second row decoder XDEC2.

Figure 13J:
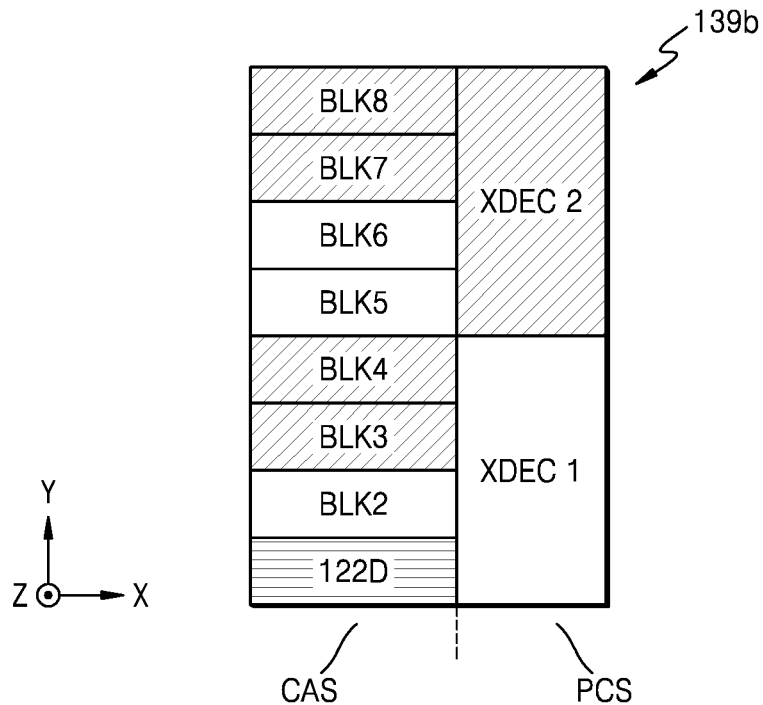

Referring to FIG. 13J, in a row decoder array architecture 139b, second, third, and fourth memory blocks BLK2, BLK3, and BLK4 and a dummy step area 122D may be disposed in an area corresponding to the height of the first row decoder XDEC1.

Figure 14A:
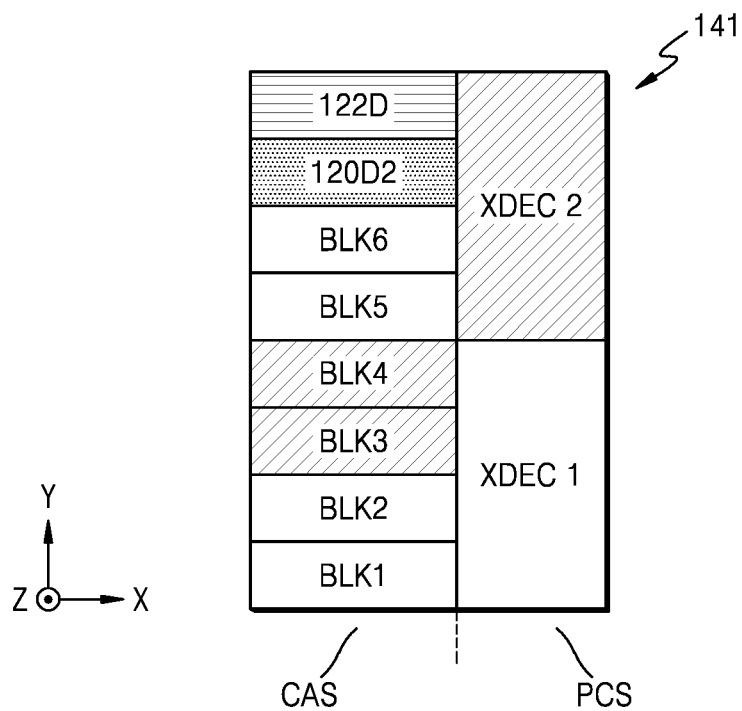

Referring to FIG. 14A, in a row decoder array architecture 141, fifth and sixth memory blocks BLK5 and BLK6, a dummy cell area 120D2 of an edge of the memory cell area 120, and a dummy step area 122D may be disposed in an area corresponding to the height of the second row decoder XDEC2.

Figure 14B:
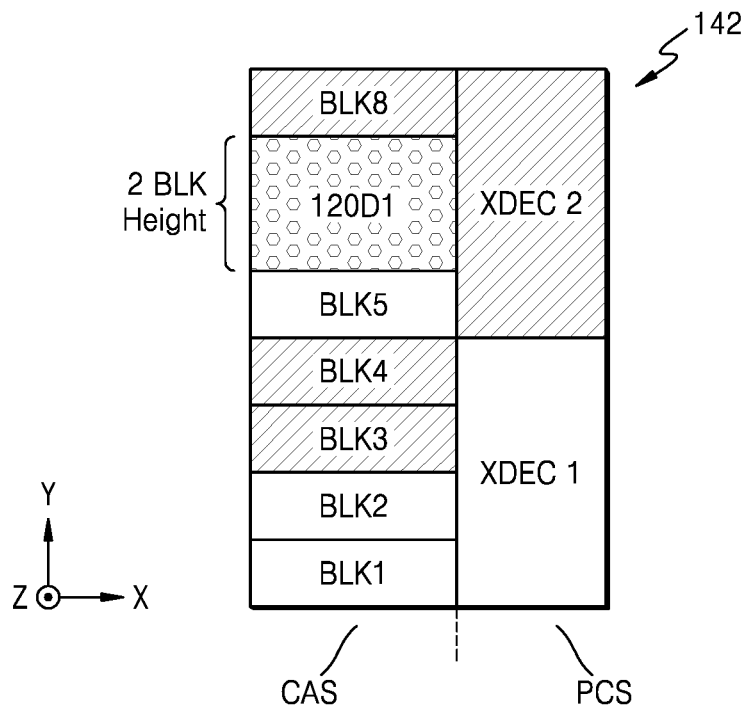

Referring to FIG. 14B, in a row decoder array architecture 142, fifth and eighth memory blocks BLK5 and BLK8 and a bit line through-electrode area 120D1 having a height of two blocks of the memory cell area 120 may be disposed in an area corresponding to the height of the second row decoder XDEC2.

Figure 14C:
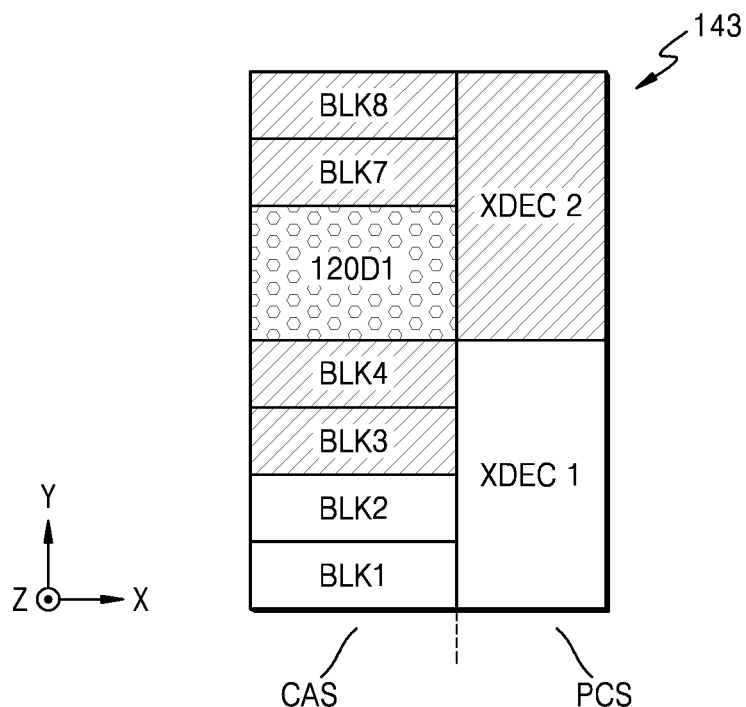
Figure 14D:
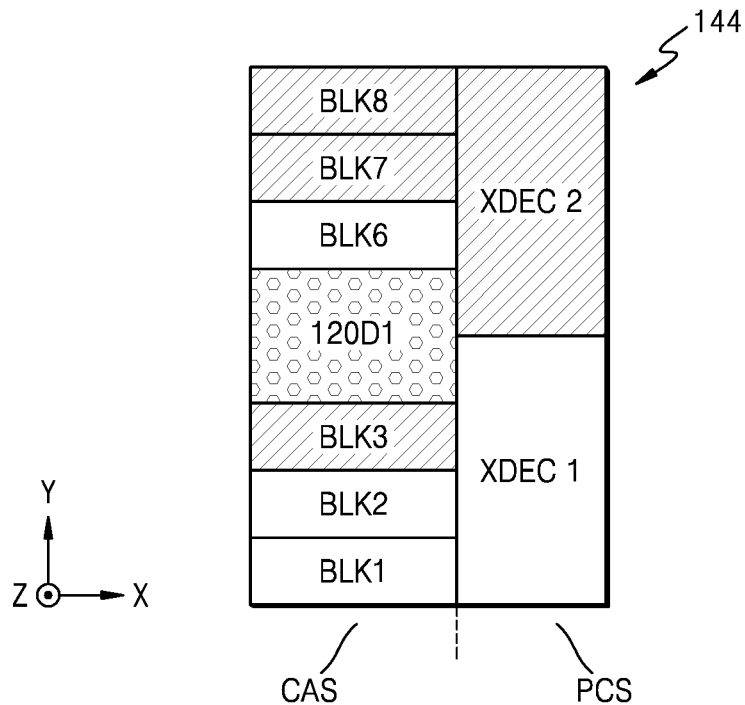

Referring to FIG. 14C, in a row decoder array architecture 143, seventh and eighth memory blocks BLK7 and BLK8 and a bit line through-electrode area 120D1 having a height of two blocks of the memory cell area 120 may be disposed in an area corresponding to the height of the second row decoder XDEC2.

Referring to FIG. 13D, in a row decoder array architecture 144, sixth, seventh, and eighth memory blocks BLK6, BLK7, and BLK8 and a bit line through-electrode area 120D1 having a height of one block of the memory cell area 120 may be disposed in an area corresponding to the height of the second row decoder XDEC2, and first, second, and third memory blocks BLK1, BLK2, and BLK3 and a bit line through-electrode area 120D1 having a height of one block of the memory cell area 120 may be disposed in an area corresponding to the height of the first row decoder XDEC1.

Figure 14E:
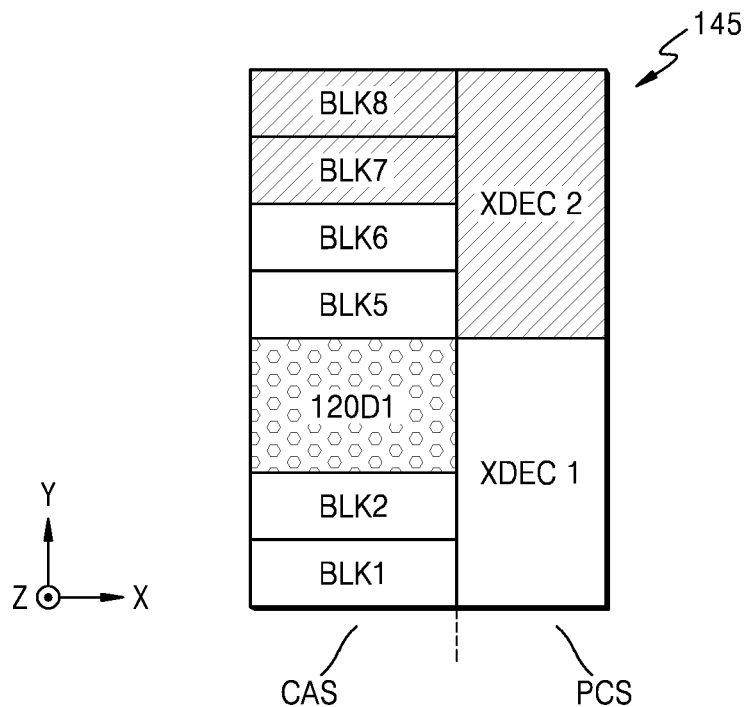

Referring to FIG. 14E, in a row decoder array architecture 145, first and second memory blocks BLK1 and BLK2 and a bit line through-electrode area 120D1 having a height of two blocks of the memory cell area 120 may be disposed in an area corresponding to the height of the first row decoder XDEC1.

Figure 14F:
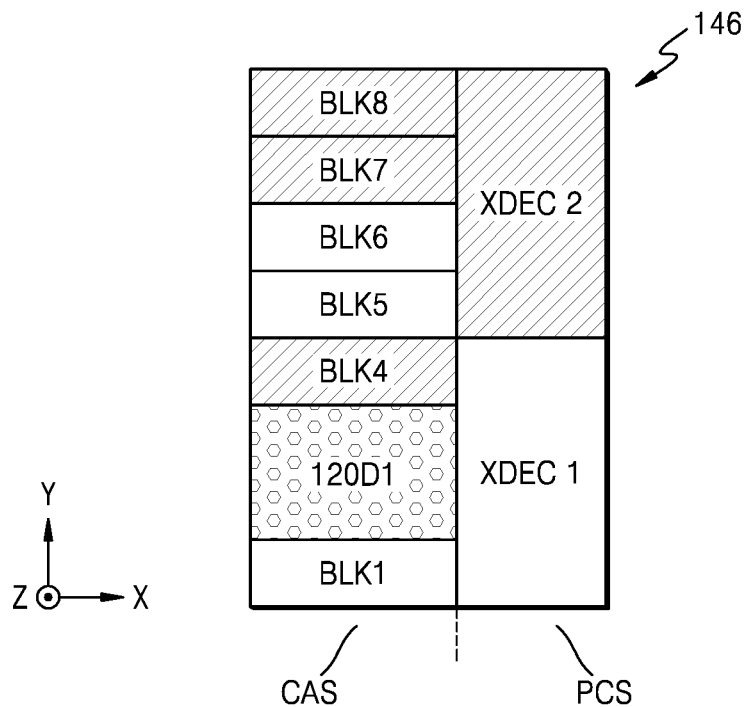

Referring to FIG. 14F, in a row decoder array architecture 146, first and fourth memory blocks BLK1 and BLK4 and a bit line through-electrode area 120D1 having a height of two blocks of the memory cell area 120 may be disposed in an area corresponding to the height of the first row decoder XDEC1.

Figure 14G:
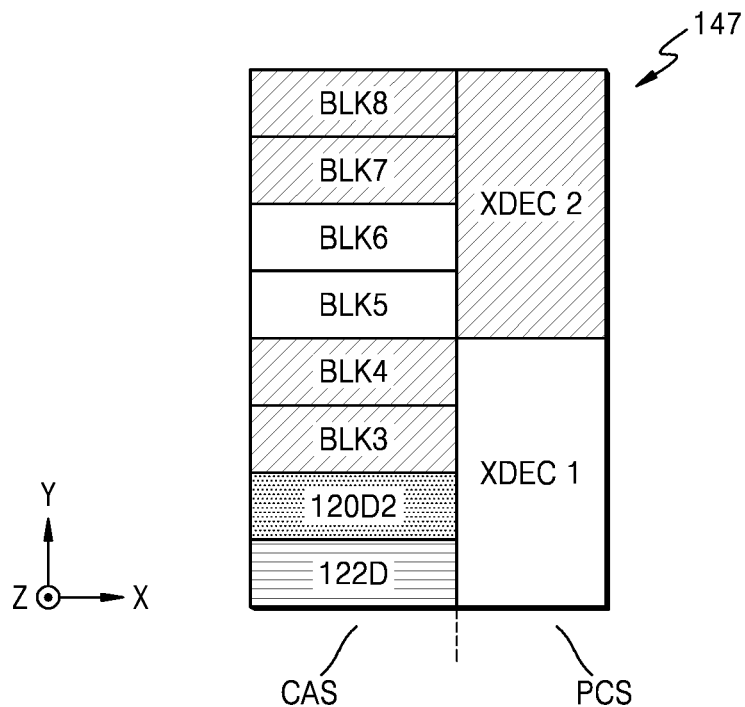

Referring to FIG. 14G, in a row decoder array architecture 147, third and fourth memory blocks BLK3 and BLK4, a dummy cell area 120D2 of an edge of the memory cell area 120, and a dummy step area 122D may be disposed in an area corresponding to the height of the first row decoder XDEC1.

Figure 15A:
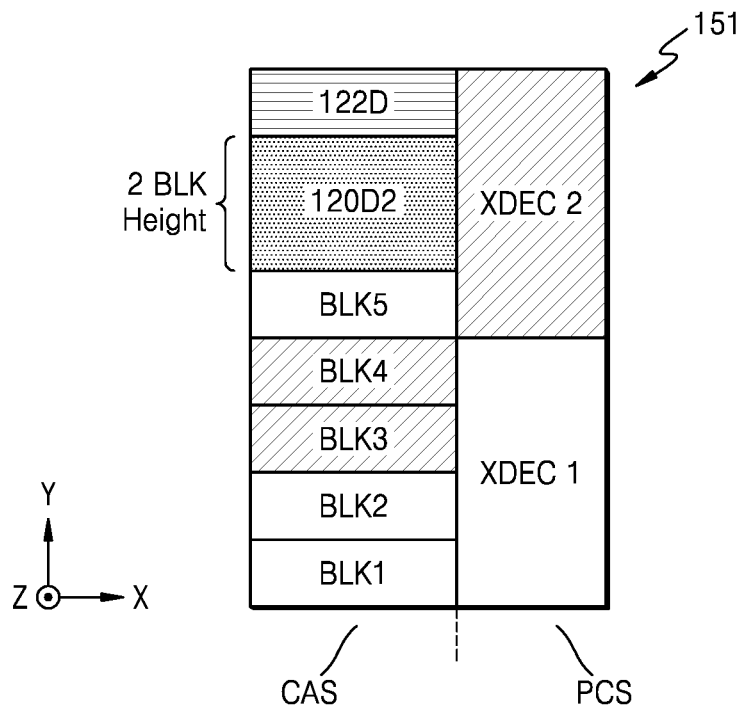

Referring to FIG. 15A, in a row decoder array architecture 151, fifth memory block BLK5, a dummy cell area 120D2 having a height of two block of an edge of the memory cell area 120, and a dummy step area 122D may be disposed in an area corresponding to the height of the second row decoder XDEC2.

Figure 15B:
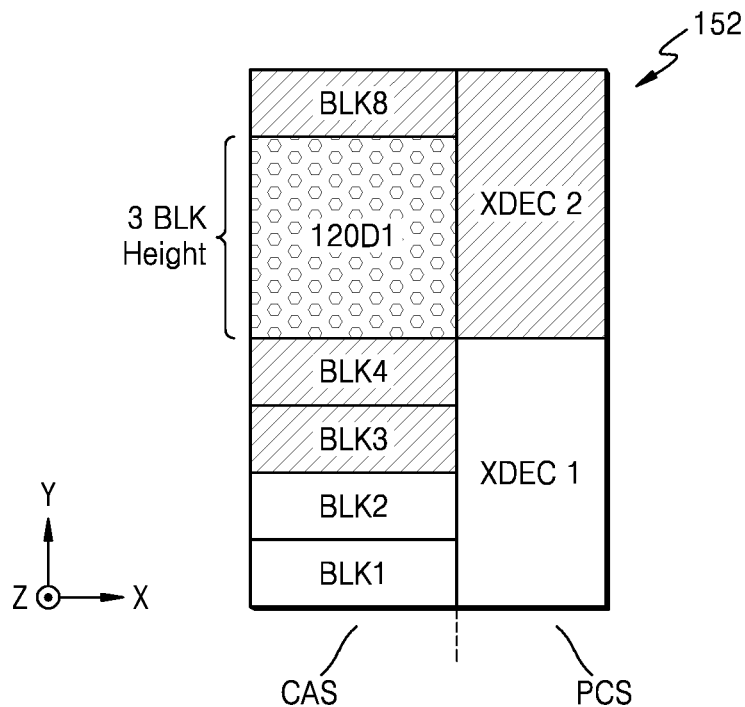

Referring to FIG. 15B, in a row decoder array architecture 151, an eighth memory block BLK8, a bit line through-electrode area 120D1 having a height of 3 blocks of the memory cell area 120 may be disposed in an area corresponding to the height of the second row decoder XDEC2.

Figure 15C:
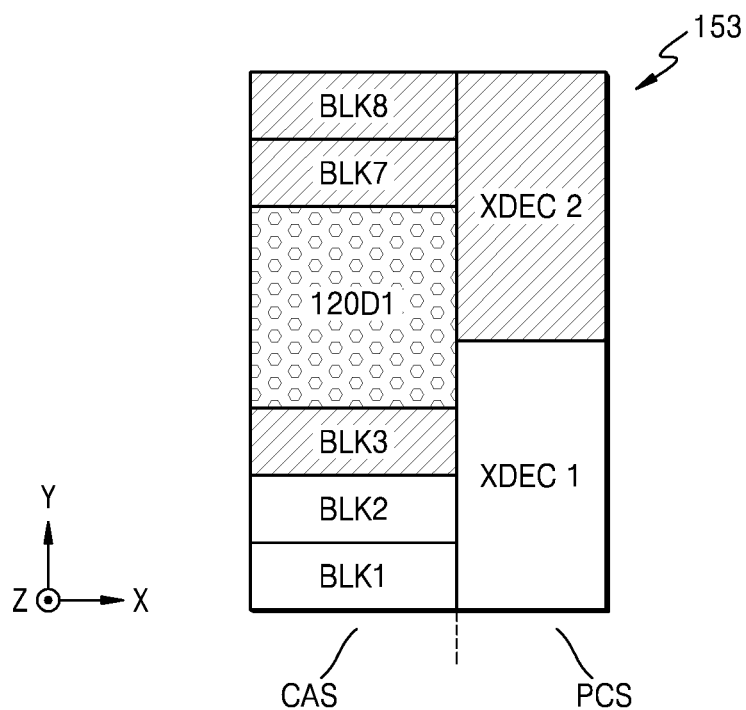

Referring to FIG. 15C, in a row decoder array architecture 153, seventh and eighth memory blocks BLK7 and BLK8 and a bit line through-electrode area 120D1 having a height of two blocks of the memory cell area 120 may be disposed in an area corresponding to the height of the second row decoder XDEC2, and first, second, and third memory blocks BLK1, BLK2, and BLK3 and a bit line through-electrode area 120D1 having a height of one block of the memory cell area 120 may be disposed in an area corresponding to the height of the first row decoder XDEC1.

Figure 15D:
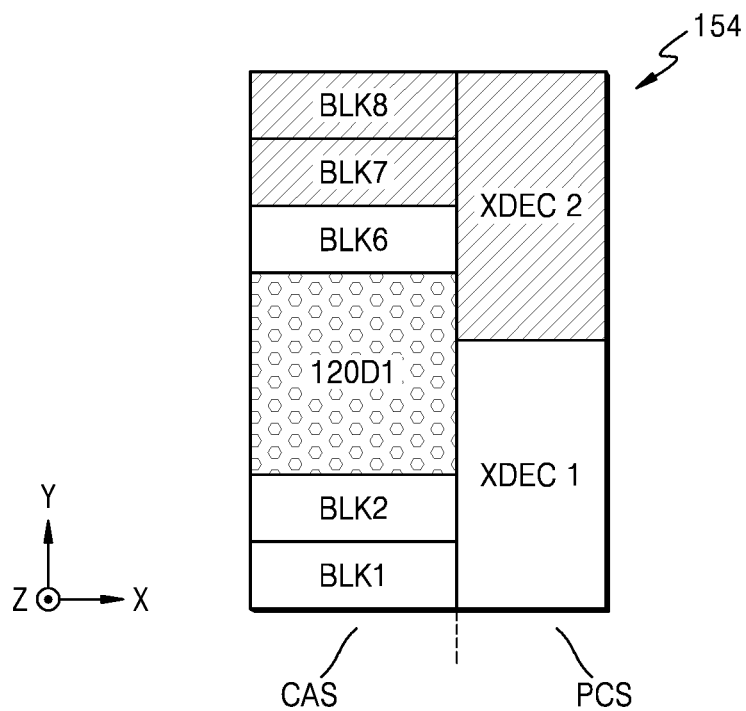

Referring to FIG. 15D, in a row decoder array architecture 154, sixth, seventh, and eighth memory blocks BLK6, BLK7, and BLK8 and a bit line through-electrode area 120D1 having a height of one block of the memory cell area 120 may be disposed in an area corresponding to the height of the second row decoder XDEC2, and first and second memory blocks BLK1 and BLK2 and a bit line through-electrode area 120D1 having a height of two blocks of the memory cell area 120 may be disposed in an area corresponding to the height of the first row decoder XDEC1.

Figure 15E:
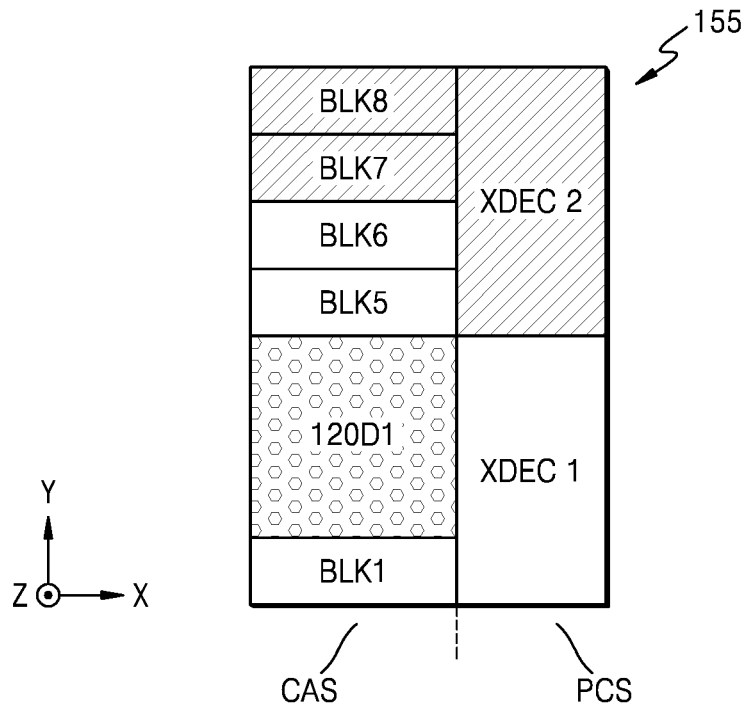

Referring to FIG. 15E, in a row decoder array architecture 155, a first memory block BLK1 and a bit line through-electrode area 120D1 having a height of three blocks of the memory cell area 120 may be disposed in an area corresponding to the height of the first row decoder XDEC1.

Figure 15F:
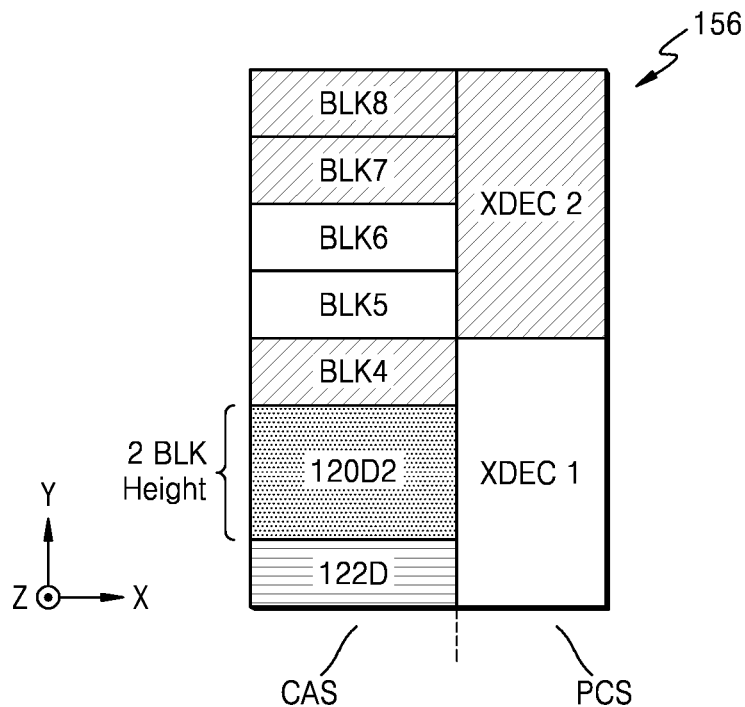

Referring to FIG. 15F, in a row decoder array architecture 155, fourth memory block BLK4, a dummy cell area 120D2 having a height of two blocks at the edge of the memory cell area 120, and a dummy step area 122D may be disposed in an area corresponding to the height of the first row decoder XDEC1.

Figure 16A:
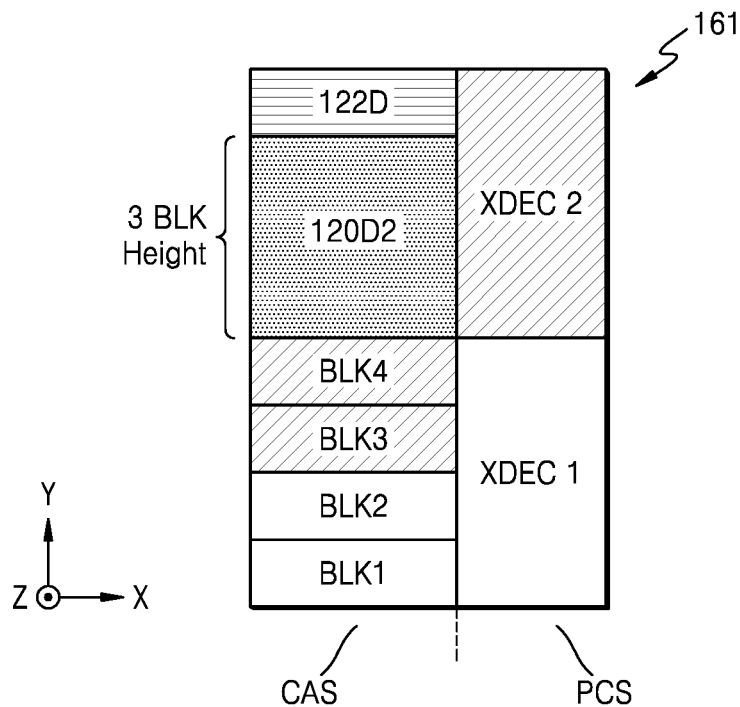

Referring to FIG. 16A, in a row decoder array architecture 161, a dummy cell area 120D2 having a height of three blocks at the edge of the memory cell area 120, and a dummy step area 122D may be disposed in an area corresponding to the height of the second row decoder XDEC2.

Figure 16B:
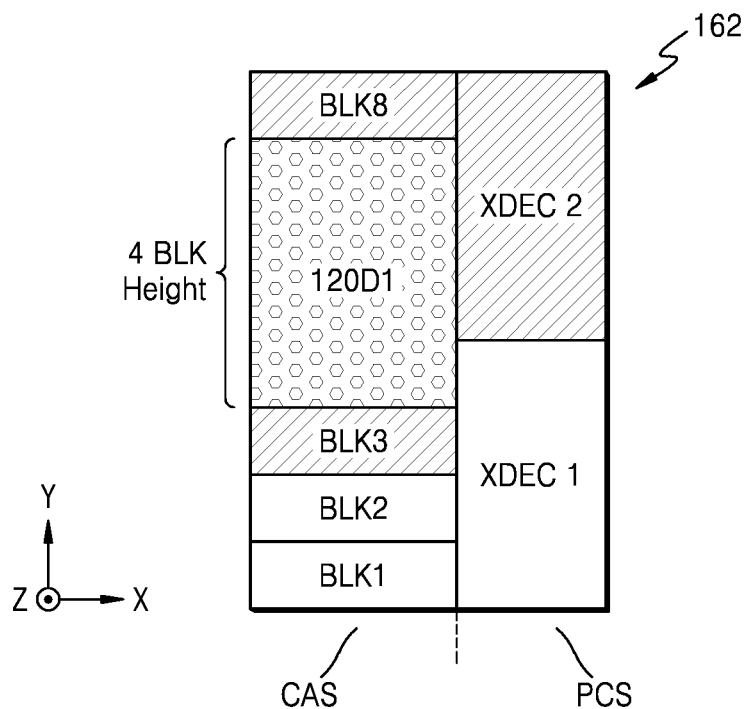

Referring to FIG. 16B, in a row decoder array architecture 162, an eighth memory block BLK8 and a bit line through-electrode area 120D1 having a height of three blocks of the memory cell area 120 may be disposed in an area corresponding to the height of the second row decoder XDEC2, and first, second, and third memory blocks BLK1, BLK2, and BLK3 and a bit line through-electrode area 120D1 having a height of one block of the memory cell area 120 may be disposed in an area corresponding to the height of the first row decoder XDEC1.

Figure 16C:
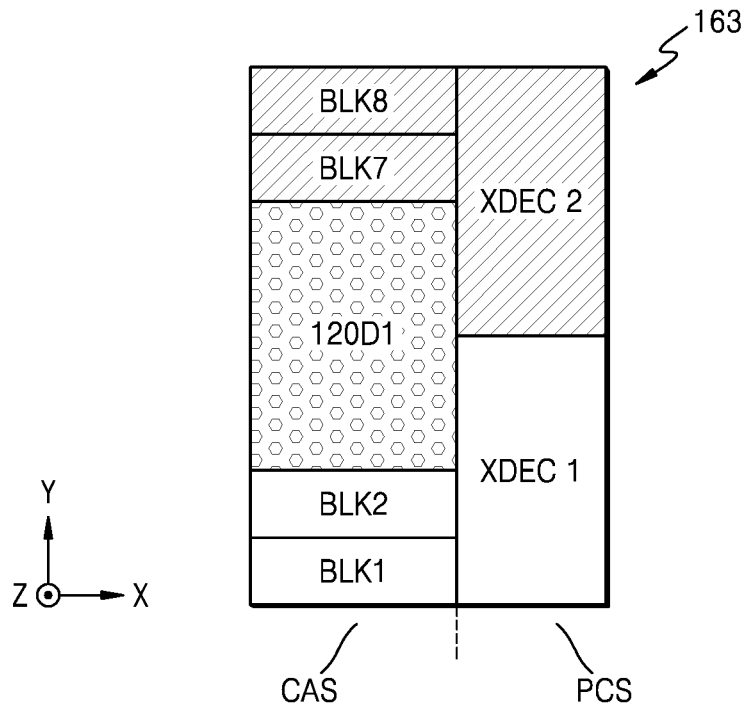

Referring to FIG. 16C, in a row decoder array architecture 163, seven and eighth memory blocks BLK7 and BLK8 and a bit line through-electrode area 120D1 having a height of two blocks of the memory cell area 120 may be disposed in an area corresponding to the height of the second row decoder XDEC2, and first and second memory blocks BLK1 and BLK2 and a bit line through-electrode area 120D1 having a height of two blocks of the memory cell area 120 may be disposed in an area corresponding to the height of the first row decoder XDEC1.

Figure 16D:
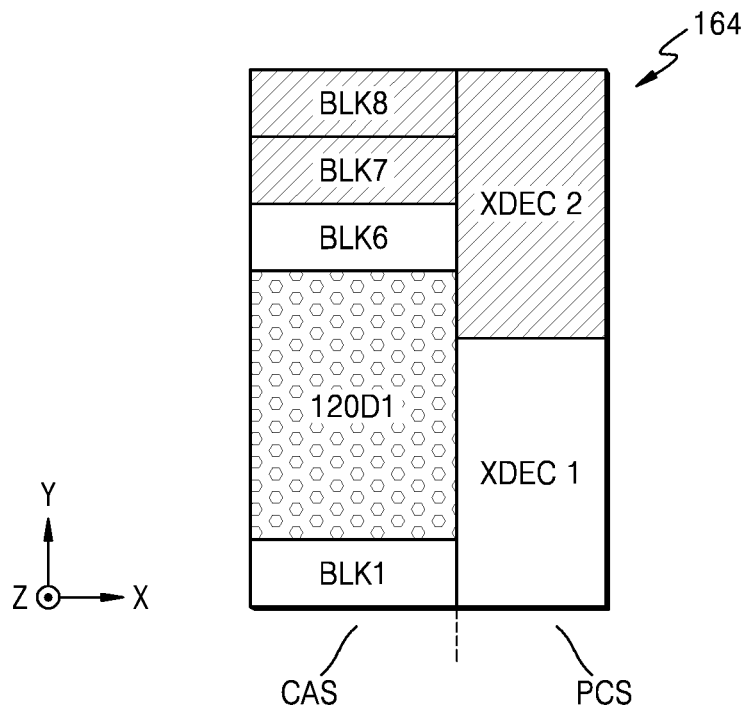

Referring to FIG. 16D, in a row decoder array architecture 164, sixth, seventh, and eighth memory block BLK6, BLK7, and BLK8 and a bit line through-electrode area 120D1 having a height of one block of the memory cell area 120 may be disposed in an area corresponding to the height of the second row decoder XDEC2, and a first memory block BLK1 and a bit line through-electrode area 120D1 having a height of three blocks of the memory cell area 120 may be disposed in an area corresponding to the height of the first row decoder XDEC1.

Figure 16E:
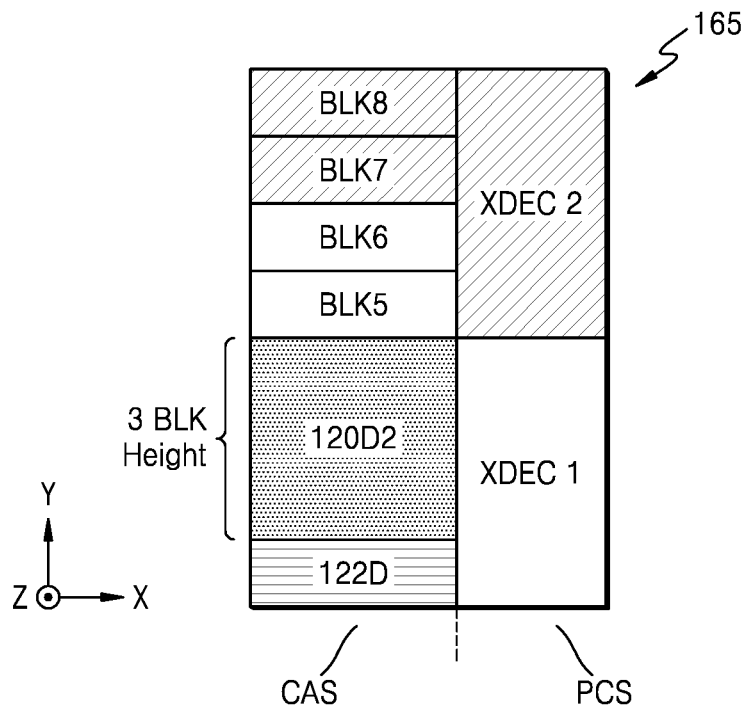

Referring to FIG. 16E, in a row decoder array architecture 165, a dummy cell area 120D2 having a height of three blocks at the edge of the memory cell area 120 and a dummy step area 122D may be disposed in an area corresponding to the height of the first row decoder XDEC1.

Figure 17A:
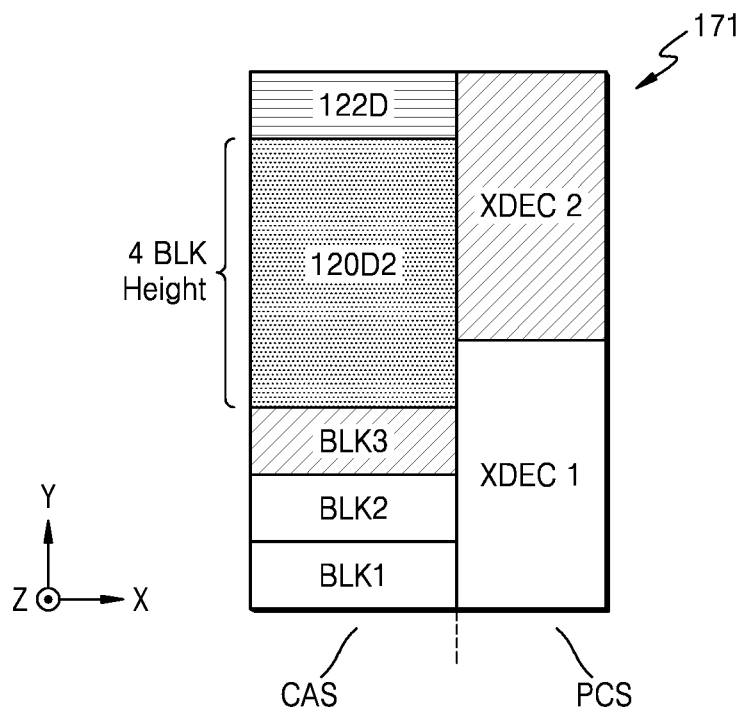

Referring to FIG. 17A, in a row decoder array architecture 171, a dummy cell area 120D2 having a height of three blocks at the edge of the memory cell area 120 and a dummy step area 122D may be disposed in an area corresponding to the height of the second row decoder XDEC2, and first, second, third memory blocks BLK1, BLK2, and BLK3 and a dummy cell area 120D2 having a height of one block of the memory cell area 120 may be disposed in an area corresponding to the height of the first row decoder XDEC1.

Figure 17B:
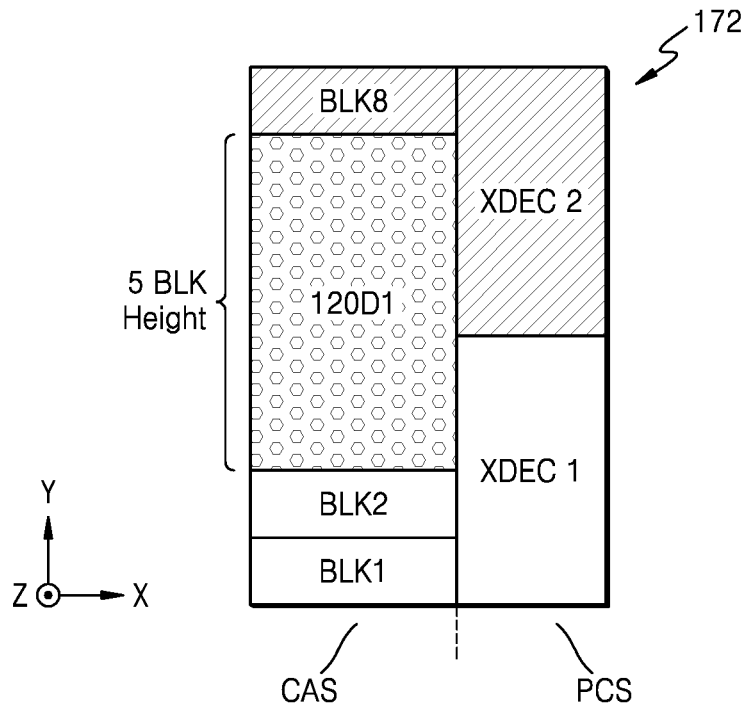

Referring to FIG. 17B, in a row decoder array architecture 172, an eighth memory block BLK8 and a bit line through-electrode area 120D1 having a height of 3 blocks of the memory cell area 120 may be disposed in an area corresponding to the height of the second row decoder XDEC2, and first and second memory blocks BLK1 and BLK2 and a bit line through-electrode area 120D1 having a height of two blocks of the memory cell area 120 may be disposed in an area corresponding to the height of the first row decoder XDEC1.

Figure 17C:
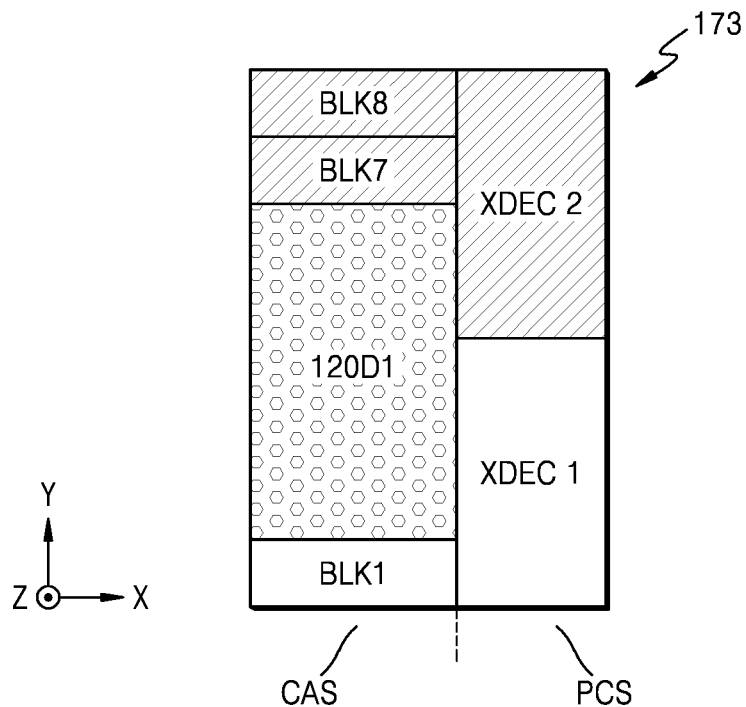

Referring to FIG. 17C, in a row decoder array architecture 173, seventh and eighth memory blocks BLK7 and BLK8 and a bit line through-electrode area 120D1 having a height of two blocks of the memory cell area 120 may be disposed in an area corresponding to the height of the second row decoder XDEC2, and first memory block BLK1 and a bit line through-electrode area 120D1 having a height of 3 blocks of the memory cell area 120 may be disposed in an area corresponding to the height of the first row decoder XDEC1.

Figure 17D:
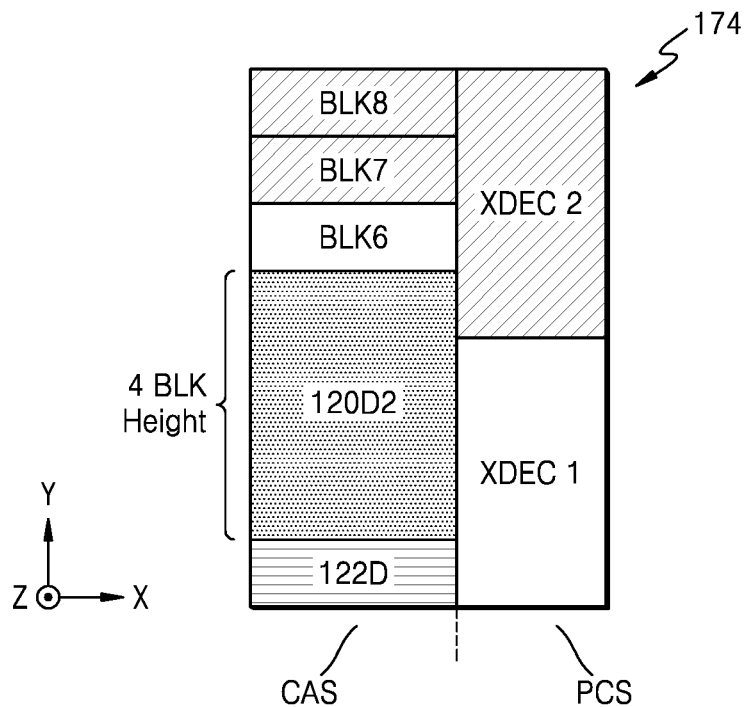

Referring to FIG. 17D, in a row decoder array architecture 174, sixth, seventh, and eighth memory blocks BLK6, BLK7, and BLK8 and a dummy cell area 120D2 having a height of one block of the edge of the memory cell area 120 may be disposed in an area corresponding to the height of the second row decoder XDEC2, and a dummy cell area 120D2 having a height of three blocks at the edge of the memory cell area 120 and a dummy step area 122D may be disposed in an area corresponding to the height of the first row decoder XDEC1.

Figure 17E:
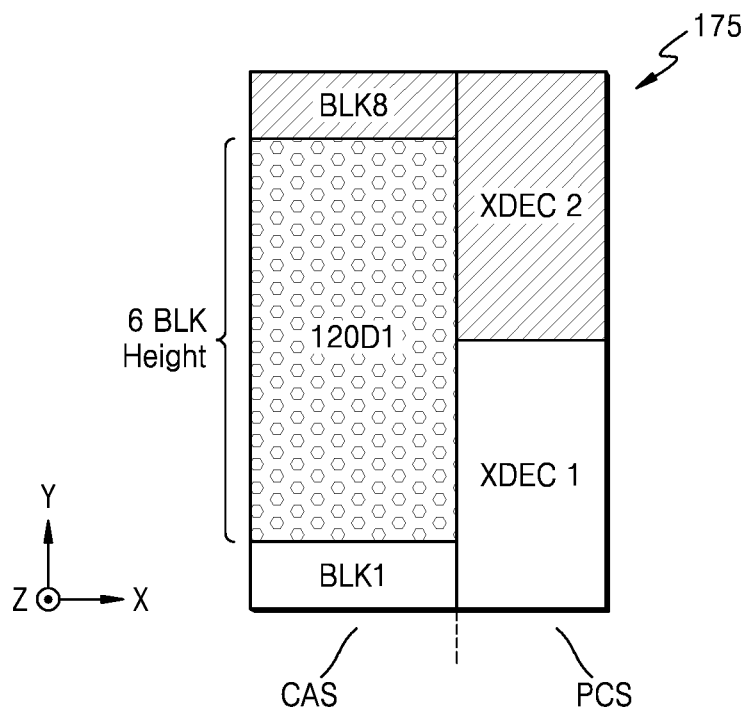

Referring to FIG. 17E, in a row decoder array architecture 175, an eighth memory block BLK8 and a bit line through-electrode area 120D1 having a height of 3 blocks of the memory cell area 120 may be disposed in an area corresponding to the height of the second row decoder XDEC2, and a first memory block BLK1 and a bit line through-electrode area 120D1 having a height of 3 blocks of the memory cell area 120 may be disposed in an area corresponding to the height of the first row decoder XDEC1.

FIGS. 18, 19A to 19J, 20A to 20G, 21A to 21F, 22A to 22E, and 23A to 23G show other examples of the row decoder array architecture of the four-memory block sharing scheme of FIG. 11.

Figure 18:
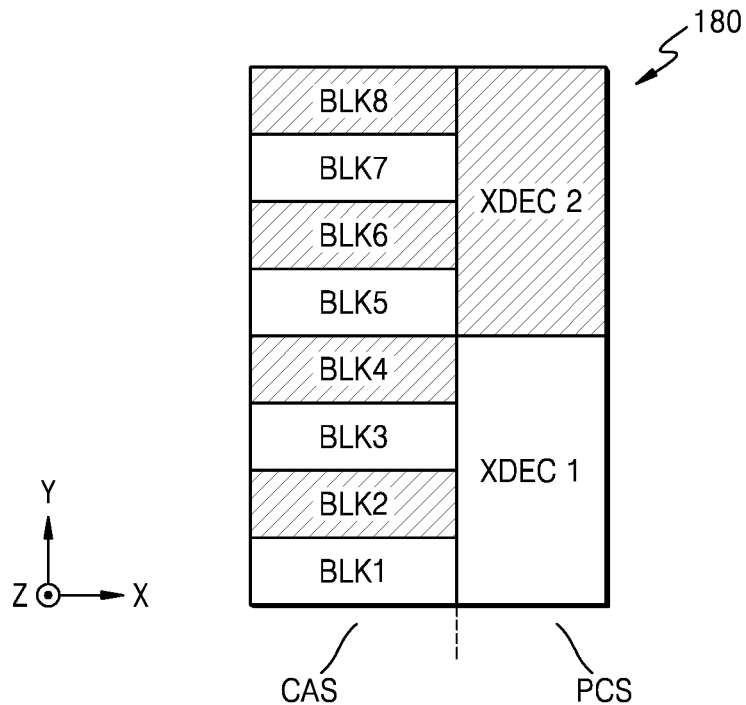
FIGS. 18, 19A to 19J, 20A to 20G, 21A to 21F, 22A to 22E, and 23A to 23G show other examples of the row decoder array architecture of the four-memory block sharing scheme of FIG. 11.

Referring to FIG. 18, in a row decoder array architecture 180, it is shown that the first row decoder XDEC1 is shared by first, third, fifth, and seventh memory blocks BLK1, BLK3, BLK5, and BLK7 spaced apart from each other, and the second row decoder XDEC2 is shared by the second, fourth, sixth, and eighth memory blocks BLK2, BLK4, BLK6, and BLK7 spaced apart from each other, and is arranged to have a height of 4 blocks. Each of the row decoder array architectures shown in FIGS. 19A to 19J, 20A to 20G, 21A to 21F, 22A to 22E, and 23A to 23G may be applied instead of the row decoder array architecture 180 of FIG. 18.

Figure 19A:
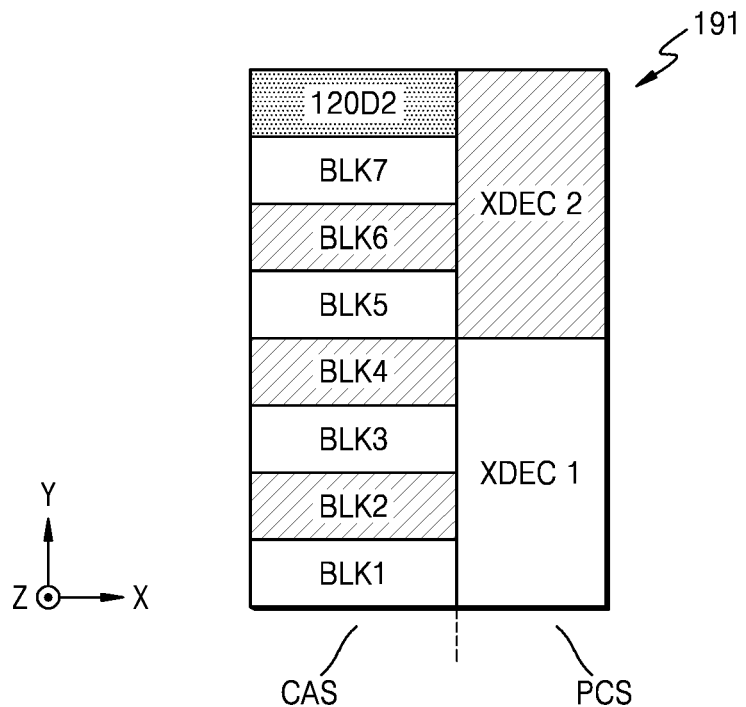

Referring to FIG. 19A, in a row decoder array architecture 191, the fifth, sixth, and seventh memory blocks BLK5, BLK6, and BLK7 and the dummy cell area 120D2 at the edge of the memory cell area 120 may be disposed in an area corresponding to the height of the second row decoder XDEC2.

Figure 19B:
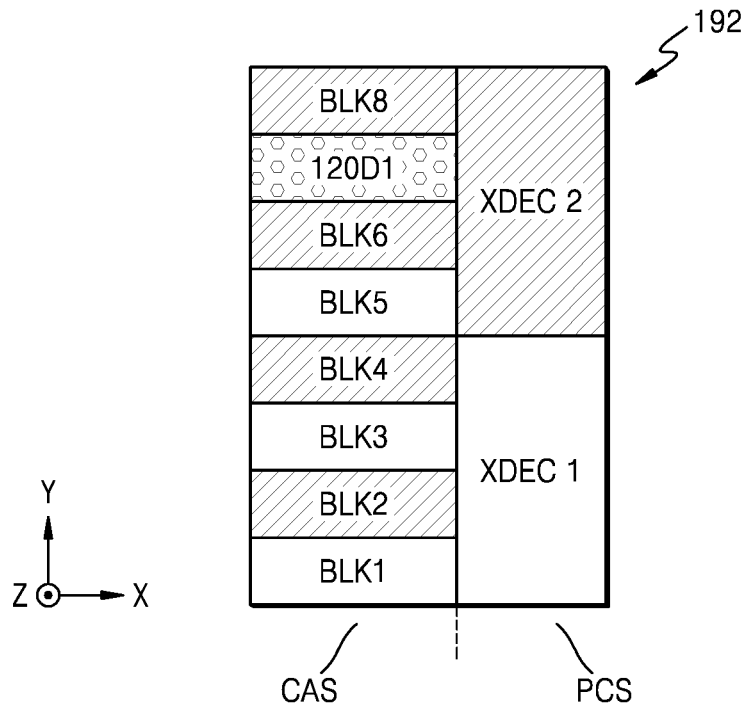

Referring to FIG. 19B, in a row decoder array architecture 192, fifth, sixth, and eighth memory blocks BLK5, BLK6, and BLK8 and a bit line through-electrode area 120D1 of the memory cell area 120 may be disposed in an area corresponding to the height of the second row decoder XDEC2.

Figure 19C:
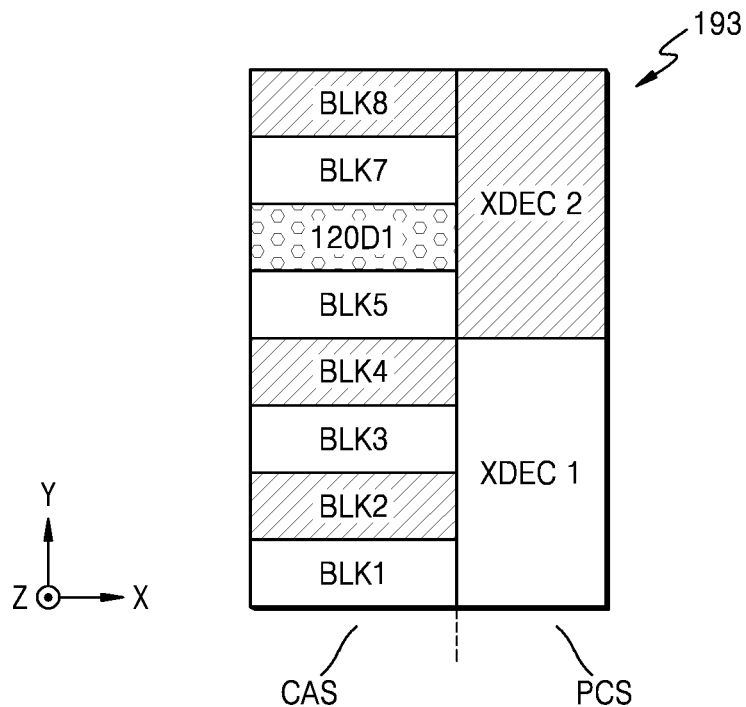

Referring to FIG. 19C, in a row decoder array architecture 193, fifth, seventh, and eighth memory blocks BLK5, BLK7, and BLK8 and a bit line through-electrode area 120D1 of the memory cell area 120 may be disposed in an area corresponding to the height of the second row decoder XDEC2.

Figure 19D:
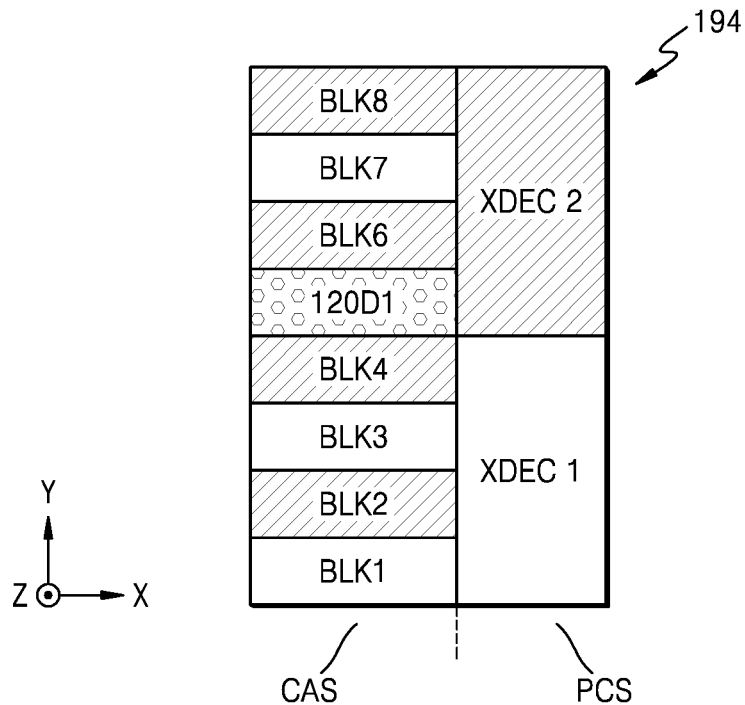

Referring to FIG. 19D, in a row decoder array architecture 194, sixth, seventh, and eighth memory blocks BLK6, BLK7, and BLK8 and a bit line through-electrode area 120D1 of the memory cell area 120 may be disposed in an area corresponding to the height of the second row decoder XDEC2.

Figure 19E:
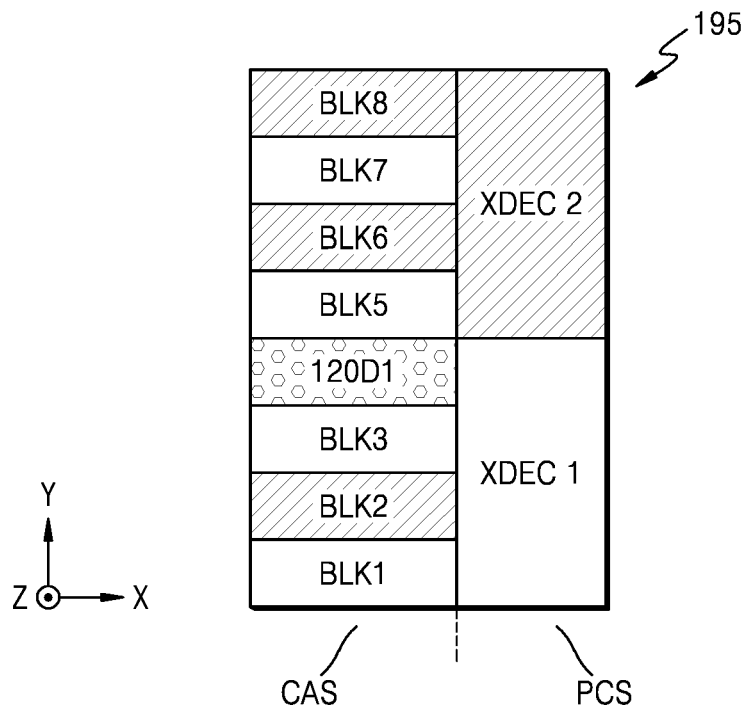

Referring to FIG. 19E, in a row decoder array architecture 195, first, second, and third memory blocks BLK1, BLK2, and BLK3 and a bit line through-electrode area 120D1 of the memory cell area 120 may be disposed in an area corresponding to the height of the first row decoder XDEC1.

Figure 19F:
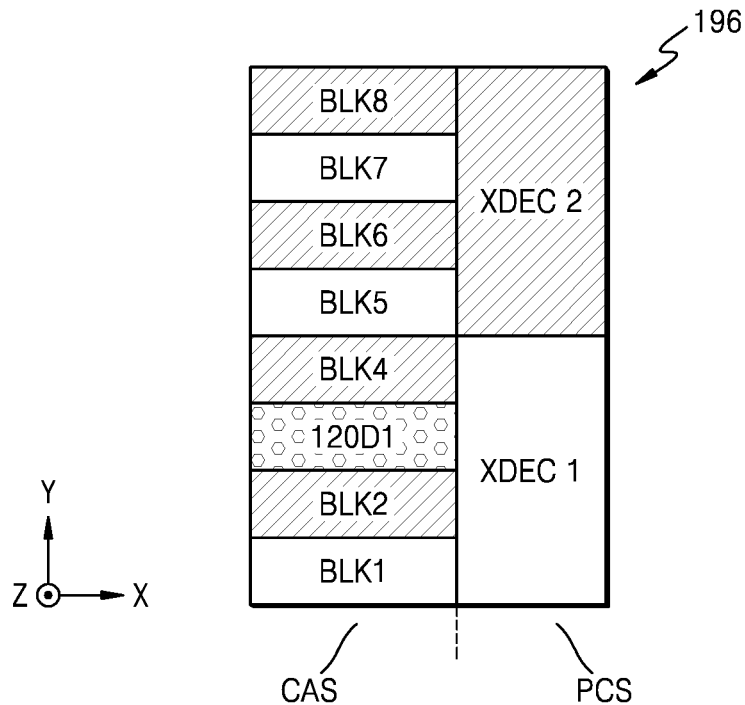

Referring to FIG. 19F, in a row decoder array architecture 196, first, second, and fourth memory blocks BLK1, BLK2, and BLK4 and a bit line through-electrode area 120D1 of the memory cell area 120 may be disposed in an area corresponding to the height of the first row decoder XDEC1.

Figure 19G:
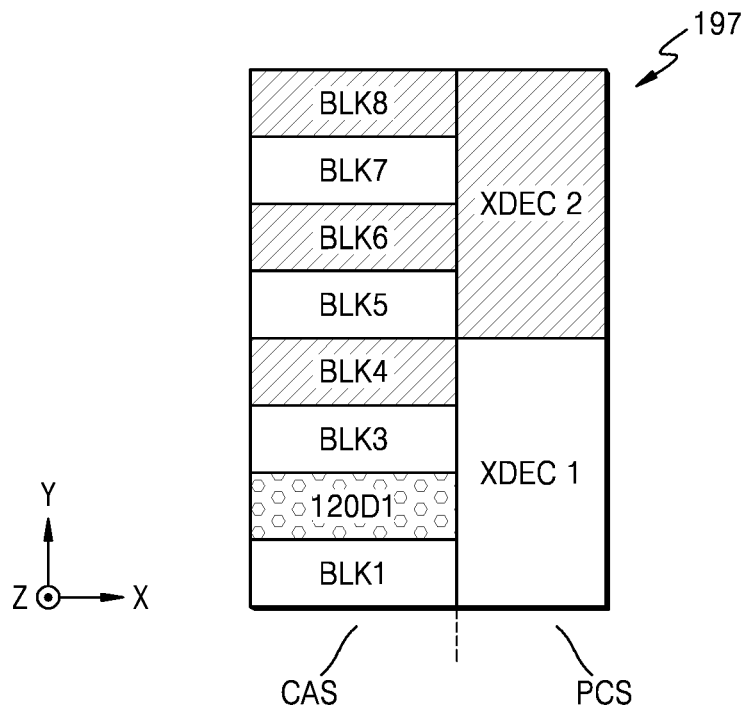

Referring to FIG. 19G, in a row decoder array architecture 197, first, third, and fourth memory blocks BLK1, BLK3, BLK4 and a bit line through-electrode area 120D1 of the memory cell area 120 may be disposed in an area corresponding to the height of the first row decoder XDEC1.

Figure 19H:
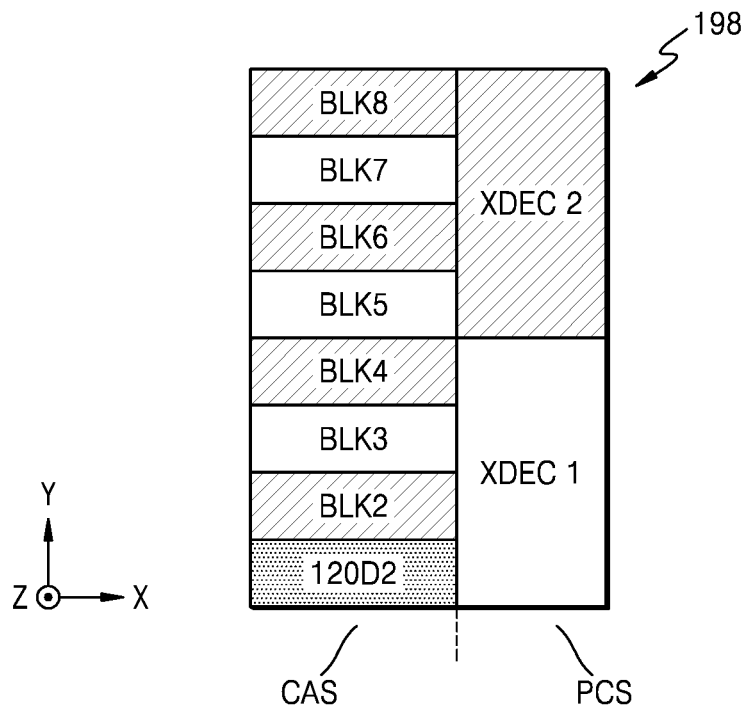

Referring to FIG. 19H, in a row decoder array architecture 198, second, third, and fourth memory blocks BLK2, BLK3, and BLK4 and a dummy cell area 120D2 at the edge of the memory cell area 120 may be disposed in an area corresponding to the height of the first row decoder XDEC1.

Figure 19I:
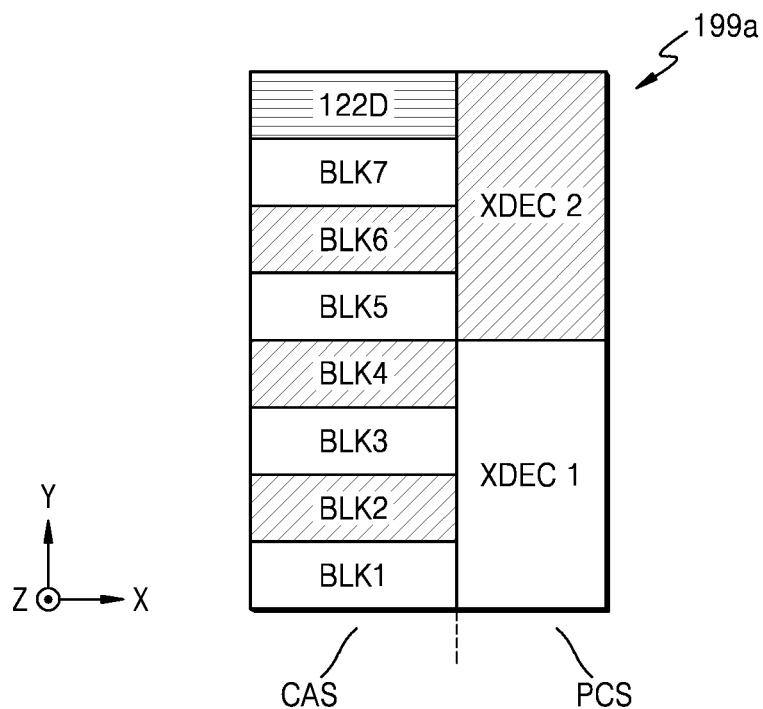

Referring to FIG. 19I, in a row decoder array architecture 199a, fifth, sixth, and seventh memory blocks BLK5, BLK6, and BLK7 and a dummy step area 122D may be disposed in an area corresponding to the height of the second row decoder XDEC2.

Figure 19J:
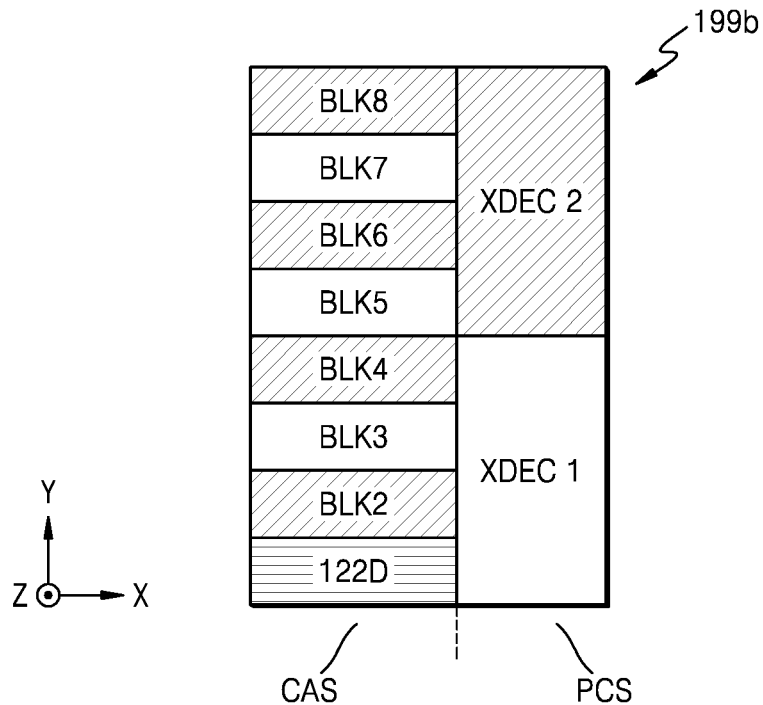

Referring to FIG. 19J, in a row decoder array architecture 199b, second, third, and fourth memory blocks BLK2, BLK3, and BLK4 and a dummy step area 122D may be disposed in an area corresponding to the height of the first row decoder XDEC1.

Figure 20A:
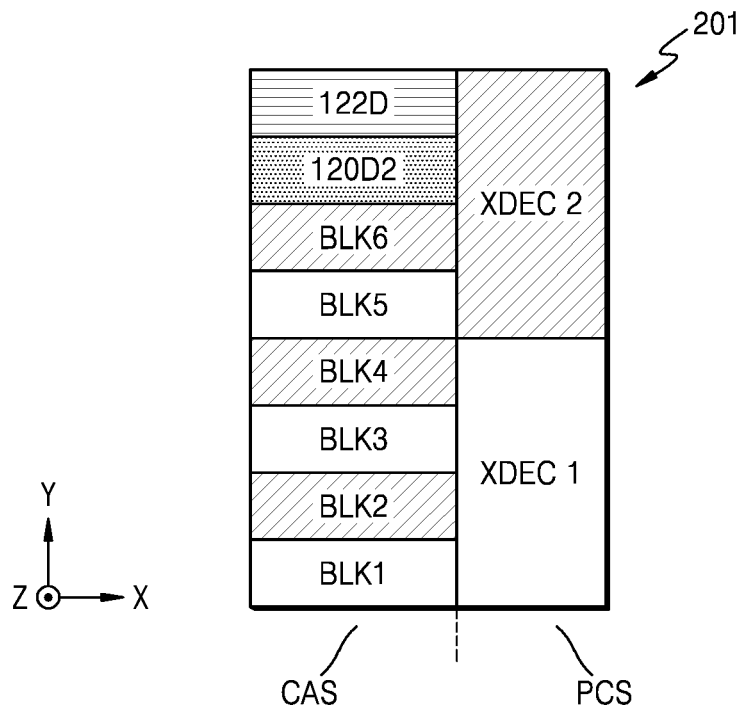

Referring to FIG. 20A, in a row decoder array architecture 201, fifth and sixth memory blocks BLK5 and BLK6, a dummy cell area 120D2 of an edge of the memory cell area 120, and a dummy step area 122D may be disposed in an area corresponding to the height of the second row decoder XDEC2.

Figure 20B:
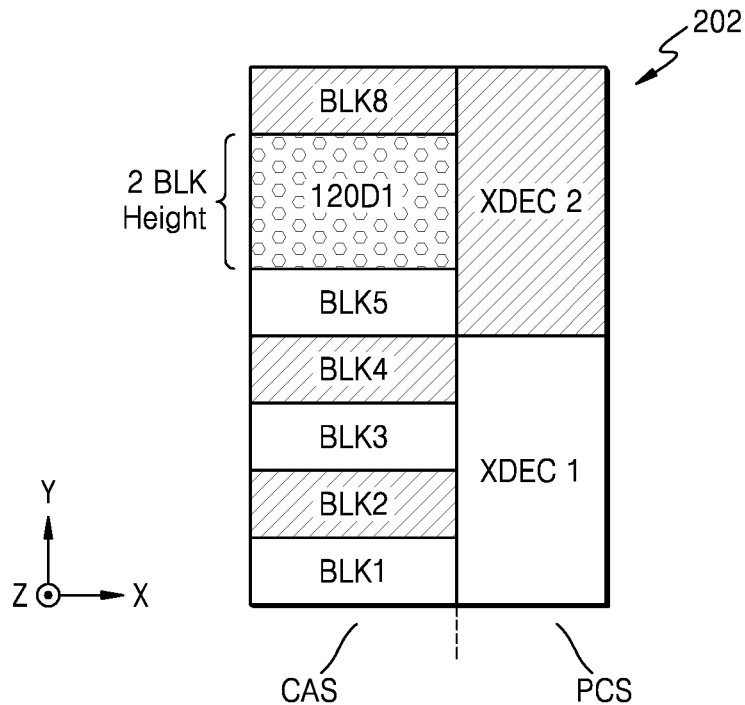

Referring to FIG. 20B, in a row decoder array architecture 202, fifth and eighth memory blocks BLK5 and BLK8 and a bit line through-electrode area 120D1 having a height of 2 blocks of the memory cell area 120 may be disposed in an area corresponding to the height of the second row decoder XDEC2.

Figure 20C:
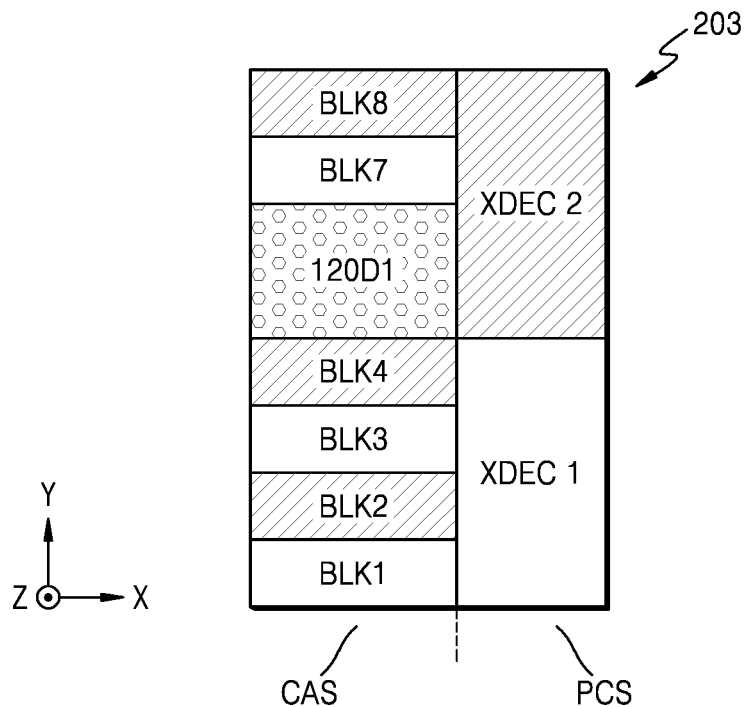

Referring to FIG. 20C, in a row decoder array architecture 203, seventh and eighth memory blocks BLK7 and BLK8 and a bit line through-electrode area 120D1 having a height of two blocks of the memory cell area 120 may be disposed in an area corresponding to the height of the second row decoder XDEC2.

Figure 20D:
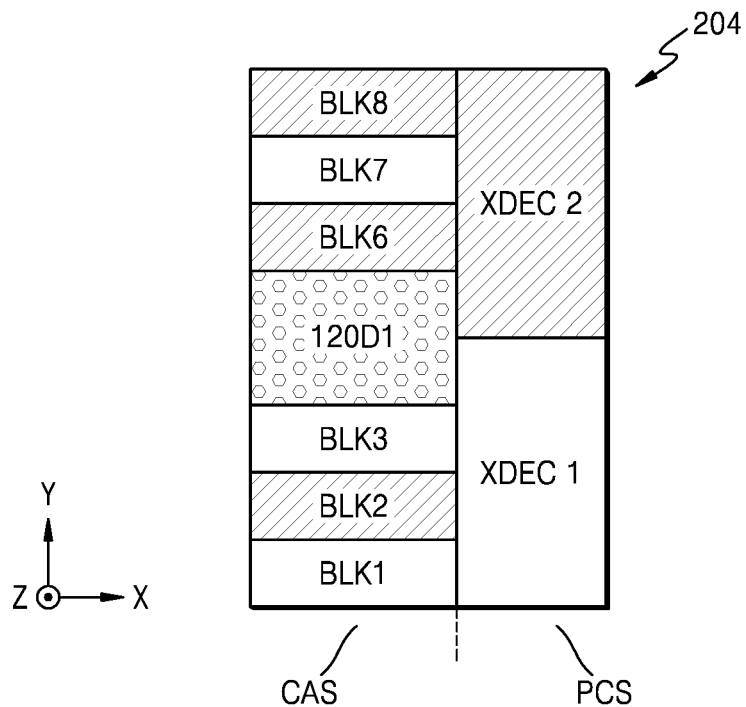

Referring to FIG. 20D, in a row decoder array architecture 204, sixth, seventh, and eighth memory blocks BLK6, BLK7, and BLK8 and a bit line through-electrode area 120D1 having a height of one block in the memory cell area 120 may be disposed in an area corresponding to the height of the second row decoder XDEC2, and first, second, and third memory blocks BLK1, BLK2, and BLK3 and a bit line through-electrode area 120D1 having a height of one block of the memory cell area 120 may be disposed in an area corresponding to the height of the first row decoder XDEC1.

Figure 20E:
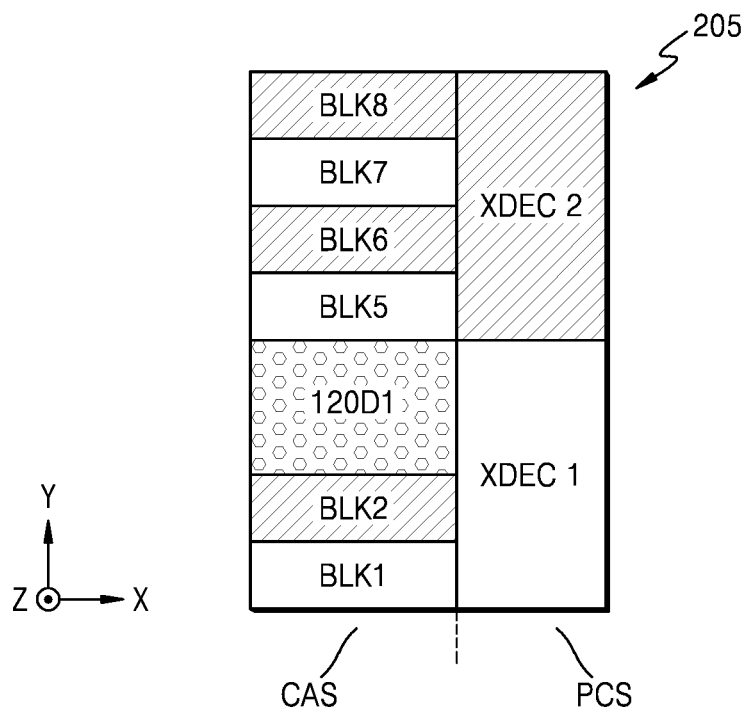

Referring to FIG. 20E, in a row decoder array architecture 205, first and second memory blocks BLK1 and BLK2 and a bit line through-electrode area 120D1 having a height of two blocks of the memory cell area 120 may be disposed in an area corresponding to the height of the first row decoder XDEC1.

Figure 20F:
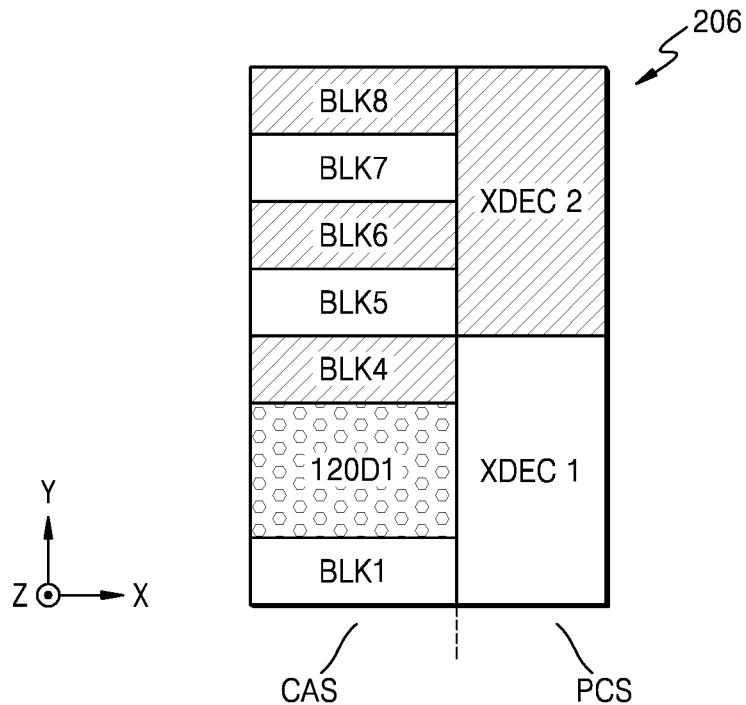

Referring to FIG. 20F, in a row decoder array architecture 206, first and fourth memory blocks BLK1 and BLK4 and a bit line through-electrode area 120D1 having a height of two blocks of the memory cell area 120 may be disposed in an area corresponding to the height of the first row decoder XDEC1.

Figure 20G:
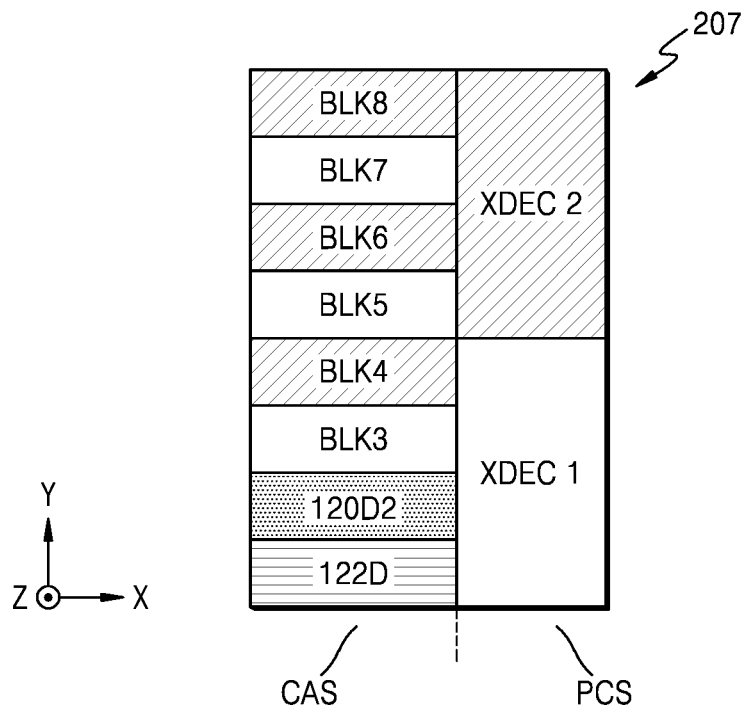

Referring to FIG. 20G, in a row decoder array architecture 207, third and fourth memory blocks BLK1 and BLK4, a dummy cell area 120D2 of an edge of the memory cell area 120, and a dummy step area 122D may be disposed in an area corresponding to the height of the first row decoder XDEC1.

Figure 21A:
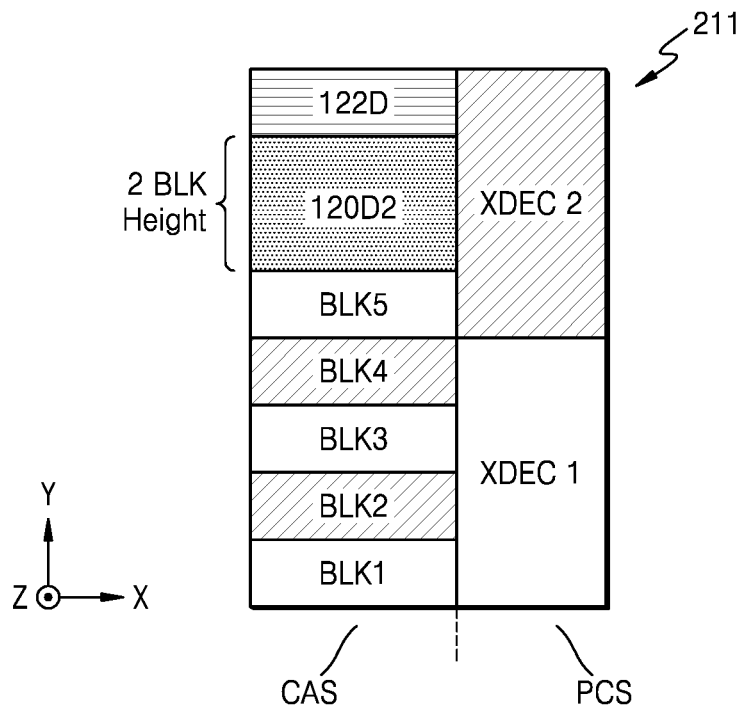

Referring to FIG. 21A, in a row decoder array architecture 211, a fifth memory block BLK5, a dummy cell area 120D2 having a height of two blocks of the edge of the memory cell area 120, and a dummy step area 122D may be disposed in an area corresponding to the height of the second row decoder XDEC2.

Figure 21B:
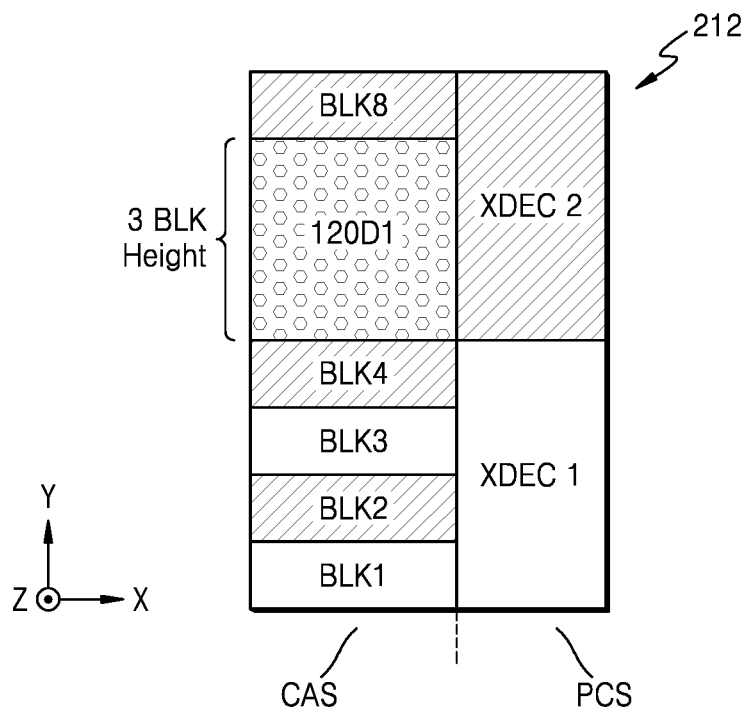

Referring to FIG. 21B, in a row decoder array architecture 212, an eighth memory block BLK8 and a bit line through-electrode area 120D1 having a height of 3 blocks of the memory cell area 120 may be disposed in an area corresponding to the height of the second row decoder XDEC2.

Figure 21C:
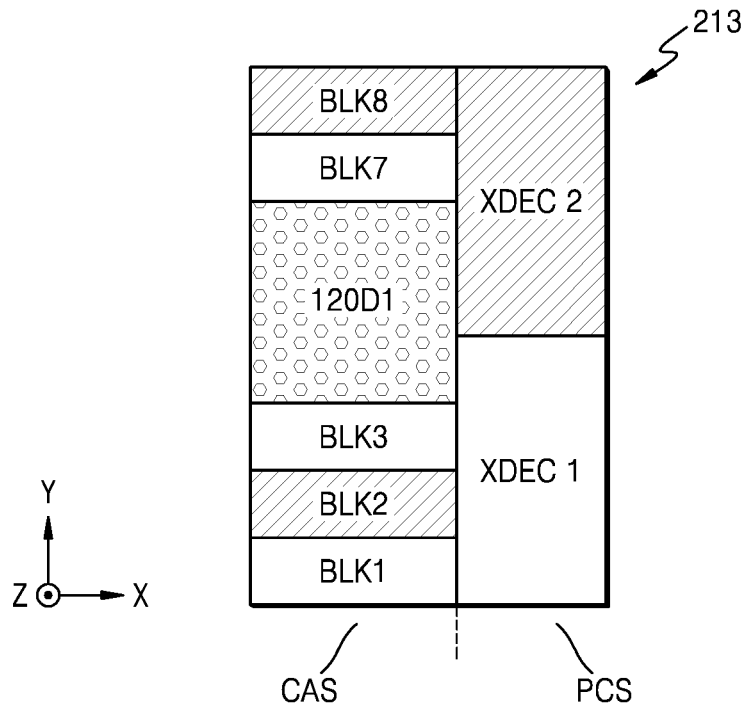

Referring to FIG. 21C, in a row decoder array architecture 213, seventh and eighth memory blocks BLK7 and BLK8 and a bit line through-electrode area 120D1 having a height of two blocks of the memory cell area 120 may be disposed in an area corresponding to the height of the second row decoder XDEC2, and first, second, and third memory blocks BLK1, BLK2, and BLK3 and a bit line through-electrode area 120D1 having a height of one block of the memory cell area 120 may be disposed in an area corresponding to the height of the first row decoder XDEC1.

Figure 21D:
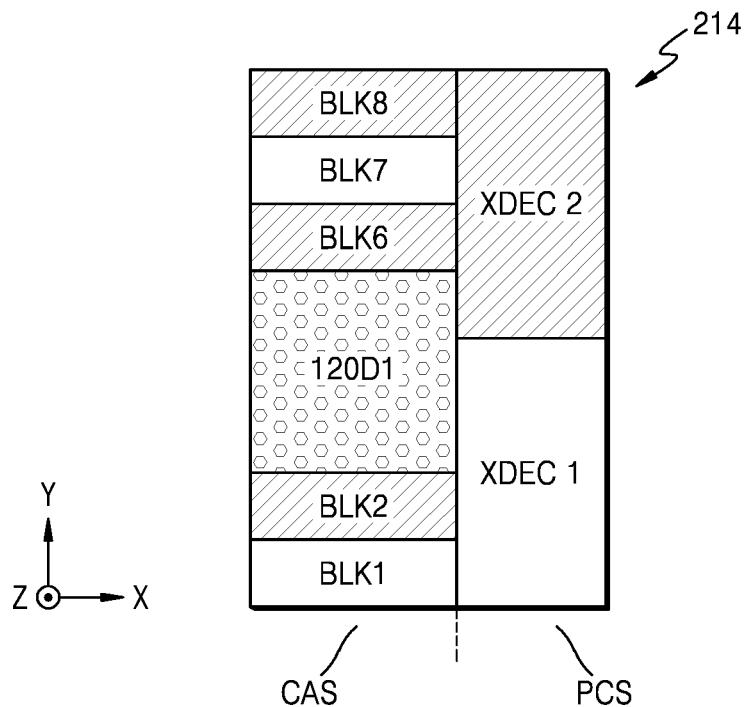

Referring to FIG. 21D, in a row decoder array architecture 214, sixth, seventh, and eighth memory blocks BLK6, BLK7, and BLK8 and the bit line through-electrode area 120D1 having a height of one block in the memory cell area 120 may be disposed in an area corresponding to the height of the second row decoder XDEC2, and first and second memory blocks BLK1 and BLK2 and a bit line through-electrode area 120D1 having a height of two blocks of the memory cell area 120 may be disposed in an area corresponding to the height of the first row decoder XDEC1.

Figure 21E:
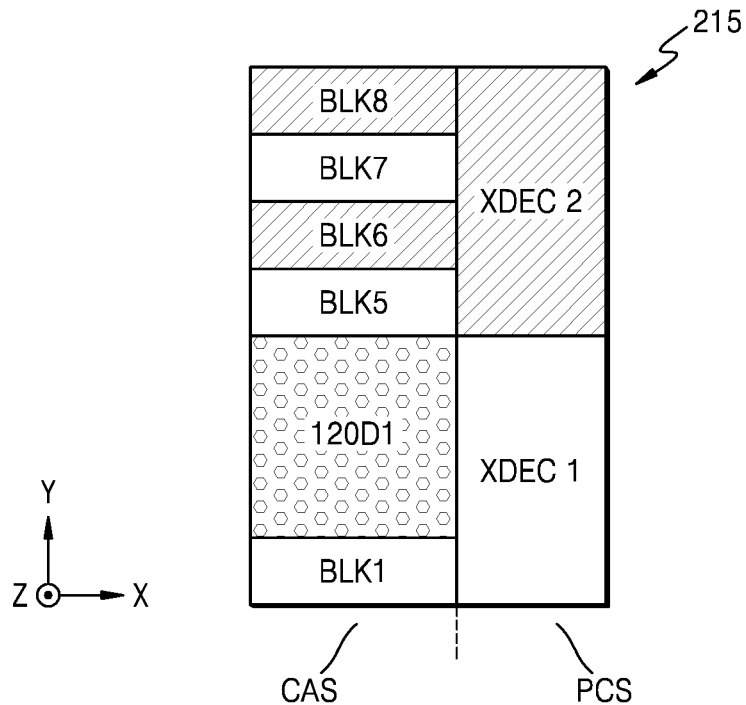

Referring to FIG. 21E, in a row decoder array architecture 215, a first memory block BLK1 and a bit line through-electrode area 120D1 having a height of 3 blocks of the memory cell area 120 may be disposed in an area corresponding to the height of the first row decoder XDEC1.

Figure 21F:
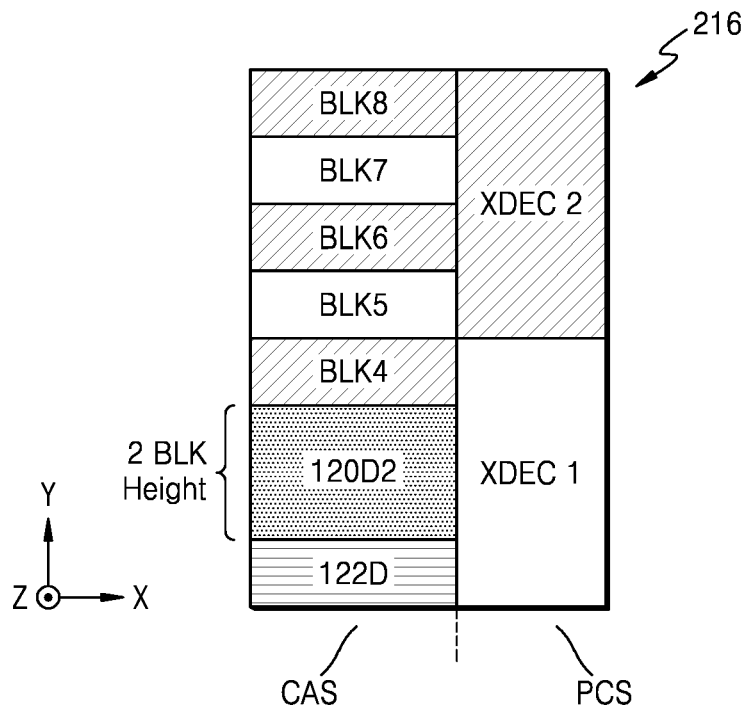

Referring to FIG. 21F, in a row decoder array architecture 216, a fourth memory block BLK4, a dummy cell area 120D2, and a dummy step area 122D having a height of 2 blocks at the edge of the memory cell area 120 may be disposed in an area corresponding to the height of the first row decoder XDEC1.

Figure 22A:
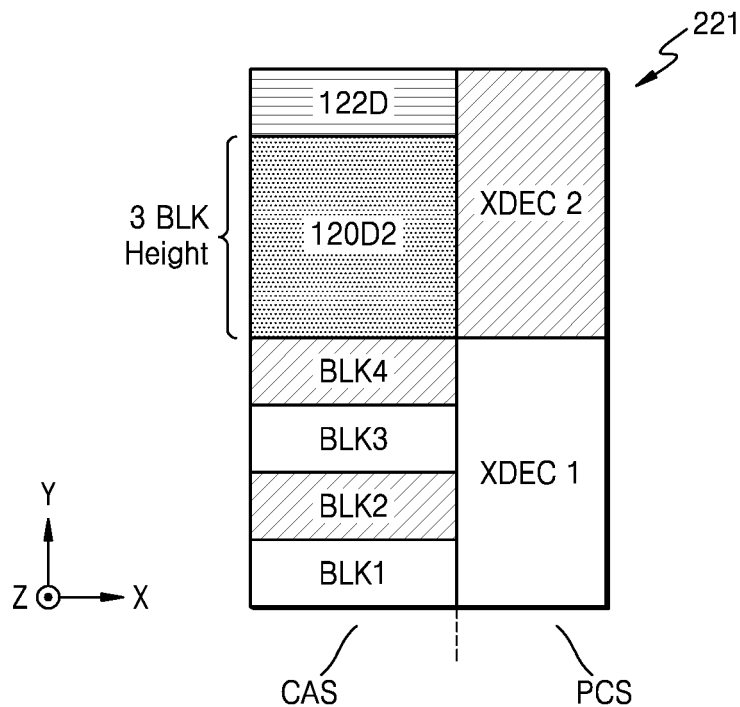

Referring to FIG. 22A, in a row decoder array architecture 221, a dummy cell area 120D2 having a height of three blocks at the edge of the memory cell area 120, and a dummy step area 122D may be disposed in an area corresponding to the height of the second row decoder XDEC2.

Figure 22B:
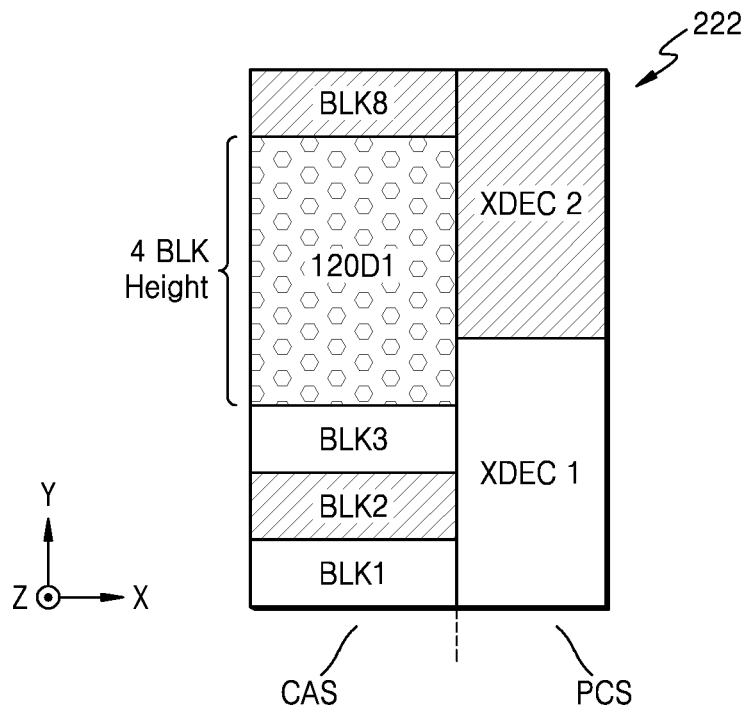

Referring to FIG. 22B, in a row decoder array architecture 222, an eighth memory block BLK8 and a bit line through-electrode area 120D1 having a height of 3 blocks of the memory cell area 120 may be disposed in an area corresponding to the height of the second row decoder XDEC2, and first, second, and third memory blocks BLK1, BLK2, and BLK3 and a bit line through-electrode area 120D1 having a height of one block of the memory cell area 120 may be disposed in an area corresponding to the height of the first row decoder XDEC1.

Figure 22C:
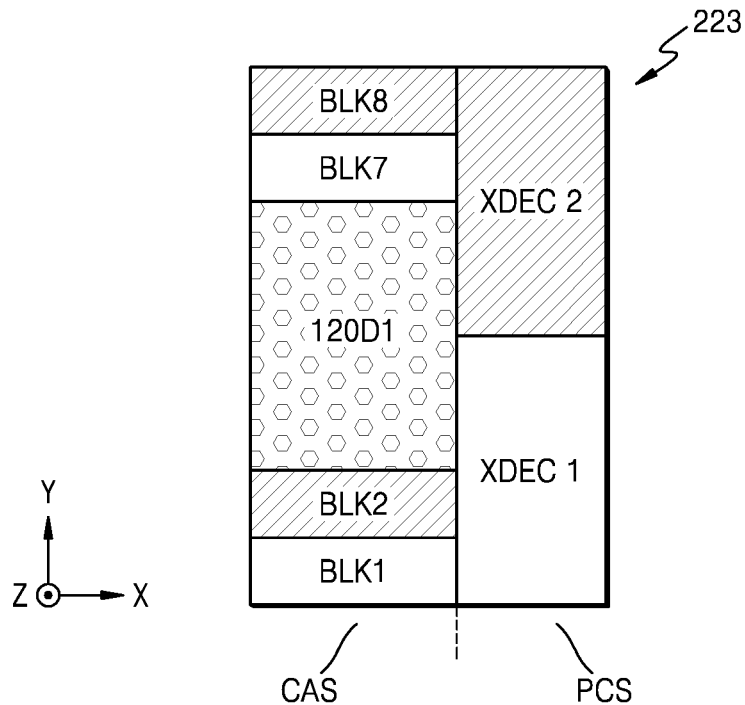

Referring to FIG. 22C, in a row decoder array architecture 223, seventh and eighth memory blocks BLK7 and BLK8 and a bit line through-electrode area 120D1 having a height of two blocks of the memory cell area 120 may be disposed in an area corresponding to the height of the second row decoder XDEC2, and first and second memory blocks BLK1 and BLK2 and a bit line through-electrode area 120D1 having a height of two blocks of the memory cell area 120 may be disposed in an area corresponding to the height of the first row decoder XDEC1.

Figure 22D:
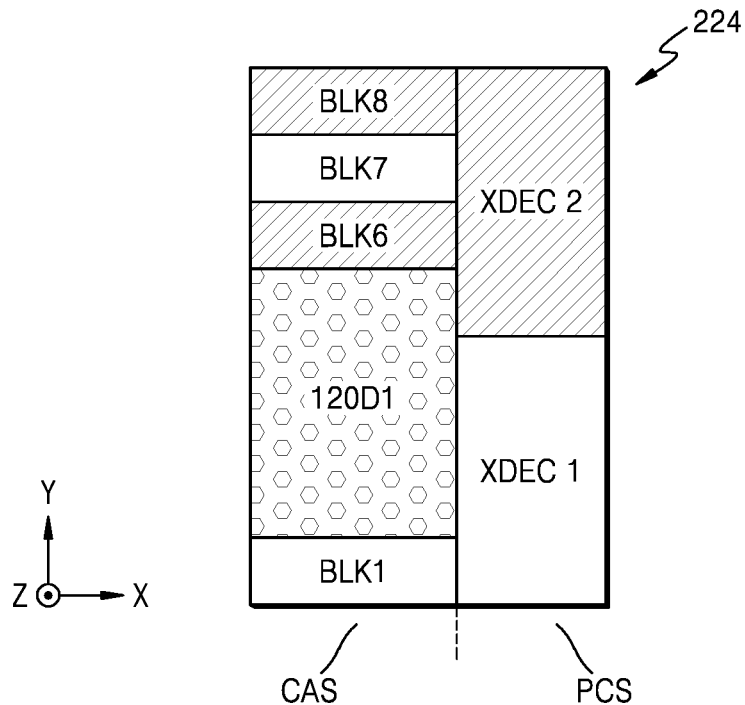

Referring to FIG. 22D, in a row decoder array architecture 224, sixth, seventh, and eighth memory blocks BLK6, BLK7, and BLK8 and a bit line through electrode area 120D1 having a height of one block in the memory cell area 120 may be disposed in an area corresponding to the height of the second row decoder XDEC2, and a first memory block BLK1 and a bit line through-electrode area 120D1 having a height of 3 blocks of the memory cell area 120 may be disposed in an area corresponding to the height of the first row decoder XDEC1.

Figure 22E:
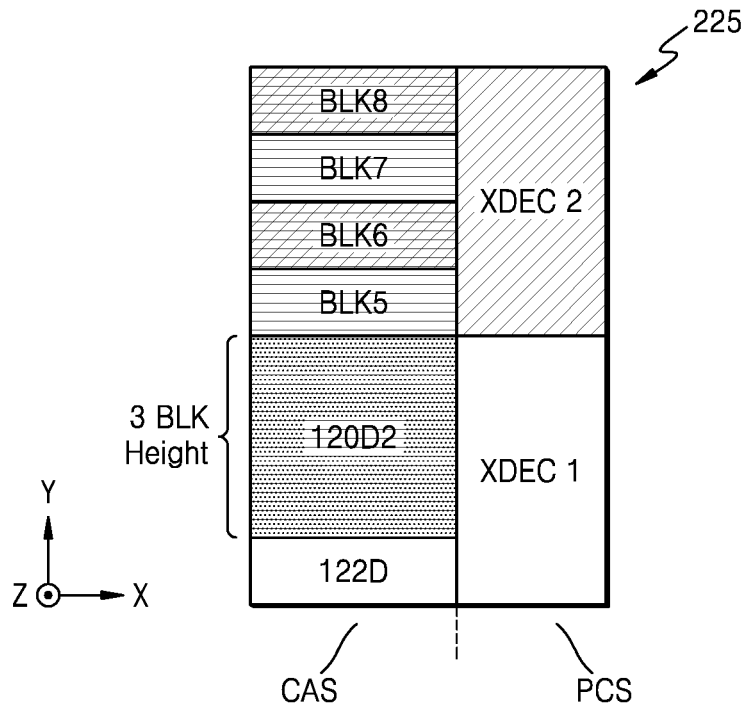

Referring to FIG. 22E, in a row decoder array architecture 225, a dummy cell area 120D2 and a dummy step area 122D having a height of three blocks at the edge of the memory cell area 120 may be disposed in an area corresponding to the height of the first row decoder XDEC1.

Figure 23A:
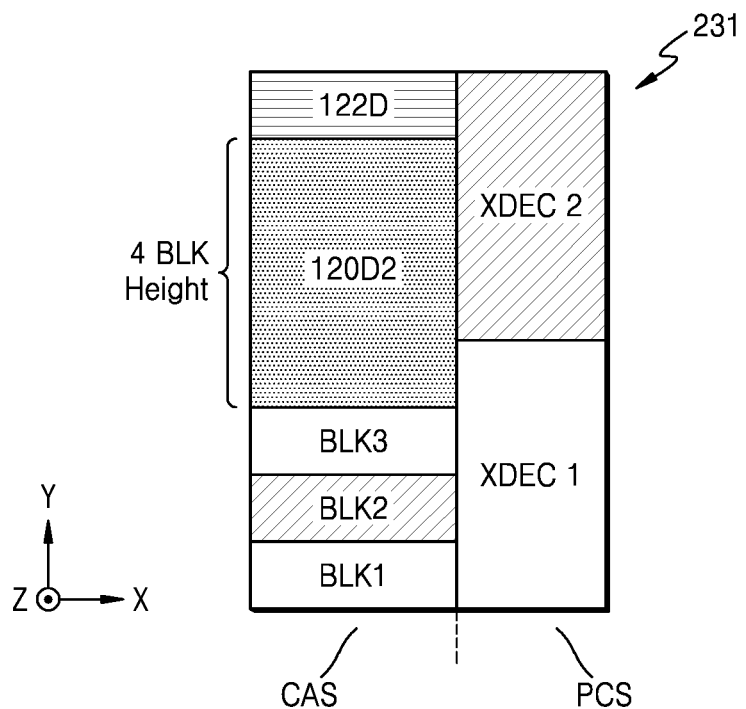

Referring to FIG. 23A, in a row decoder array architecture 231, a dummy cell area 120D2 having a height of three blocks at the edge of the memory cell area 120, and a dummy step area 122D may be disposed in an area corresponding to the height of the second row decoder XDEC2, and first, second, and third memory blocks BLK1, BLK2, and BLK3 and a bit line through-electrode area 120D1 having a height of one block of the memory cell area 120 may be disposed in an area corresponding to the height of the first decoder XDEC1.

Figure 23B:
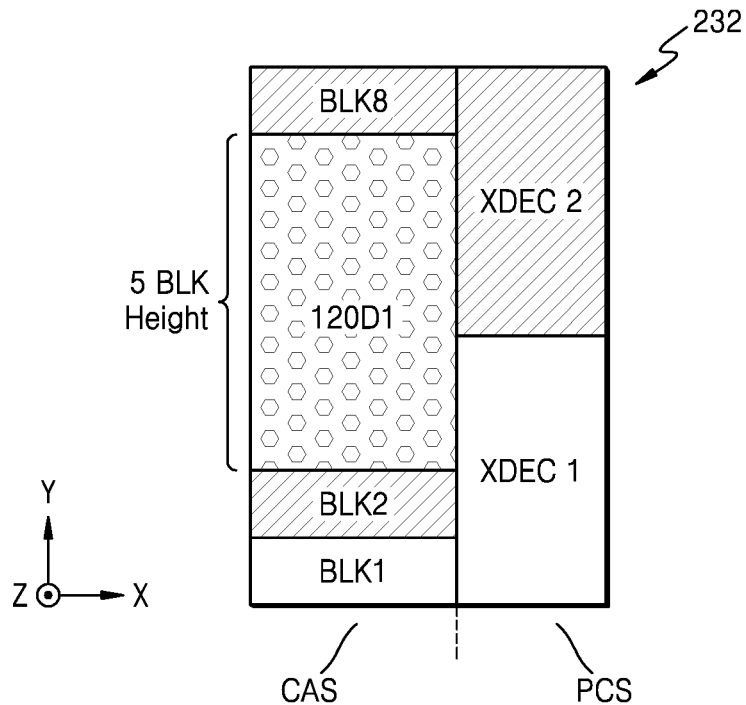

Referring to FIG. 23B, in a row decoder array architecture 232, an eighth memory block BLK8 and a bit line through-electrode area 120D1 having a height of 3 blocks of the memory cell area 120 may be disposed in an area corresponding to the height of the second row decoder XDEC2, and first and second memory blocks BLK1 and BLK2 and a bit line through-electrode area 120D1 having a height of two blocks of the memory cell area 120 may be disposed in an area corresponding to the height of the first decoder XDEC1.

Figure 23C:
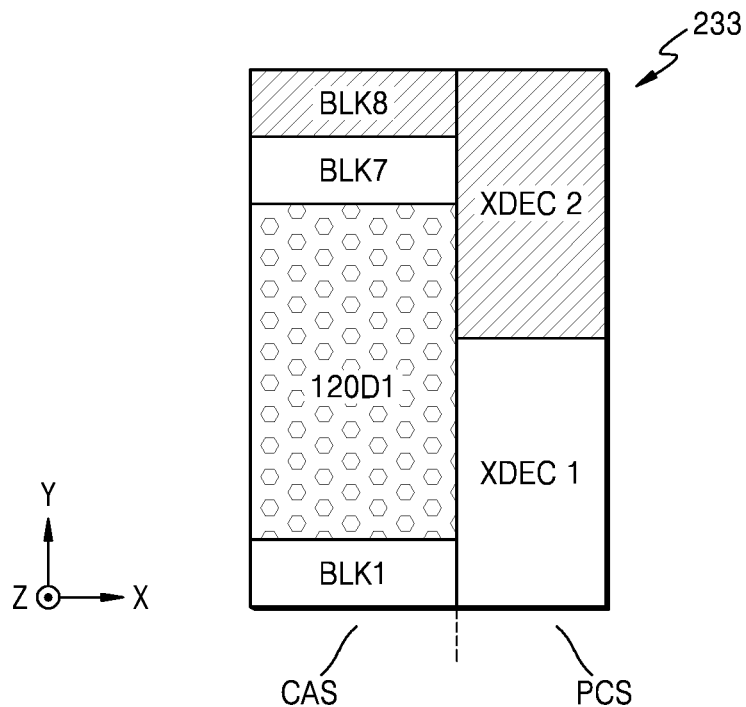

Referring to FIG. 23C, in a row decoder array architecture 233, a seventh and eighth memory blocks BLK7 and BLK8 and a bit line through-electrode area 120D1 having a height of two blocks of the memory cell area 120 may be disposed in an area corresponding to the height of the second row decoder XDEC2, and a first memory block BLK1 and a bit line through-electrode area 120D1 having a height of 3 blocks of the memory cell area 120 may be disposed in an area corresponding to the height of the first decoder XDEC1.

Figure 23D:
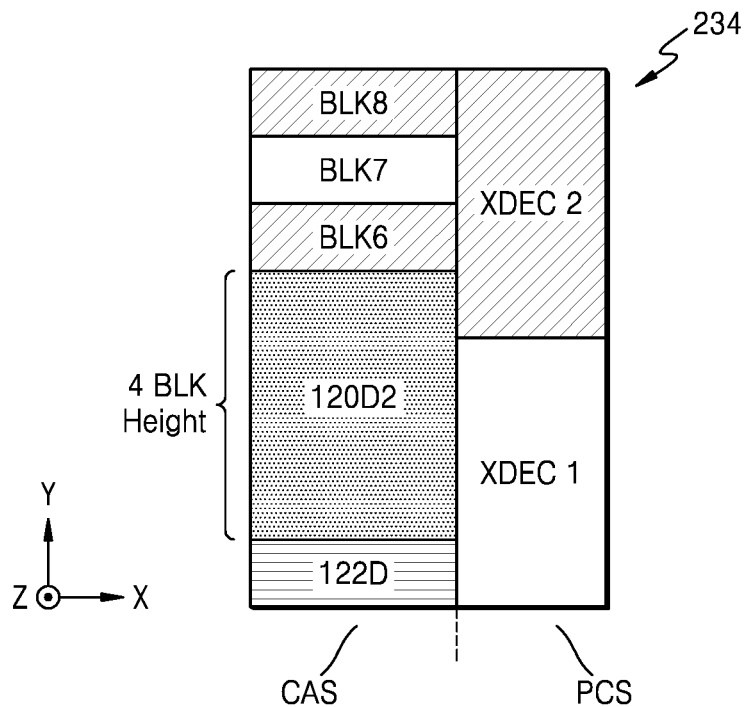

Referring to FIG. 23D, in a row decoder array architecture 234, sixth, seventh, and eighth memory blocks BLK6, BLK7, and BLK8 and a dummy cell area 120D2 having a height of one block at the edge of the memory cell area 120 may be disposed in an area corresponding to the height of the second row decoder XDEC2, and a dummy cell area 120D2 having a height of three blocks at the edge of the memory cell area 120 and a dummy step area 122D may be disposed in an area corresponding to the height of the first decoder XDEC1.

Figure 23E:
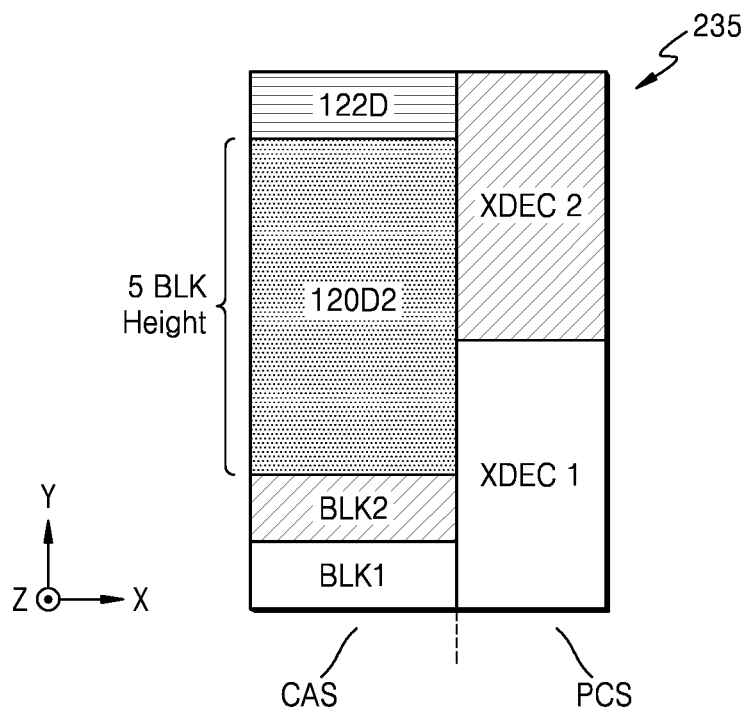

Referring to FIG. 23E, in a row decoder array architecture 235, a dummy cell area 120D2 having a height of three blocks at the edge of the memory cell area 120 and a dummy step area 122D may be disposed in an area corresponding to the height of the second row decoder XDEC2, and first and second memory blocks BLK1 and BLK2 and a dummy cell area 120D2 having a height of two blocks of the memory cell area 120 may be disposed in an area corresponding to the height of the first decoder XDEC1.

Figure 23F:
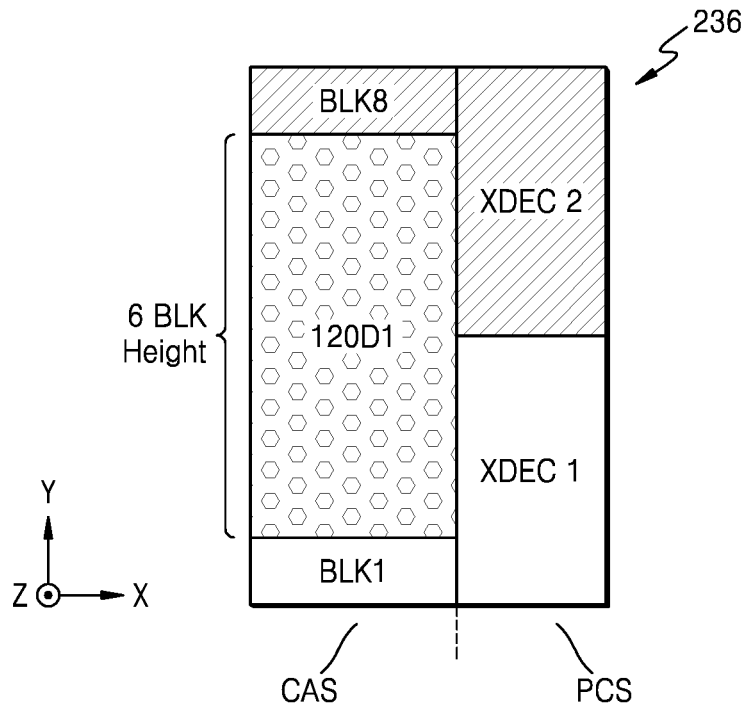

Referring to FIG. 23F, in a row decoder array architecture 236, an eighth memory block BLK8 and a bit line through-electrode area 120D1 having a height of 3 blocks of the memory cell area 120 may be disposed in an area corresponding to the height of the second row decoder XDEC2, and a first memory block BLK1 and a bit line through-electrode area 120D1 having a height of 3 blocks of the memory cell area 120 may be disposed in an area corresponding to the height of the first decoder XDEC1.

Figure 23G:
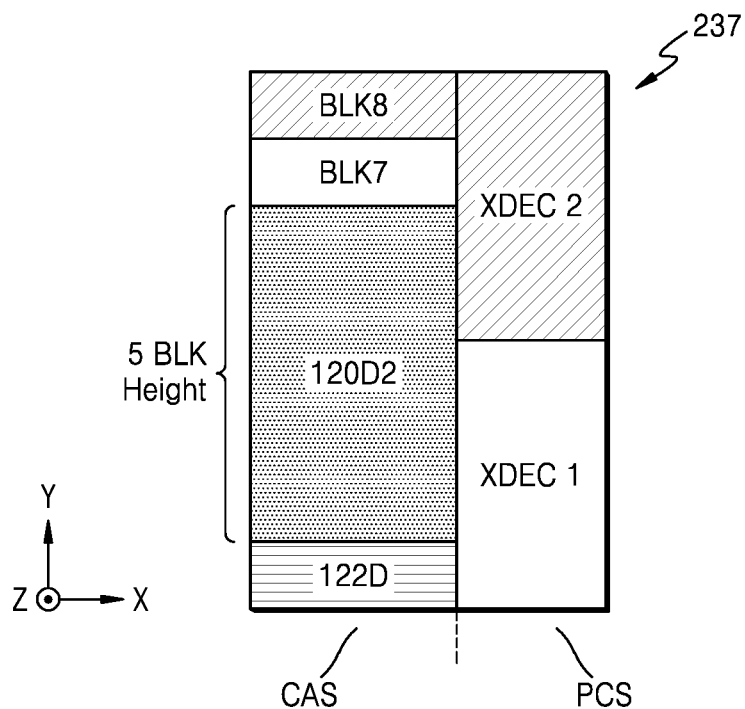

Referring to FIG. 23G, in a row decoder array architecture 237, seventh and eighth memory blocks BLK7 and BLK8 and a dummy cell area 120D2 having a height of two blocks at the edge of the memory cell area 120 may be disposed in an area corresponding to the height of the second row decoder XDEC2, and a dummy cell area 120D2 having a height of three blocks at the edge of the memory cell area 120 and a dummy step area 122D may be disposed in an area corresponding to the height of the first decoder XDEC1.

Figure 24:
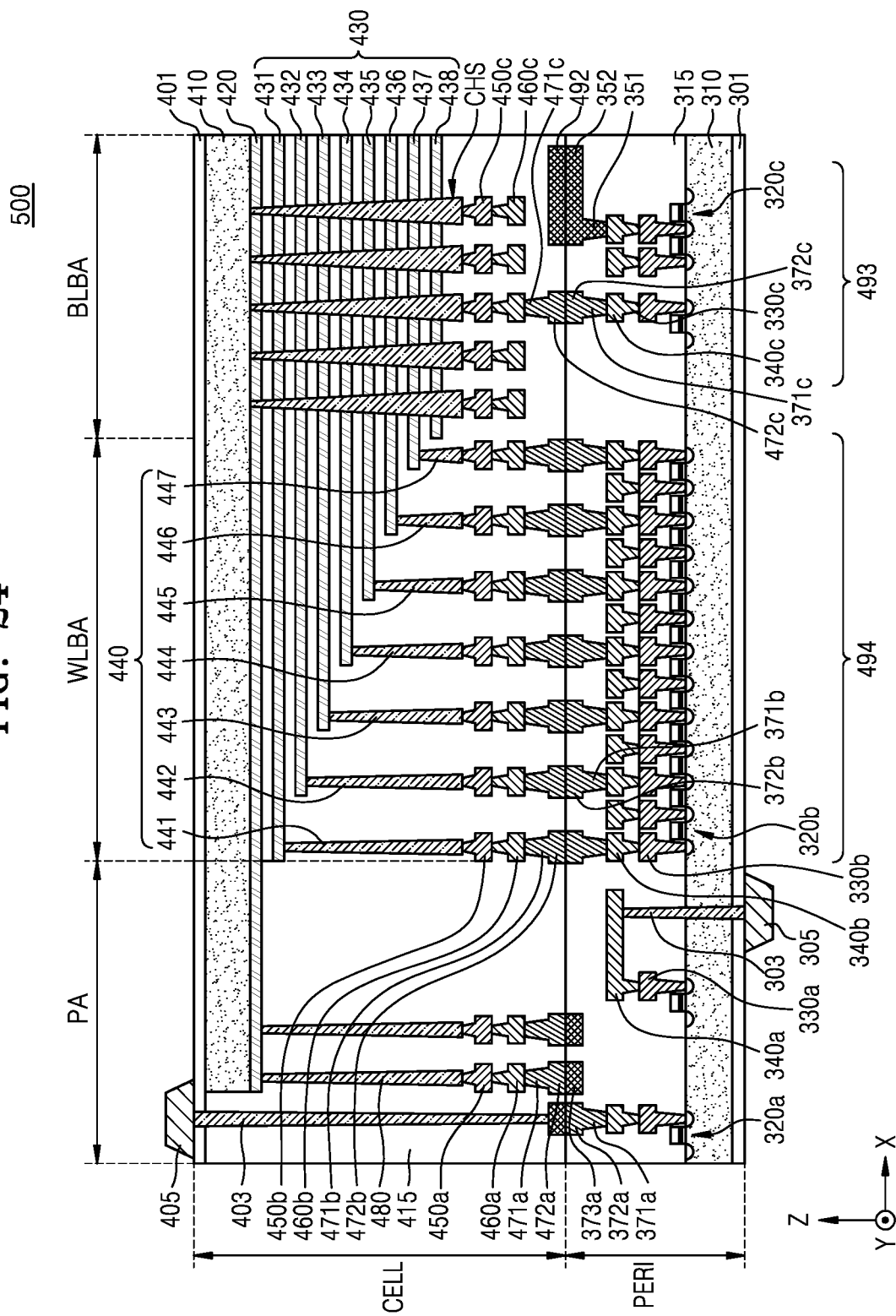
FIG. 24 is a cross-sectional view illustrating a memory device according to an embodiment of the inventive concept.

FIG. 24 is a cross-sectional view illustrating a memory device 500 according to embodiments of the inventive concept.

Referring to FIG. 24, the memory device 500 may have a C2C structure. The embodiments illustrated in FIGS. 1 to 23G may be implemented similar to the memory device 500. That is, the pass transistor circuit described above with reference to FIGS. 1 to 23G may be disposed in the peripheral circuit area (PERI). Each of the peripheral circuit area and the cell area (CELL) of the memory device 500 may include an external pad bonding area PA, a word line bonding area WLBA, and a bit line bonding area BLBA. The peripheral circuit area may include a first substrate 310, an interlayer insulating layer 315, circuit elements 320a, 320b, and 320c formed on the first substrate 310, first metal layers 330a, 330b, and 330c respectively connected to the circuit elements 320a, 320b, and 320c, and second metal layers 340a, 340b, 340c formed on the first metal layers 330a, 330b, 330c. In some embodiments, the first metal layers 330a, 330b, and 330c may be formed of tungsten having a relatively high resistance, and the second metal layers 340a, 340b and 340c may be formed of copper having a relatively low resistance.

Here, only the first metal layers 330a, 330b, and 330c and the second metal layers 340a, 340b, and 340c are shown and described, but the inventive concept is not limited thereto, and at least one metal layer may be further formed on the second metal layers 340a, 340b, and 340c. At least some of the one or more metal layers formed on the second metal layers 340a, 340b, and 340c may be formed of aluminum or the like having a lower resistance than copper forming the second metal layers 340a, 340b, and 340c.

The interlayer insulating layer 315 may be disposed on the first substrate 310 to cover the plurality of circuit elements 320a, 320b, and 320c, the first metal layers 330a, 330b, and 330c, and the second metal layers 340a, 340b, and 340c, and may include or may be formed of an insulating material such as silicon oxide, silicon nitride, or the like.

Lower bonding metals 371b and 372b may be formed on the second metal layer 340b in the word line bonding area WLBA. In the word line bonding area WLBA, the lower bonding metals 371b and 372b of the peripheral circuit area may be electrically connected with each other by a bonding method with the upper bonding metals 471b and 472b of the cell area, and the lower bonding metals 371b and 372b and the upper bonding metals 471b and 472b may be formed of aluminum, copper, or tungsten. The upper bonding metals 471b and 472b of the cell area may be referred to as first metal pads, and the lower bonding metals 371b and 372b of the peripheral circuit area may be referred to as second metal pads.

The cell area may provide at least one memory block. The cell area may include a second substrate 410 and a common source line 420. On the second substrate 410, word lines 431 to 438 (i.e., 430) may be stacked along a direction VD perpendicular to the upper surface of the second substrate 410. String selection lines and ground selection lines may be disposed on each of the upper and lower portions of the word lines 430, and the word lines 430 may be disposed between the string selection lines and the ground selection line.

In the bit line bonding area BLBA, the channel structure CHS may extend in a direction perpendicular to the upper surface of the second substrate 410 to pass through the word lines 430, the string selection lines, and the ground selection lines. The channel structure CHS may include a data storage layer, a channel layer, and a buried insulating layer, and the channel layer may be electrically connected to the first metal layer 450c and the second metal layer 460c. For example, the first metal layer 450c may be a bit line contact, and the second metal layer 460c may be a bit line. In an embodiment, the bit line 460c may extend in a first horizontal direction HD1 parallel to the upper surface of the second substrate 410.

In the embodiment illustrated in FIG. 24, an area where the channel structure CHS and the bit line 460c are disposed may be defined as the bit line bonding area BLBA. The bit line 460c may be electrically connected to the circuit elements 320c providing the page buffer 493 in the peripheral circuit area in the bit line bonding area BLBA. As an example, the bit line 460c is connected to the upper bonding metals 471c and 472c in the peripheral circuit area, and the upper bonding metals 471c and 472c may be connected to the lower bonding metals 371c and 372c connected to the circuit elements 320c of the page buffer 493.

In the word line bonding area WLBA, the word lines 430 may extend along a second horizontal direction HD2 parallel to the upper surface of the second substrate 410, and may be connected to a plurality of cell contact plugs 441 to 447 (i.e., 440). The word lines 430 and the cell contact plugs 440 may be connected with each other by pads provided by extending at least some of the word lines 430 to different lengths along the second horizontal direction. The first metal layer 450b and the second metal layer 460b may be sequentially connected to the upper portions of the cell contact plugs 440 connected to the word lines 430. The cell contact plugs 440 may be connected to the peripheral circuit area through the upper bonding metals 471b and 472b of the cell area and the lower bonding metals 371b and 372b of the peripheral circuit area in the word line bonding area WLBA.

The cell contact plugs 440 may be electrically connected to the circuit elements 320b providing the row decoder 494 in the peripheral circuit area PERI. In an embodiment, operating voltages of the circuit elements 320b providing the row decoder 494 may be different from the operating voltages of the circuit elements 320c providing the page buffer 493. For example, the operating voltages of the circuit elements 320c providing the page buffer 493 may be greater than the operating voltages of the circuit elements 320b providing the row decoder 494.

A common source line contact plug 480 may be disposed in the outer pad bonding area PA. The common source line contact plug 480 may include or may be formed of a conductive material such as a metal, a metal compound, and polysilicon doped with impurities, and may be electrically connected to the common source line 420. A first metal layer 450a and a second metal layer 460a may be sequentially stacked on the common source line contact plug 480. For example, an area where the common source line contact plug 480, the first metal layer 450a, and the second metal layer 460a are disposed may be defined as an outer pad bonding area PA.

Further, I/O pads 305 and 405 may be disposed in the outer pad bonding area PA. Referring to FIG. 24, a lower insulating layer 301 covering a lower surface of the first substrate 310 may be formed under the first substrate 310, and a first I/O pad 305 may be formed on the lower insulating layer 301. The first I/O pad 305 may be connected to at least one of the plurality of circuit elements 320a, 320b, and 320c disposed in the peripheral circuit area through the first I/O contact plug 303, and may be separated from the first substrate 310 by the lower insulating layer 301. In addition, a side insulating layer may be disposed between the first I/O contact plug 303 and the first substrate 310 to electrically separate the first I/O contact plug 303 from the first substrate 310.

Referring to FIG. 24, an upper insulating layer 401 covering an upper surface of the second substrate 410 may be formed on the second substrate 410, and a second I/O pad 405 may be disposed on the upper insulating layer 401. The second I/O pad 405 may be connected to at least one of the plurality of circuit elements 320a, 320b, and 320c disposed in the peripheral circuit area PERI through the second I/O contact plug 403.

According to embodiments, the second substrate 410 and the common source line 420 may not be disposed in an area where the second I/O contact plug 403 is disposed. Also, the second I/O pad 405 may not overlap with the word lines 430 in the vertical direction (e.g., the Z-axis direction). Referring to FIG. 24, the second I/O contact plug 403 may be separated from the second substrate 410 in a direction parallel to the upper surface of the second substrate 410, and may pass through the interlayer insulating layer 415 of the cell area to be connected to the second I/O pad 405.

In some embodiments, the first I/O pad 305 and the second I/O pad 405 may be selectively formed. For example, the memory device 400 may include only the first I/O pad 305 disposed on the first substrate 310, or may include only the second I/O pad 405 disposed on the second substrate 410. In an embodiment, the memory device 400 may include both the first I/O pad 305 and the second I/O pad 405.

In each of the outer pad bonding area PA and the bit line bonding area BLBA respectively included in the cell area and the peripheral circuit area, the metal pattern of the uppermost metal layer may exist as a dummy pattern, or the uppermost metal layer may be empty.

In relation to the memory device 400, a lower metal pattern 373a having the same shape as the upper metal pattern 472a of the cell area may be formed on the uppermost metal layer of the peripheral circuit area in correspondence to the upper metal pattern 472a formed on the uppermost metal layer of the cell area in the outer pad bonding area PA. The lower metal pattern 373a formed on the uppermost metal layer of the peripheral circuit area may not be connected to a separate contact in the peripheral circuit area. Similarly, in correspondence to the lower metal pattern formed on the uppermost metal layer of the peripheral circuit area in the outer pad bonding area PA, an upper metal pattern having the same shape as the lower metal pattern of the peripheral circuit area may be formed on the upper metal layer of the cell area.

Lower bonding metals 371b and 372b may be formed on the second metal layer 340b in the word line bonding area WLBA. In the word line bonding area WLBA, the lower bonding metals 371b and 372b of the peripheral circuit area may be electrically connected with each other through a bonding method with the upper bonding metals 471b and 472b of the cell area.

Also, in the bit line bonding area BLBA, in correspondence to the lower metal pattern 352 formed on the uppermost metal layer of the peripheral circuit area, an upper metal pattern 492 having the same shape as the lower metal pattern 352 of the peripheral circuit area may be formed on the uppermost metal layer of the cell area. A contact may not be formed on the upper metal pattern 492 formed on the uppermost metal layer of the cell area.

Figure 25:
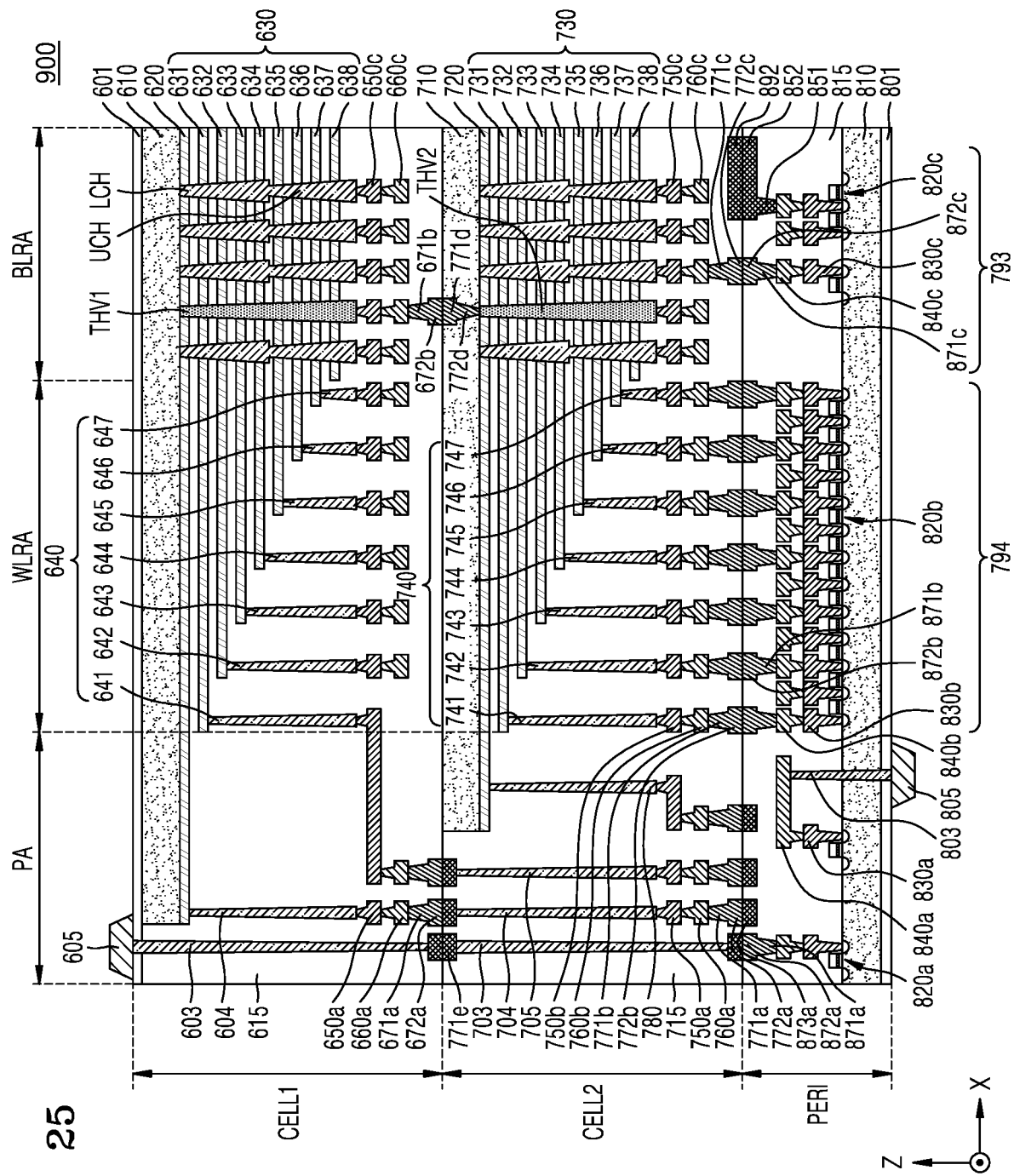
FIG. 25 is a cross-sectional view illustrating a memory device according to an embodiment of the inventive concept.

FIG. 25 is a cross-sectional view illustrating a memory device 900 according to embodiments of the inventive concept.

Referring to FIG. 25, in contrast to the memory device 500 of FIG. 24, the memory device 900 may include two or more upper chips om the cell area. That is, the memory device 900 may have a structure in which the first upper chip including the first cell area (CELL1), the second upper chip including the second cell area (CELL2), and the lower chip including the peripheral circuit area (PERI) are connected by a bonding method. However, the number of upper chips is not limited thereto. Among the descriptions of the first cell area, the second cell area, and the peripheral circuit area, portions previous provided in relation to FIG. 24 will be omitted. Hereinafter, the cell area may refer to at least one of the first cell area and/or the second cell area.

The cell area may include a lower channel LCH and an upper channel UCH connected with each other in the bit line bonding area BLBA. The lower channel LCH and the upper channel UCH may be connected with each other to form one channel structure CHS. That is, in contrast to the channel structure CHS of FIG. 24, the channel structure CHS of FIG. 25 may be formed through a process for the lower channel LCH and a process for the upper channel UCH. In the first cell area CELL, the lower channel LCH extends in a direction perpendicular to the upper surface of the third substrate 610 to pass through the common source line 620 and the lower word lines 631 to 634. The lower channel LCH may include a data storage layer, a channel layer, and a buried insulating layer, and may be connected to the upper channel UCH. The upper channel UCH may pass through the upper word lines 635 to 638. The upper channel UCH may include a data storage layer, a channel layer, and a buried insulating layer, and the channel layer of the upper channel UCH may be electrically connected to the first metal layer 650c and the second metal layer 660c. As the length of the channel increases, it may be difficult to form a channel having a constant width due to process reasons. The memory device 900 according to embodiments of the inventive concept may include a channel having improved width uniformity through the lower channel LCH and the upper channel UCH formed through a sequential process.

As described above, a string selection line and a ground selection line may be disposed above and below the word lines 630 and 730, respectively. In some embodiments, a word line adjacent to a string selection line or a word line adjacent to a ground selection line may be a dummy word line. Further, in the memory device 900 of FIG. 25, a word line positioned near a boundary between the lower channel LCH and the upper channel UCH may be a dummy word line. For example, the word line 634 and the word line 635 forming a boundary between the lower channel LCH and the upper channel UCH may be dummy word lines.

In the bit line bonding area BLBA, the first cell area may include a first through electrode THV1, and the second cell area may include a second through electrode THV2. The first through electrode THV1 may pass through the common source line 620 and the plurality of word lines 630. The first through electrode THV1 may further penetrate the third substrate 610. The first through electrode THV1 may include or may be formed of a conductive material. In an embodiment, the first through electrode THV1 may include or may be formed of a conductive material surrounded by an insulating material. The second through electrode THV2 may also be the same as the first through electrode THV1. The first through electrode THV1 and the second through electrode THV2 may be electrically connected through the first through upper metal pattern 672b and the second through lower metal pattern 771d. The first through upper metal pattern 672b may be formed at an upper end of the first upper chip including the first cell area, and the second through lower metal pattern 771d may be formed at a lower end of the second upper chip including the second cell area. The first through electrode THV1 may be electrically connected to the first metal layer 650c and the second metal layer 660c. A first through via 671b may be formed between the second metal layer 660c and the first through upper metal pattern 672b, and a second through via 772d may be formed between the second through electrode THV2 and the second through lower metal pattern 771d. The first through upper metal pattern 672b and the second through lower metal pattern 771d may be connected by a bonding method.

In some embodiments, a first upper metal pattern 672a may be formed on an upper end of the first cell area, and a first lower metal pattern 771e may be formed on a lower end of the second cell area. The first upper metal pattern 672a of the first cell area and the first lower metal pattern 771e of the second cell area may be connected in the outer pad bonding area PA by a bonding method. Further, a second upper metal pattern 772a may be formed at an upper end of the second cell area and a second lower metal pattern 873a may be formed at a lower end of the peripheral circuit area PERI. The second upper metal pattern 772a of the second cell area and the second lower metal pattern 873a of the peripheral circuit area may be connected in the outer pad bonding area PA by a bonding method.

Figure 26:
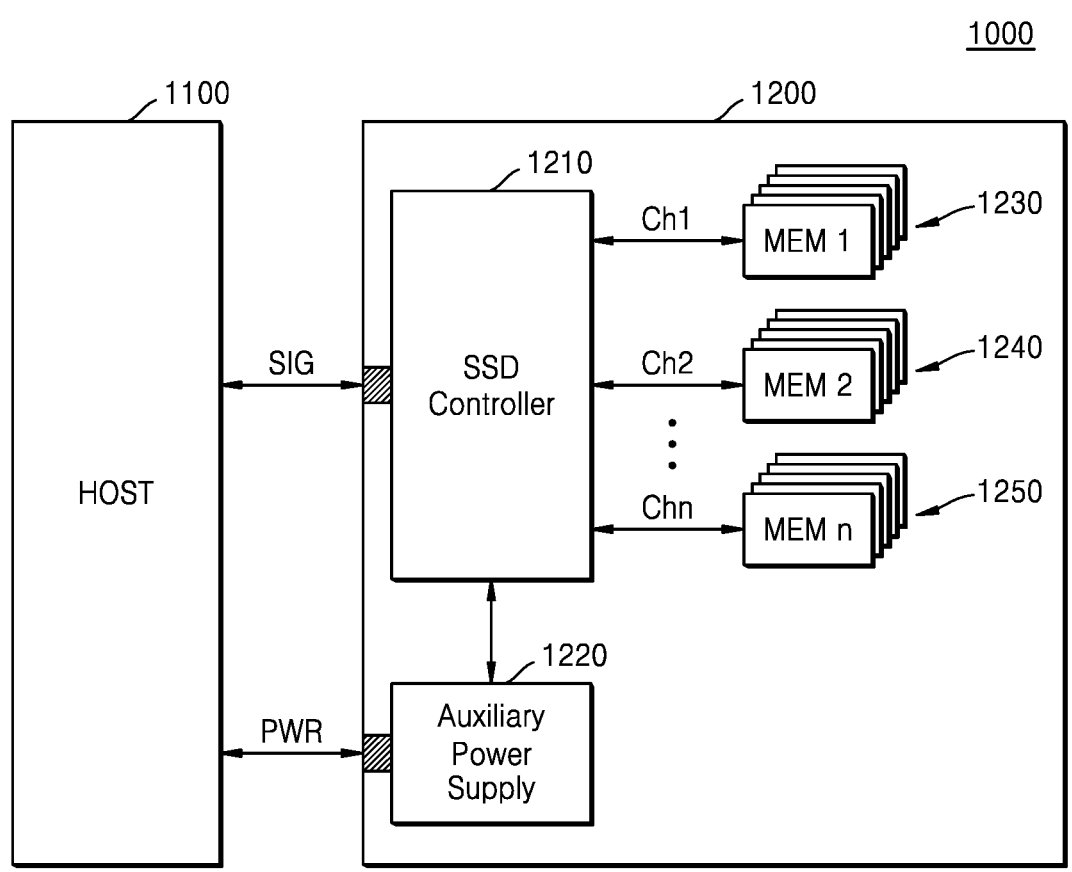
FIG. 26 is a block diagram illustrating an example in which a memory device according to some embodiments of the inventive concept is applied to a solid state drive (SSD) system.

FIG. 26 is a block diagram illustrating a memory device according to embodiments of the inventive concept, as applied to an SSD system 1000.

Referring to FIG. 26, the SSD system 1000 may include a host 1100 and an SSD 1200. The SSD 1200 exchanges signals with the host 1100 through a signal connector, and receives power through a power connector. The SSD 1200 may include an SSD controller 1210, an auxiliary power supply device 1220, and memory devices 1230, 1240, and 1250. The memory devices 1230, 1240, and 1250 may be vertically stacked NAND flash memory devices. In this case, the SSD 1200 may be implemented using the embodiments described above with reference to FIGS. 1 to 25.

While the inventive concept has been particularly shown and described with reference to embodiments thereof, it will be understood that various changes in form and details may be made therein without departing from the spirit and scope of the following claims.

What is claimed is:

1. A memory device comprising:
a peripheral circuit structure; and
a cell array structure vertically overlapping the peripheral circuit structure,
wherein the cell array structure includes:
a memory cell area including a plurality of word lines extending in a first horizontal direction; and
a plurality of bit lines extending in a second horizontal direction crossing the first horizontal direction,
wherein the memory cell area includes a plurality of memory blocks separated from each other by a plurality of word line cut areas extending long in the first horizontal direction,
wherein the memory cell area is divided into a normal cell area in which a plurality of normal memory blocks among the plurality of memory blocks are disposed, and a dummy cell area in which a plurality of dummy memory blocks among the plurality of memory blocks are disposed,
wherein the plurality of dummy memory blocks include a bit line through-electrode area including a plurality of through electrodes respectively connected to the plurality of bit lines,
wherein the plurality of through electrodes vertically extend into the peripheral circuit structure through the plurality of word lines,
wherein the peripheral circuit structure includes a row decoder area in which a row decoder circuit for controlling a plurality of word lines of each memory block of the plurality of memory blocks of the normal cell area is disposed,
wherein the row decoder area is adjacent to the plurality of memory blocks, and
wherein the row decoder circuit includes:
a first unit row decoder circuit being connected to n normal memory blocks among the plurality of normal memory blocks, n being a positive integer, and
a second unit row decoder circuit being connected to (n−1) normal memory blocks among the plurality of normal memory blocks.

2. The memory device of claim 1,
wherein each memory block of the plurality of memory blocks is disposed between two adjacent word line cut areas among the plurality of word line cut areas and has a block height corresponding to a distance, in the second horizontal direction, between the two adjacent word line cut areas.

3. The memory device of claim 2,
wherein the second unit row decoder circuit is adjacent to an area where the (n−1) normal memory blocks and the bit line through-electrode area are disposed, and
wherein a sum of block heights of the (n−1) normal memory blocks and a block height of the bit line through-electrode area corresponds to a height, in the second horizontal direction, of the second unit row decoder circuit.

4. The memory device of claim 2,
wherein the height, in the second horizontal direction, of the second unit row decoder circuit is k times a block height of each memory block of the plurality of memory blocks, k being a positive integer.

5. The memory device of claim 1,
wherein the memory cell area is divided into a plurality of tiles by a tile cut area extending in the first horizontal direction, each tile of the plurality of tiles including the memory cell area,
wherein the dummy cell area further includes a first memory block adjacent to the tile cut area among the plurality of memory blocks,
wherein the second unit row decoder circuit is adjacent to an area where the first memory block adjacent to the tile cut area and the (n−1) normal memory blocks are disposed, and
wherein a sum of block heights of the (n−1) normal memory blocks and a block height of the first memory block corresponds to a height, in the second horizontal direction, of the second unit row decoder circuit.

6. The memory device of claim 1,
wherein the dummy cell area further includes a pair of edge memory blocks on opposite sides of the memory cell area in the second horizontal direction among the plurality of memory blocks, respectively, and wherein the second unit row decoder circuit is adjacent to an area where the (n−1) normal memory blocks and a first edge memory block of the pair of edge memory blocks, and wherein a sum of block heights of the (n−1) normal memory blocks and a block height of the first edge memory block corresponds to a height, in the second horizontal direction, of the second unit row decoder circuit.

7. The memory device of claim 1,
wherein the n normal memory blocks sharing the first unit row decoder circuit are adjacent to each other in the second horizontal direction.

8. The memory device of claim 1,
wherein the n normal memory blocks sharing the first unit row decoder circuit are spaced apart from each other, and wherein one of the (n−1) normal memory blocks sharing the second unit row decoder circuit is disposed between two normal memory blocks among the n normal memory blocks.

\* \* \* \* \*